(12) United States Patent
Tanaka et al.

(10) Patent No.: US 6,713,787 B2
(45) Date of Patent: Mar. 30, 2004

(54) SURFACE LIGHT EMITTING DEVICES

(75) Inventors: Haruo Tanaka, Kyoto (JP); Hironobu Sai, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/175,172

(22) Filed: Jun. 18, 2002

(65) Prior Publication Data

US 2002/0158263 A1 Oct. 31, 2002

Related U.S. Application Data

(62) Division of application No. 09/421,022, filed on Oct. 19, 1999.

(30) Foreign Application Priority Data

| Oct. 19, 1998 | (JP) | ............................................. | 10-296659 |
| Oct. 19, 1998 | (JP) | ............................................. | 10-296663 |
| Nov. 4, 1998 | (JP) | ............................................. | 10-313221 |
| Nov. 4, 1998 | (JP) | ............................................. | 10-313226 |
| Nov. 4, 1998 | (JP) | ............................................. | 10-313228 |
| Nov. 13, 1998 | (JP) | ............................................. | 10-322981 |
| Dec. 7, 1998 | (JP) | ............................................. | 10-347281 |
| Dec. 7, 1998 | (JP) | ............................................. | 10-347387 |

(51) Int. Cl.[7] .............................................. H01L 33/00
(52) U.S. Cl. ............................. 257/91; 257/88; 257/89; 257/98; 257/99; 257/40; 257/773
(58) Field of Search ................................. 257/91, 88, 98, 257/99, 40, 773

(56) References Cited

U.S. PATENT DOCUMENTS

| 5,568,499 A | 10/1996 | Lear |
| 5,629,782 A | * 5/1997 | Ichimura et al. ................ 359/9 |
| 5,659,420 A | * 8/1997 | Wakai et al. ................ 359/368 |
| 5,663,944 A | 9/1997 | Mun |
| 5,679,964 A | 10/1997 | Kobayashi et al. |
| 5,745,265 A | 4/1998 | Hasegawa et al. |

FOREIGN PATENT DOCUMENTS

EP          733928 A2  *  9/1996

* cited by examiner

Primary Examiner—Nathan J. Flynn
Assistant Examiner—Remmon R. Fordé
(74) Attorney, Agent, or Firm—Merchant & Gould P.C.

(57) ABSTRACT

It is an object of the present invention to provide a surface light-emitting device that can realize a lightweight and compact-profile optical input/output device with reasonable price, especially the one that emits light. The beam generator 12 comprises a surface light-emitting device having a stacked-layer formed of a cathode 2, a luminescent layer 4 made of organic material(s) and an anode 6 in that order, the stacked-layer being located adjacent to a glass substrate 8. The anode 6 is a transparent electrode that is formed to correspond to a hologram pattern of a condensing lens. When a DC voltage is applied between the cathode 2 and the anode 6 with the DC power source, the luminescent layer 4 illuminate corresponding to the hologram pattern of the condensing lens, and the light will converge to a focal point of the condensing lens. Therefore, the surface light-emitting device can play the both roles of the light source and the condensing lens. Thus, the use of this surface light-emitting device permits realization of a lightweight and compact-profile beam generator with reasonable price.

6 Claims, 44 Drawing Sheets

LIGHT INTENSITY OF
EMITTED LIGHT

LIGHT INTENSITY OF
EMITTED LIGHT

<PRIOR ART>

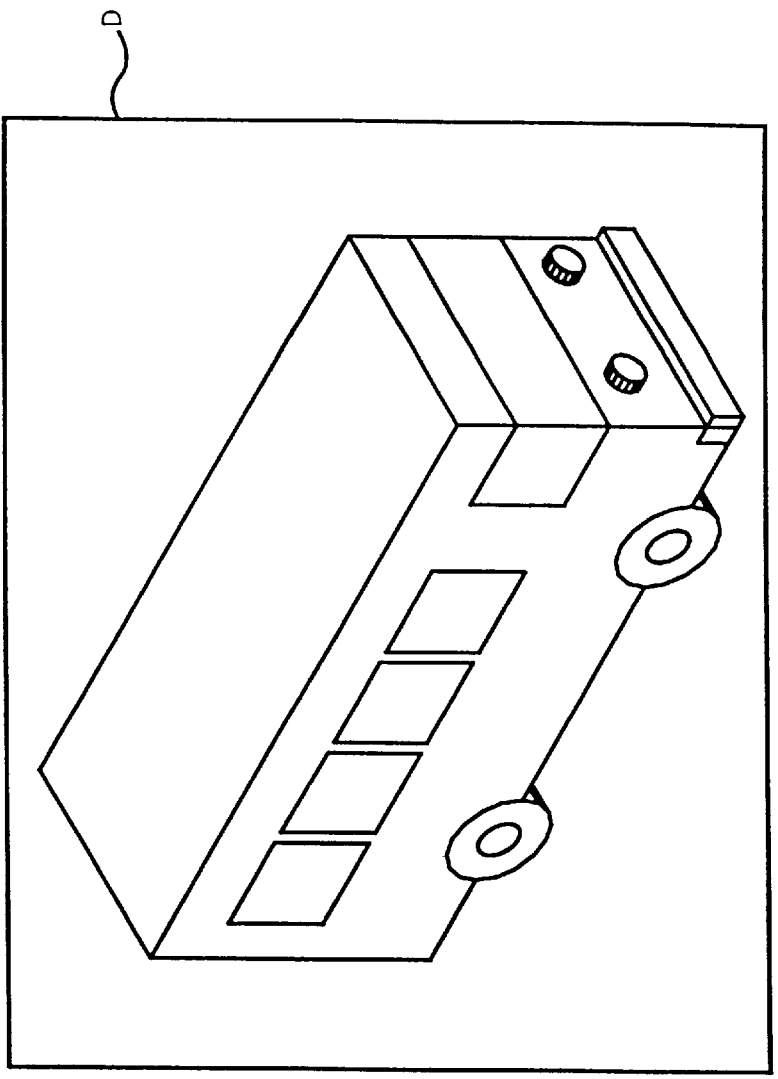
FIG.44 <PRIOR ART>

SURFACE LIGHT EMITTING DEVICES

This application is a divisional of application Ser. No. 09/421,022, filed Oct. 19, 1999, which application(s) are incorporated herein by reference.

CROSS REFERENCE TO RELATED APPLICATIONS

All the contents disclosed in Japanese Patent Application No. H10-296659 (filed on Oct. 19, 1998), No. H10-296663 (filed on Oct. 19, 1998), No. H10-313221 (filed on Nov. 4, 1998), No. H10-313226 (filed on Nov. 4, 1998), No. H10-313228 (filed on Nov. 4, 1998), No. H10-322981 (filed on Nov. 13, 1998), No. H10-347281 (filed on Dec. 7, 1998), and No. H10-347287 (filed on Dec. 7, 1998) including specification, claims, drawings and abstract and summary is incorporated herein by reference in its entirety.

BACKGROUND OF THE INVENTION

1. Field of the Invention

The present invention relates to surface light-emitting devices, more specifically to a surface light-emitting device capable of using for an optical-input/output device and an image display device including a surface light-emitting device.

2. Description of the Related Art

Various devices for inputting/outputting light are known as light-input/output devices. In the light-input/output devices, both of beam generators such as flashlights, turn-signals used for an vehicle, optical pointers using laser beams and beam output part and the like in a laser printer, and image display devices and so on displaying visual information including images and characters in fixed manner and/or in dynamic manner, are used as devices for outputting light.

On the contrary, both of an optical pickup device and a bar-code reader and so on are used as a device for outputting light therefrom and inputting reflected light therethrough among the light-input/output devices. The optical pickup device and the bar-code reader may also be used as the beam generator because these include a beam output part.

Details of such light-input/output devices will be described hereunder by using an optical pickup device as an example. The optical pickup device is a device for reading out information recorded on a compact disc (hereinafter referred to as CD) and the like.

FIG. 41 is a conceptual view for describing a prior art optical pickup device PU. The optical pickup device PU comprises a laser diode LD, a half-mirror HM, a lens L, coils FC for carrying out auto-focus, a photo-detector S, and a control circuit CT.

A laser beams emitted from the laser diode LD and pass through the half-mirror HM reaches to the recording layer (not shown) of the CD after focusing with the lens L. Both the laser diode LD and the lens L form the beam output part. The light reflected by the recording layer is focused again with the lens L, and a part of the light reaches to the photo-detector S as a result of reflecting with the half-mirror IM. The data recorded on the recording layer are read out with the photo-detector S by detecting the amount of light detected thereby. The focal point of the laser beam can automatically be located on the recording layer of the CD by moving the lens L in a direction of X shown in the drawing with the coils FC.

The control circuit CT controls operations of all the laser diode LD, the coils FC and the photo-detector S according to a command from the outside while outputting the data read out thereby.

The conventional optical pickup device, however, has the following problems to be solved. The beam output part in the optical pickup device PU requires the lens L for focusing the laser beams in addition to the laser diode LD acting as the light source in consideration of such part. In order to carry out a proper focusing, positioning between the laser diode LD and the lens L need to be performed. Accordingly, it is difficult to make the beam output part smaller in size, and the manufacturing cost thereof may also be increased rapidly in accordance with its size.

FIG. 42 is a conceptual view for describing another prior art optical pickup device PU. The pickup device PU depicted in FIG. 42 includes a laser diode LD, a half-mirror HM, a lens L, a photo-detector S, and a control circuit CT.

A laser beams emitted from the laser diode LD and pass through the half-mirror HM reaches on the recording layer (not shown) of the CD after focusing by the lens L. Both the laser diode LD and the lens L form the beam output part. Light reflected by the recording layer is focused again with the lens L, and a part of the light reaches to the photo-detector S as a result of reflecting with the half-mirror HM. The data recorded on the recording layer are read out with the photo-detector S by detecting the amount of light detected thereby.

The control circuit CT controls operations of all the laser diode LD, the coils FC and the photo-detector S according to a command from the outside while outputting the data read out thereby.

The conventional optical pickup device, however, also has the following problems to be solved. The optical pickup device PU requires the lens L for focusing the laser beams and the half-mirror acting as a beam-splitter in addition to the laser diode LD acting as the light source and the photo-detector S for detecting light because the pickup device PU outputs light to the outside thereof and receives reflected light thereby. In other words, the pickup device PU requires a lot of components. In order to carry out proper focusing, positioning among these components need to be performed. Accordingly, it is difficult to make the pickup device PU smaller in size, and the manufacturing cost thereof may also be increased rapidly in accordance with its size.

FIG. 43 is a conceptual view for describing a prior art laser printer LP. Laser printers are used for printing images and/or characters on a printing paper and the like.

The laser printer LP comprises a laser diode LD, a collimator lens CL, a polygon mirror (which has flat reflective surfaces around the perimeter) PM, a condensing lens L, and a photosensitive drum SD formed in a cylindrical shape. The surface of the drum SD is charged with electrostatic, and a part of the electrostatic on the drum is eliminated when light is directed on that part.

A laser beam emitted from the diode LD is collimated with the lens CL, and is reflected with the polygon mirror PM. Thereafter, the reflected beam reaches on the drum SD by focusing with the lens L. The diode LD, the lens CL, the mirror PM, and the lens L form the beam output part described earlier.

A laser beam is repeatedly scanned on the drum SD along with scanning lines SL in a direction such as top to bottom in the drawing because the polygon mirror PM is in rotation of a R2 direction. The drum SD, on the contrary, is rotated in a R3 direction synchronistical with the rotation of the polygon mirror PM as shown in the drawing. In this way, the laser beam is scanned all over the surface of the drum SD. As a result, the laser beam can be directed on predetermined areas of the drum SD by blinking the laser beam at a proper timing. In other words, electrostatic on the predetermined areas of the drum SD can be eliminated.

This allows printing of images and/or characters on a paper and the like by fixing images and/or characters after attracting toner on the area corresponding to existence of electrostatic on the surface of the drum SD.

The prior art laser printer, however, has the following drawbacks. Various optical components are needed such as the lens CL for collimating the beam, the polygon mirror PM for scanning the beam, and the lens L for focusing the beam, in addition to the diode LD acting as the light source in consideration of the beam output part in the printer LP. In order to carry out proper focusing, positioning among these components need to be conducted. Accordingly, it is hard to make the printer LP smaller in size, and the manufacturing cost thereof may also be increased rapidly in accordance with its size.

Mechanical rotation of the polygon mirror PM suppresses its rotation speed and decreases durability of the printer LP.

In addition to laser printers, image display devices for displaying visual information including images and characters in fixed manner and/or in dynamic manner such as light-emitting diode display (LED) devices, liquid crystal display (LCD) devices, plasma display devices, fluorescent display devices, are known. FIG. 44 is a view illustrating an image displayed on a screen D in one of such conventional display devices. The transfer of information and/or propagation thereof such as advertisement can be carried out through the screen D.

However, the prior art image display devices described above have the following disadvantages. In these display devices, images and/or characters are just displayed on the screen D itself. In other words, these visual informations can not be reproduced on the screen D in three-dimensional manner through the display devices. It is, therefore, cubic objects can not be displayed in three-dimensional manner, and images and/or characters can not be displayed in a manner such that these looks like coming up to the viewer. With the images and/or characters displayed on the screen under flat display manner, not much advertising impacts are expected.

On the other hand, a lightweight and compact-profiled image display device suitable for mobile and portable use of individual users with a reasonable price is expected.

SUMMARY OF THE INVENTION

It is an object of the present invention to overcome the above-mentioned problems and to provide a surface light-emitting device utilizing holograms which can realize a lightweight, compact-profile, and reasonable-price optical-input/output device capable of outputting light. It is another object of the present invention to provide a surface light-emitting device including a light source suitable for reproduction of holograms. It is another object of the present invention to provide a surface light-emitting device comprising a hologram layer suitable for reproduction of holograms. It is far another object of the present invention to provide a surface light-emitting device including a hologram layer capable of forming easily.

Further, it is still another object of the present invention to overcome the above mentioned problems and to provide a surface light-emitting device capable of realizing a lightweight, compact-profile, and reasonable price optical input/output device, especially, the device outputs light while using the reflected light as incident light.

Still further, it is yet another object of the present invention to overcome the above mentioned problems and to provide a surface light-emitting device capable of realizing a lightweight, compact-profile, and a reasonable price optical-input/output device which especially outputs light, as well as a surface light-emitting device carrying out reproduction of holograms with certainty.

It is another object of the present invention to overcome the above mentioned problems and to provide a surface light-emitting device capable of realizing a lightweight, compact-profiled, and reasonable priced optical-input/output device which especially outputs light, yet enables high-speed operation with high-durability.

Further, its is far another object of the present invention to overcome the above mentioned problems and to provide a lightweight, compact-profile, and reasonable price image display device capable of displaying visual information in three-dimensional manner.

In other words, it is the principal object of the present invention to provide a surface light-emitting device capable of realizing a lightweight, compact-profile, and reasonable-price optical-input/output device, and to provide an image display device including a lightweight, compact-profiled, and reasonable-priced surface light-emitting device.

In accordance with characteristics of the present invention, there is provided a surface light-emitting device including a luminescent layer and an electrode, the luminescent layer emitting light as a result of applying a voltage to the electrode, wherein the electrode is substantially formed in a shape corresponding to a pattern of interference fringes of a hologram.

Further, in accordance with characteristics of the present invention, there is provided a surface light-emitting device including a luminescent layer and an electrode, the luminescent layer emitting light as a result of applying a voltage to the electrode, wherein a shielding layer formed in a shape substantially corresponding to a pattern of interference fringes of a hologram is provided at a position outside of the luminescent layer, and wherein the light from the luminescent layer is emitted through the shielding layer.

Still further, in accordance with characteristics of the present invention, there is provided a surface light-emitting device including a luminescent layer and an electrode, the luminescent layer emitting light as a result of applying a voltage to the electrode, wherein an uneven transparent layer formed unevenly in thickness corresponding to a pattern of interference fringes, is disposed at a position outside of the luminescent layer, and wherein the light from the luminescent layer is emitted through the uneven transparent layer.

In accordance with characteristics of the present invention, there is provided a surface light-emitting device including a luminescent layer made of an organic material and an electrode, the luminescent layer emitting light as a result of applying a voltage to the electrode and the light being emitted in a direction substantially perpendicular to the luminescent layer through a predetermined optical path as a laser beam after carrying out resonation of the emitted light, wherein a hologram layer formed substantially corresponding to the patterns of interference fringes of a hologram is formed as a layer one of related to light emission and provided on the predetermined optical path.

Further, in accordance with characteristics of the present invention, there is provided a surface light-emitting device including a luminescent layer and an electrode, the luminescent layer emitting light as a result of applying a voltage to the electrode and the light being emitted through a predetermined optical path, wherein a hologram layer formed substantially corresponding to the patterns of interference fringes of a hologram is formed as a layer one of related to light emission and provided on the predetermined optical path, and wherein the light from the luminescent layer directed to other than the predetermined optical path is emitted to a direction other than the predetermined optical path.

In accordance with characteristics of the present invention, there is provided a surface light-emitting device including a luminescent layer and an electrode, the luminescent layer emitting light as a result of applying a voltage to the electrode and the light being emitted through a predetermined optical path, wherein a hologram layer formed substantially corresponding to a pattern of interference fringes of a hologram is formed as a layer one of related to light emission and provided on the predetermined optical path, and wherein the light from the luminescent layer directed to other than the predetermined optical path is reflected and incorporated with another light from the luminescent layer directed to the predetermined optical path so as to intensify a resulting light.

Further, in accordance with characteristics of the present invention, there is provided a surface light-emitting device including a luminescent layer and an electrode, the luminescent layer emitting light as a result of applying a voltage to the electrode and the light being emitted through a predetermined optical path, wherein a hologram layer formed substantially corresponding to a pattern of interference fringes of a hologram is formed as a layer one of related to light emission and provided on the predetermined optical path, and wherein the light from the luminescent layer is resonated and emitted.

Still further, in accordance with characteristics of the present invention, there is provided a surface light-emitting device including a luminescent layer and an electrode, the luminescent layer emitting light as a result of applying a voltage to the electrode and the light being emitted through a predetermined optical path, wherein a hologram layer formed substantially corresponding to the patterns of interference fringes of a hologram is formed as a layer one of related to light emission and provided on the predetermined optical path, and wherein the hologram layer is formed alone with a part located periphery of interference fringes of the hologram.

In accordance with characteristics of the present invention, there is provided a surface light-emitting device including a luminescent layer and an electrode, the luminescent layer emitting light as a result of applying a voltage to the electrode and the light being emitted through a predetermined optical path, wherein a hologram layer formed substantially corresponding to a pattern of interference fringes of a hologram is formed as a layer one of related to light emission and provided on the predetermined optical path, and wherein the hologram layer includes a light-pattern and a dark-pattern, and wherein a width of the light-pattern is substantially formed in a range of a wavelength of the light or less than said range.

Further, in accordance with characteristics of the present invention, there is provided a surface light-emitting device including a luminescent layer and an electrode, the luminescent layer emitting light as a result of applying a voltage to the electrode and the light being emitted through a predetermined optical path, wherein a hologram layer formed substantially corresponding to the pattern of the interference is formed as a layer one of related to light emission and provided on the predetermined optical path, and wherein the hologram layer includes a light-pattern and a dark-pattern, and wherein the light-pattern is formed in a fixed width, and wherein information containing light intensity of the holograms is reproduced in accordance with brightness of a portion generating light where corresponding to the light-pattern.

Still further, in accordance with characteristics of the present invention, there is provided a surface light-emitting device including a luminescent layer and an electrode, the luminescent layer emitting light as a result of applying a voltage to the electrode and the light being emitted through a predetermined optical path, wherein a hologram layer formed substantially corresponding to a pattern of interference fringes of a hologram is formed as a layer one of related to light emission and provided on the predetermined optical path, and wherein the device is fabricated so that the light once emitted through the optical path returns through the hologram layer as a reflected light.

In accordance with characteristics of the present invention, there is provided a surface light-emitting device including a luminescent layer and an electrode, the luminescent layer emitting light as a result of applying a voltage to the electrode and the light being emitted through a predetermined optical path, wherein a hologram layer formed substantially corresponding to a patterns of interference fringes of a hologram is formed as a layer one of related to light emission and provided on the predetermined optical path, and wherein a plurality of element regions is included in the hologram layer, and wherein brightness of portions corresponding to the element regions is determined in accordance with the patterns of the interference fringes, and wherein the corresponding portions are controlled so as to turn into an illumination-state corresponding to the determined brightness substantially at the same time.

Further, in accordance with characteristics of the present invention, there is provided a surface light-emitting device including a luminescent layer and an electrode, the luminescent layer emitting light as a result of applying a voltage to the electrode and the light being emitted through a predetermined optical path, wherein a hologram layer formed substantially corresponding to a pattern of interference fringes of a hologram is formed as a layer one of related to light emission and provided on the predetermined optical path, and wherein more than one pattern of interference fringes is prepared and light corresponding to one of patterns selected is emitted through the predetermined optical path.

Still further, in accordance with characteristics of the present invention, there is provided an image display device having a surface light-emitting device including a luminescent layer and an electrode, the luminescent layer emitting light as a result of applying a voltage to the electrode and the light being emitted through a predetermined optical path, wherein a hologram layer formed substantially corresponding to a pattern of interference fringes of a hologram is formed as a layer one of related to light emission and provided on the predetermined optical path, and wherein a predetermined holographic image is displayed with the light from the luminescent layer.

Other objects and features of the present invention will be more apparent to those skilled in the art on consideration of the accompanying drawings and following specification wherein are disclosed several exemplary embodiments of the invention with the understanding that such variations, modifications and elimination of parts may be made therein as fall within the scope of the appended claims without departing from the spirit of the invention.

BRIEF DESCRIPTION OF THE DRAWINGS

FIG. 44 is a view illustrating an image displayed on a screen D in one of such prior art image display devices.

DETAILED DESCRIPTION OF THE PREFERRED EMBODIMENTS

Chapter 1

Figure 1:
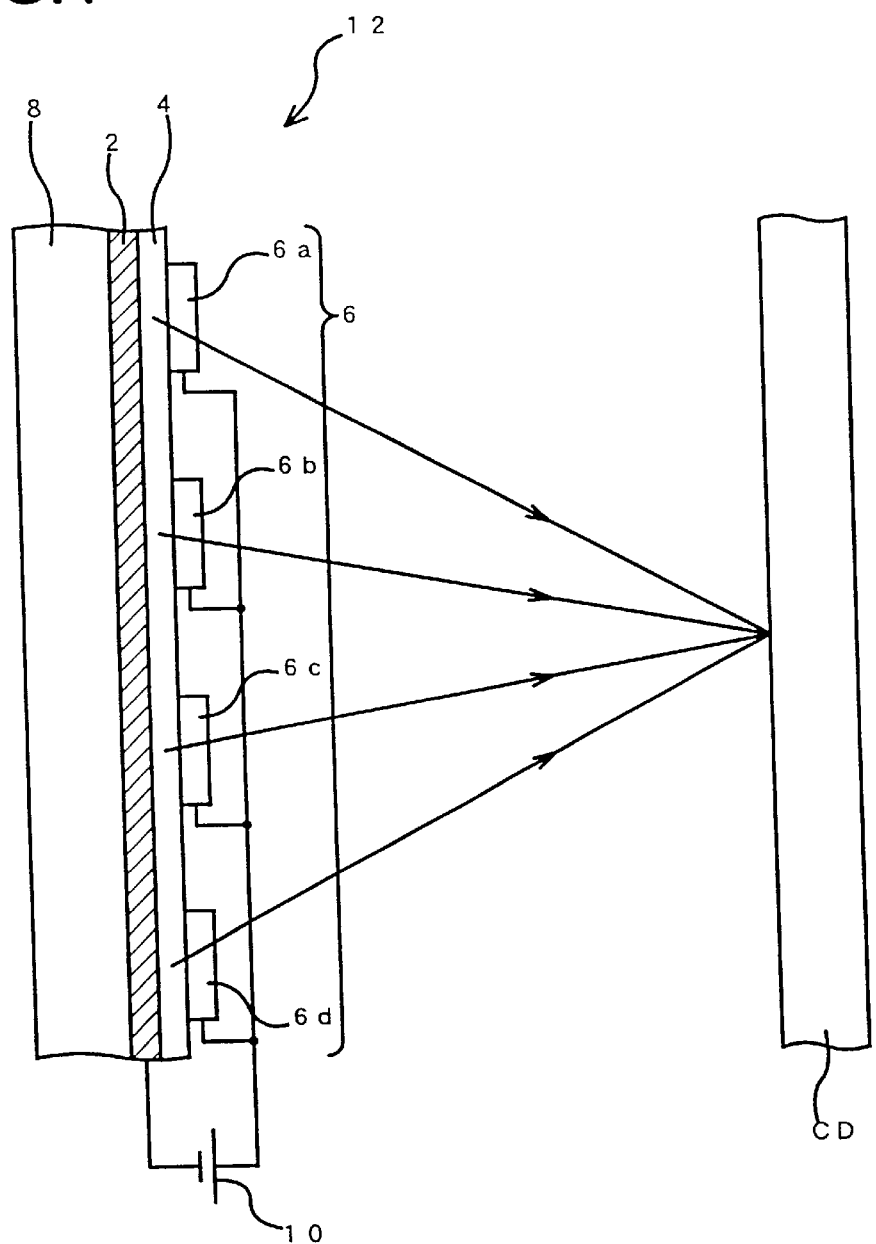
FIG. 1 is a sectional view for describing the structure of a beam generator 12 according to an embodiment of the present invention.

FIG. 1 is a sectional view for describing the structure of a beam generator 12 according to an embodiment of the present invention. The beam generator 12 comprises stacked-layers formed of a cathode 2 acting as an electrode layer, a luminescent layer 4 and an anode 6 forming another electrode layer in that order, the stacked-layers being located adjacent to a glass substrate 8 forming a supporting body. A DC power source 10 is connected between the cathode 2 and the anode 6. All the components of the beam generator 12 except for the DC power source 10 form a surface light-emitting device.

The anode 6 is a transparent electrode formed in a shape so as to substantially correspond to patterns of interference fringes of holograms. In this embodiment, description of the present invention will be made under an assumption in which the beam generator 12 is applied to an optical pickup device. It is also assumed that patterns of holograms of a condensing lens forming an optical element are used as the patterns of interference fringes of holograms. In other words, arrangement of portions 6a, 6b, 6, 6d, and so on composing the anode 6 respectively correspond to the patterns of interference fringes of holograms.

In order to fabricate a surface light-emitting device composing the beam generator 12, the following steps need to be carried out. A layer made of metal and the like (its details will be described later) which is used for forming the cathode 2 is formed on the surface of the glass substrate 8 by carrying out evaporation method or the like. On the metal layer thus formed, another layer made of organic materials (its details will be described later) composing the luminescent layer 4 is formed with vacuum evaporation method and the similar method. Far another layer made of transparent metal oxide electrode which is used for forming the anode 6 is formed on the organic layer by using a shadow mask under evaporation method and the like. Subsequently, the operation of the beam generator 12 will be described hereunder. The portions in the luminescent layer 4, interposed between the cathode 2 and the portions 6a, 6b, 6c, 6d and so on composing the anode 6, emit light when a DC voltage is applied between the cathode 2 and the anode 6. As described earlier, the portions 6a, 6b, 6c, 6d and so on composing the anode 6, are located at positions correspondent to the patterns of holograms of the condensing lens. In this way, the light emitted from the luminescent layer 4 is focused on a focal point of the condensing lens by traveling in a forward-direction (a direction in which a compact disc CD and the like is allocated) and pass through these portions 6a, 6b, 6c, 6d, and so on.

The compact disc CD is allocated at a position so that the focal point of the condensing lens is on the recording layer (not shown) thereof The data recorded on the recording layer are read out by detecting the amount of light reflected thereby.

As described above, the anode 6 is formed in a shape so as to correspond substantially to the patterns of holograms of the condensing lens in this embodiment. In this way, a part of the luminescent layer 4 emits light corresponding to the patterns of holograms of the condensing lens as a result of applying a voltage between the cathode 2 and the anode 6.

Consequently, this surface light-emitting device alone can play both roles as the light source and the condensing lens. In other words, the beam generator 12 can be made as a lightweight, compact-profiled, yet reasonable priced device by using the surface light-emitting device.

As described earlier, the luminescent layer 4 composing a part of the surface light-emitting device is made of organic materials. Although, no specific limitation on the materials of the organic materials, for example electro-luminescent materials having a small molecule such as materials Et-DSB, BczVBi, DPVBi and so on of distyrylarylene, oxadiazole, pyrazoloquinolin, Zn (BOX) 2 of benzoxazole, BA lq 1 of aluminum chelate may be used. In addition, electro-luminescent materials having high molecular may also be used for the luminescent layer 4.

The use of organic materials to the luminescent layer 4 permits the formation thereof with a very thin in thickness (in a range of 10 nano-meters through 100 nano-meters) in comparison with wavelength of the emitted light therefrom. In this way, the active thickness of the portions emitting light in the luminescent layer 4 can be formed in a thickness, which is negligible (about 5 nano-meters) in comparison with the wavelength of the emitted light (a range of 400 nano-meters through 700 nano-meters in visible light). In addition, the minimum planar dimension of the luminescent layer 4 can dramatically be smaller (in a range of 10 nano-meters through 100 nano-meters) in comparison with the wavelength of the emitted light. It is, therefor, possible to provide a luminescent layer 4 suitable for reproduction of holograms by using organic materials therefor.

The use of organic materials further permits the luminescent layer 4 to emit light at a low DC voltage.

Although, no specific limitation on the material of the anode 6, for example, transparent metal electrode such as indium tin oxide (ITO), indium oxide, zinc oxide and the like may be used for the anode 6. Other metals having a large work function such as Au can also be used in view of improving the efficiency of injection of positive holes.

Although, no specific limitation on the material of the cathode 2, for example metals having a small work function such there is as groups of Mg, Li, Ca can also be used in view of improving the efficiency of injection of electrons. It is further preferred to make alloys of different metals such as Mg:Ag, Mg:Al, Al:Li, to increase its stabilization. Because such alloys become hard to be oxidized even when each of the metals has a small work function.

Figure 2:
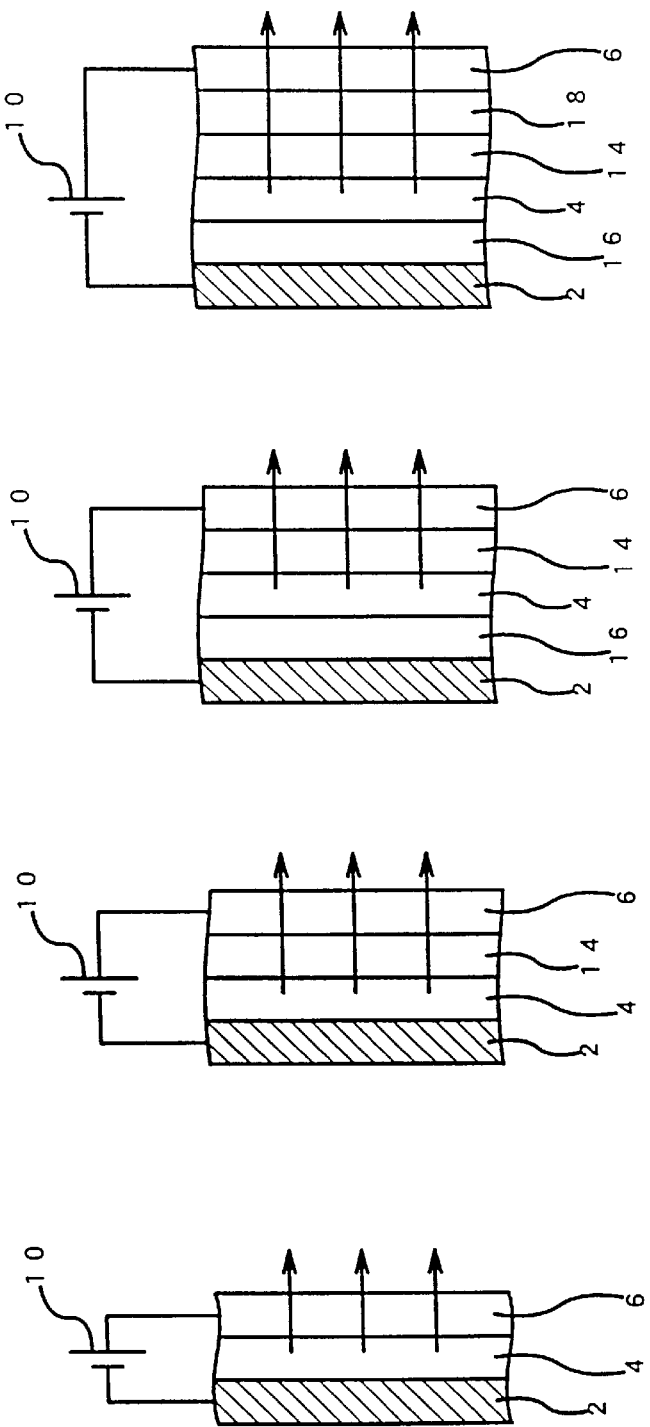
FIGS. 2A through 2D are sectional views showing layer structures of the surface light-emitting devices.

Although, the surface light-emitting device having a structural feature of in which the luminescent layer 4 is interposed between the cathode 2 and the anode 6, is described in the above, the structural feature thereof is not limited to that. Surface light-emitting devices having structural features according to the present invention are exampled in FIGS. 2A through 2D. The structural feature described in the above is shown in FIG. 2A.

FIG. 2B shows a structure in which a hole transport layer (HTL) 14 is further interposed between the luminescent layer 4 and the anode 6 shown in FIG. 2A.

Although, there is no specific limitation on the materials of the hole transport layer 14, materials having a high capability of hole injection into the luminescent layer 4 while no injection of electrons thereto from the luminescent layer 4, is preferred therefor. A materials made of amin may be used therefor.

FIG. 2C shows a structure in which an electron transport layer (ETL) 16 is interposed between the cathode 2 and the luminescent layer 4 shown in FIG. 2B.

Although, there is no specific limitation on the materials of the electron transport layer 16, for example an aluminum chelate material such as A lq and the like, or oxadiazole derivatives and the like may also be used therefor.

FIG. 2D shows a structure in which a hole injection layer 18 is interposed between the hole transportation layer 14 and the anode 6 shown in FIG. 2C.

Although, there is no specific limitation on the materials of the hole injection layer 18, materials having a low hole injection barrier against the anode 6 is preferred therefor. For instance, materials made of amin or that of phthalocyanine may be used therefor.

Figure 3:
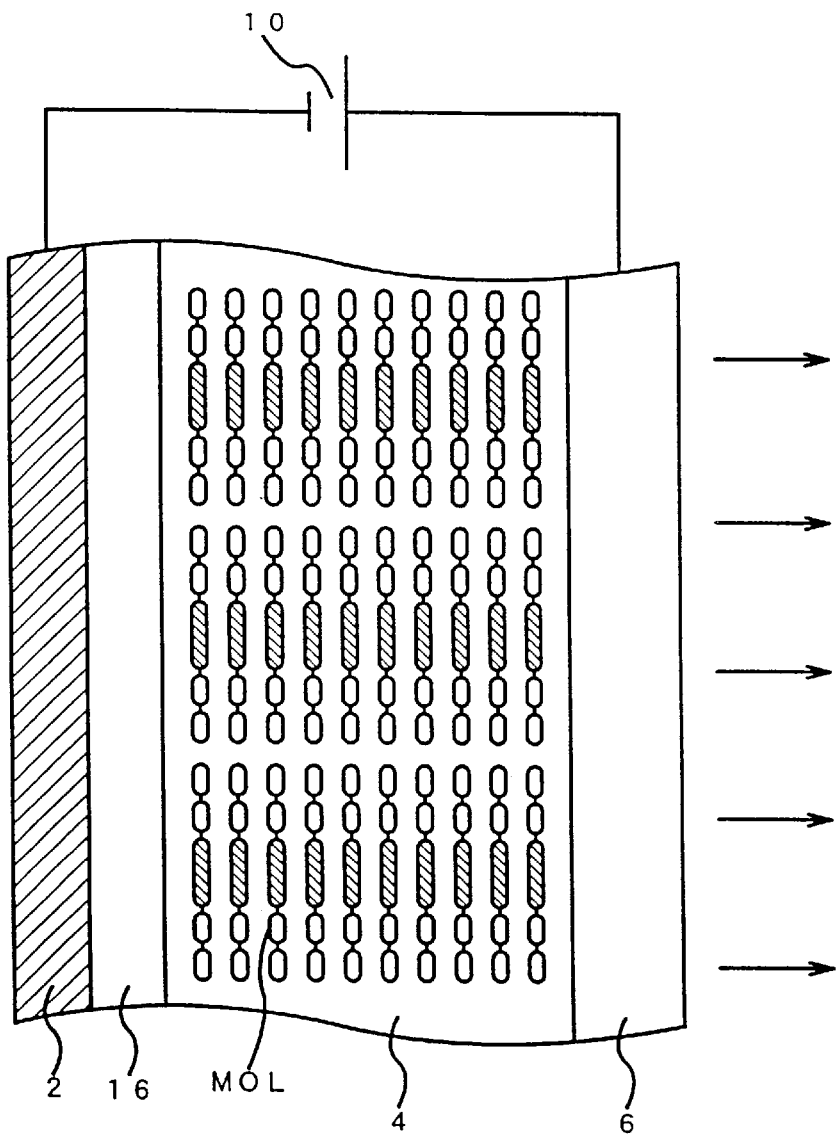
FIG. 3 is a sectional view showing a molecular alignment of organic materials in a luminescent layer 4.

FIG. 3 is a sectional view showing a molecular alignment of an organic material in the luminescent layer 4. Although, no specific limitation in the direction of molecular alignment of the organic material in the light-emitting material 4, the molecular alignment in a direction substantially parallel to both the cathode 2 and the anode 6 permits stronger light-emitting intensity even when a low voltage is applied.

Figure 4A:
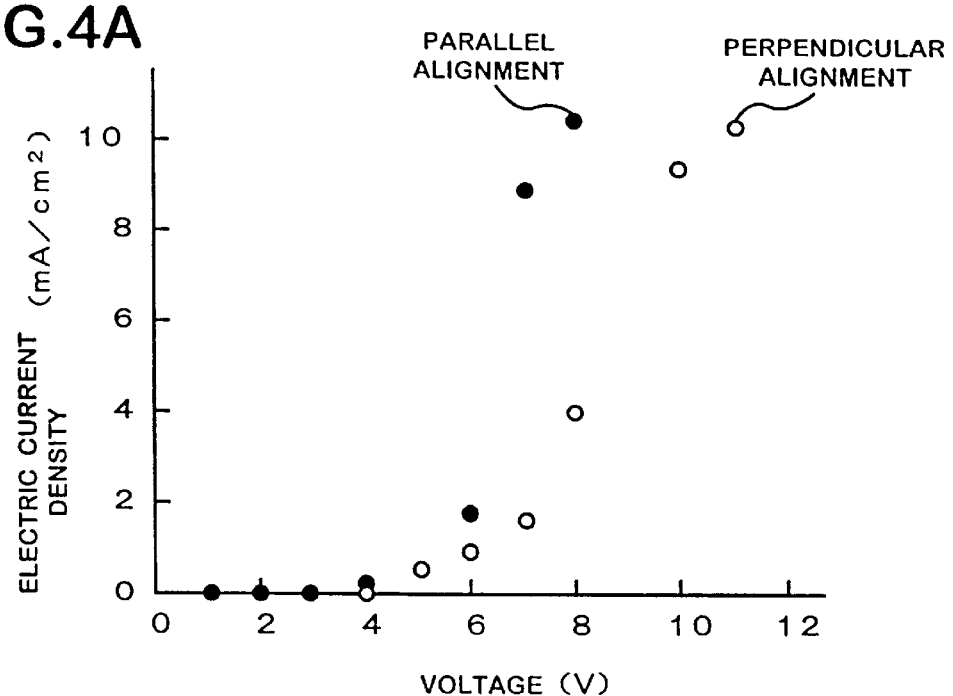
FIG. 4A is a graph illustrating a relationship between both voltages applied between a cathode 2 and an anode 6, and electric current density flowing through the luminescent layer 4.

FIG. 4A is a graph illustrating a relationship between both voltages applied between the cathode 2 and the anode 6, and electric current density flowing through the luminescent layer 4. In the graph, black dots indicate the relationship therebetween when the molecular alignment is in a direction substantially parallel to both the cathode 2 and the anode 6, and white dots indicate the relationship therebetween when the molecular alignment is in a direction substantially perpendicular to both the cathode 2 and the anode 6. It is clearly understood that the electric current density shows a sharp increase at low voltages when molecular alignment is in the parallel direction.

Figure 4B:
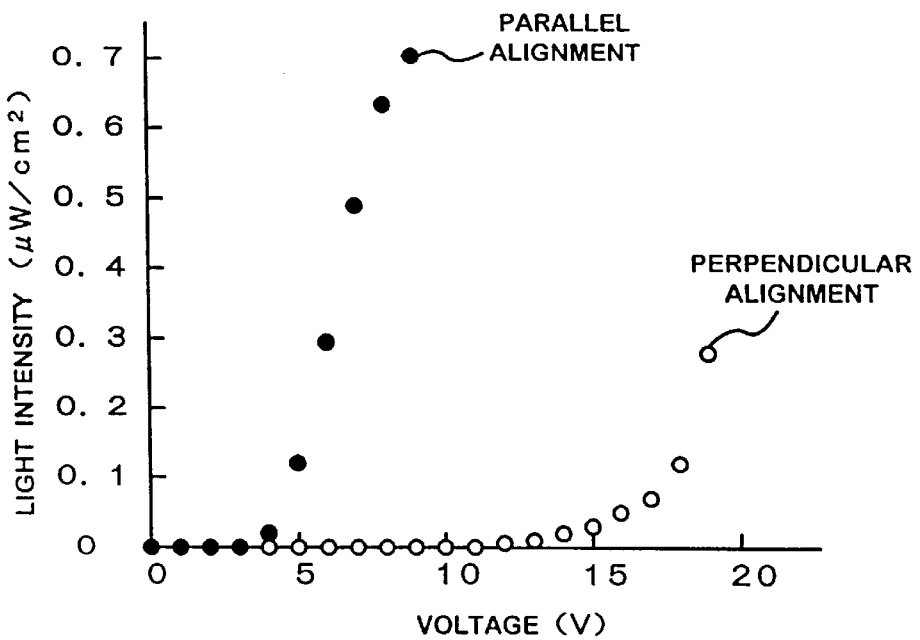
FIG. 4B is a graph illustrating a relationship between both voltages applied between the cathode 2 and the anode 6, and light intensity of the luminescent layer 4.

FIG. 4B is a graph illustrating a relationship between both voltages applied between the cathode 2 and the anode 6, and light intensity of the luminescent layer 4. In the graph, black dots indicate the relationship therebetween when the molecular alignment is in a direction substantially parallel to both the cathode 2 and the anode 6, and white dots indicate the relationship therebetween when the molecular alignment is in a direction substantially perpendicular to both the cathode 2 and the anode 6. It is, also, clearly understood that light intensity of the luminescent layer 4 shows a sharp increase at low voltages when molecular alignment is in the parallel direction.

Figure 5A:
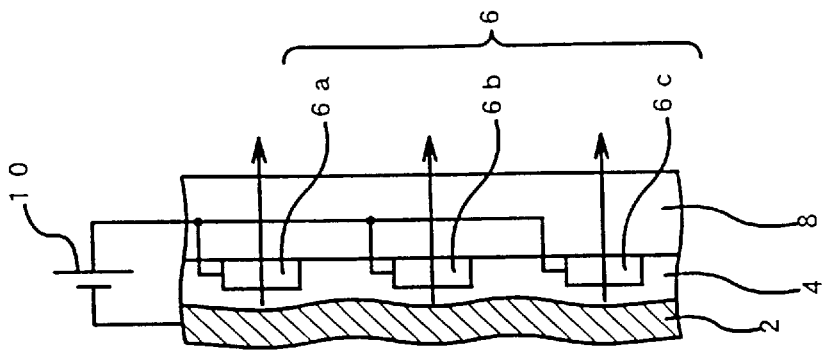
FIGS. 5A through 5C are sectional views showing examples of the structures of surface light-emitting devices applicable to the present invention.

The structure of the surface light-emitting device applicable to the present invention is not limited to that depicted in FIG. 1. FIGS. 5A through 8C are sectional views showing examples of the structures of surface light-emitting devices applicable to the present invention. FIG. 5A shows the structure of the surface light-emitting device shown in FIG. 1.

In all the surface light-emitting devices shown in FIGS. 5A through 6B, either one of the anode 6 or the cathode 2 thereof is formed in a shape substantially corresponding to the patterns of interference fringes of holograms.

In this way, the shape corresponding to the patterns of interference fringes of holograms can be formed easily and accurately because both the anode 6 and the cathode 2 are easy-to-form electrodes.

Figure 5B:
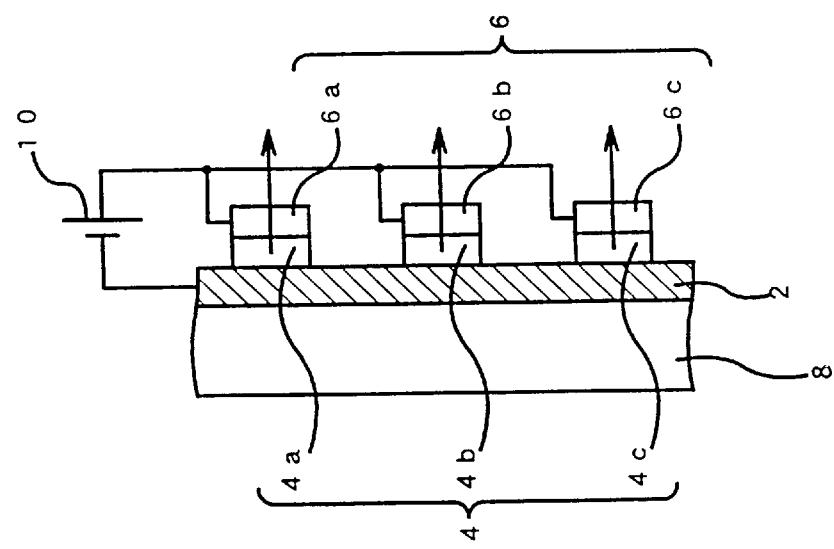
Figure 5C:
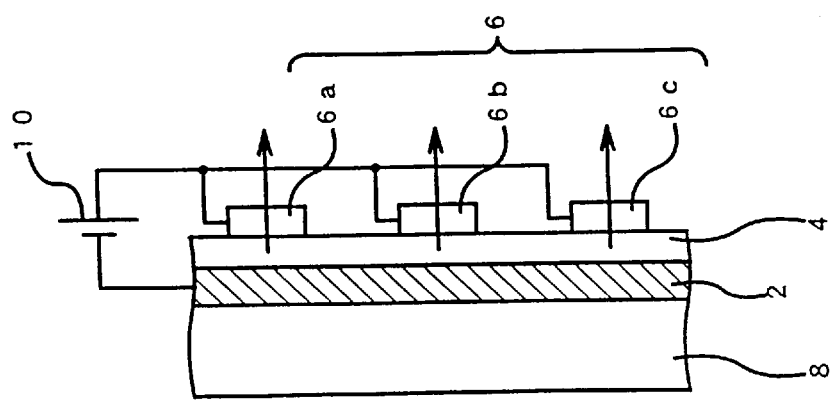

In the structure of the surface light-emitting devices shown in FIGS. 5A through 5C out of the drawings mentioned above, all the anodes 6 are formed as transparent electrodes in a shape substantially corresponding to the patterns of interference fringes of holograms and the light from the luminescent layer 4 is emitted through the anode 6.

In this way, the light emitted correspondingly to the patterns of interference fringes from the luminescent layer 4 comes out externally through the anode 6 formed in a shape substantially corresponding to the patterns of interference fringes as a result of applying a voltage between the anode 6 and the cathode 2. Consequently, light reproduced with high fidelity to the patterns of interference fringes may be obtained.

In the surface light-emitting devices shown in FIGS. 5A and 5B out of the drawings mentioned above, all of these devices dispose the glass substrates 8 at a position outside of the cathodes 2 while emitting the light from the luminescent layer 4 through the anodes 6.

In this way, the light from the luminescent layer 4 can be emitted externally without passing through the glass substrate 8. As a consequence, the light comes out without much degradation of the light amount.

In the surface light-emitting device depicted in FIG. 5A out of the drawings, the anode 6 alone is formed in a shape substantially corresponding to the patterns of interference fringes.

In this manner, the anode 6 can be formed in a shape substantially corresponding to the patterns of interference fringes easily and more precisely because no patterning of the remaining layers is required.

Both the anode 6 and the luminescent layer 4 are formed in the patterns of interference fringes in the surface light-emitting device depicted in FIG. 5B.

In the surface light-emitting devices shown in FIG. 5C, the glass substrate 8 having transparency is disposed at a position outside of the anode 6, and the light from the luminescent layer 4 is emitted through the anode 6 and the glass substrate 8.

Consequently, the anode 6 formed in the patterns of interference fringes can be provided on the glass substrate 8 after disposing the substrate 8 prior to providing the anode 6 thereon. As a result, the anode 6 can be formed easily and more precisely to the patterns of the interference fringes.

Figure 6A:
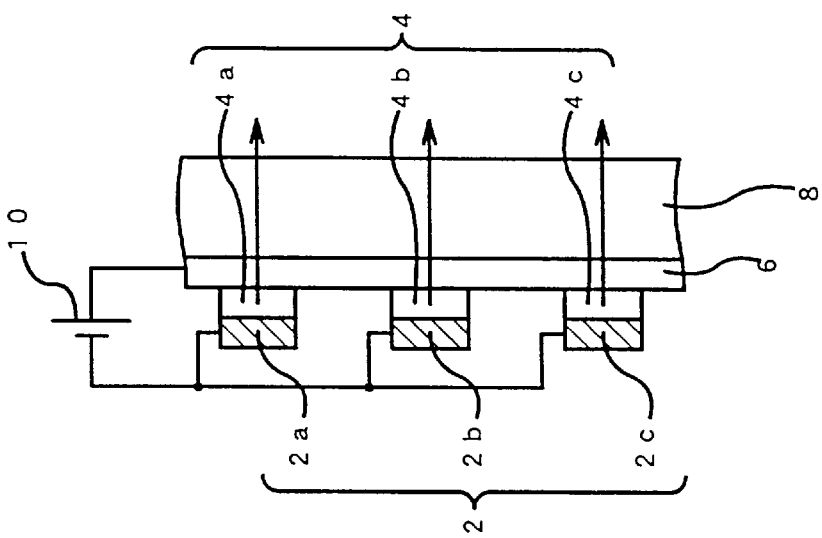
FIGS. 6A and 6B are sectional views showing another examples of the structures of surface light-emitting devices applicable to the present invention.
Figure 6B:
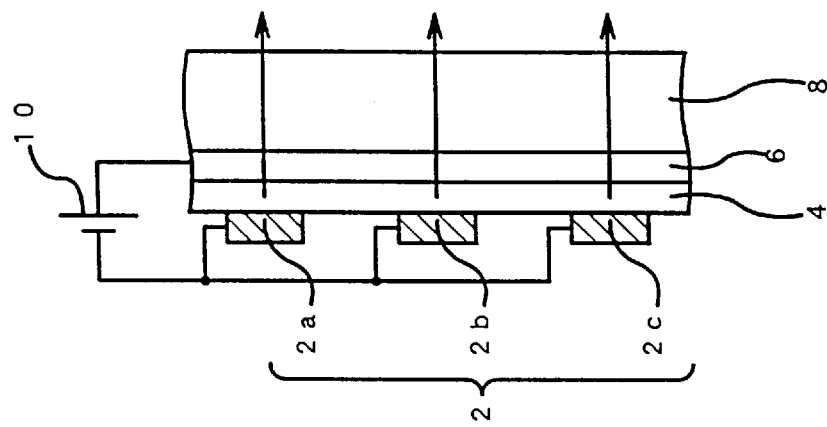

In both the surface light-emitting devices shown in FIGS. 6A and 6B, the cathodes 2 are formed substantially in the patterns of interference fringes and the anodes 6 are formed as transparent electrodes while emitting the light from the luminescent layers 4 through the anodes 6.

Under the structure described above, the cathode 2 formed in a shape corresponding to the patterns of interference fringes not to be transparent electrodes. In this way, the cathode 2 can be formed with an easy-to-form material. Consequently, the cathode 2 can easily and accurately be formed in the patterns of interference fringes.

In both the surface light-emitting devices shown in FIGS. 6A and 6B, the glass substrate 8 having transparency is disposed at a position outside of the anode 6 and the light from the luminescent layer 4 is emitted through the anode 6 and the glass substrate 8.

Consequently, these surface light-emitting devices can easily be fabricated by using an element including transparent electrodes formed on the glass substrate 8 readily available.

In the surface light-emitting device shown in FIG. 6A out of the drawings mentioned above, just the cathode 2 alone is formed in a shape substantially corresponding to the patterns of interference fringes of holograms.

Consequently, the cathode 2 can further be formed in the patterns of interference fringes easily and accurately because the layers other than the cathode 2 are not necessary to be patterned.

In the surface light-emitting device shown in FIG. 6B, both the cathode 2 and the luminescent layer 4 are formed in a shape substantially corresponding to the patterns of interference fringes.

Figure 7:
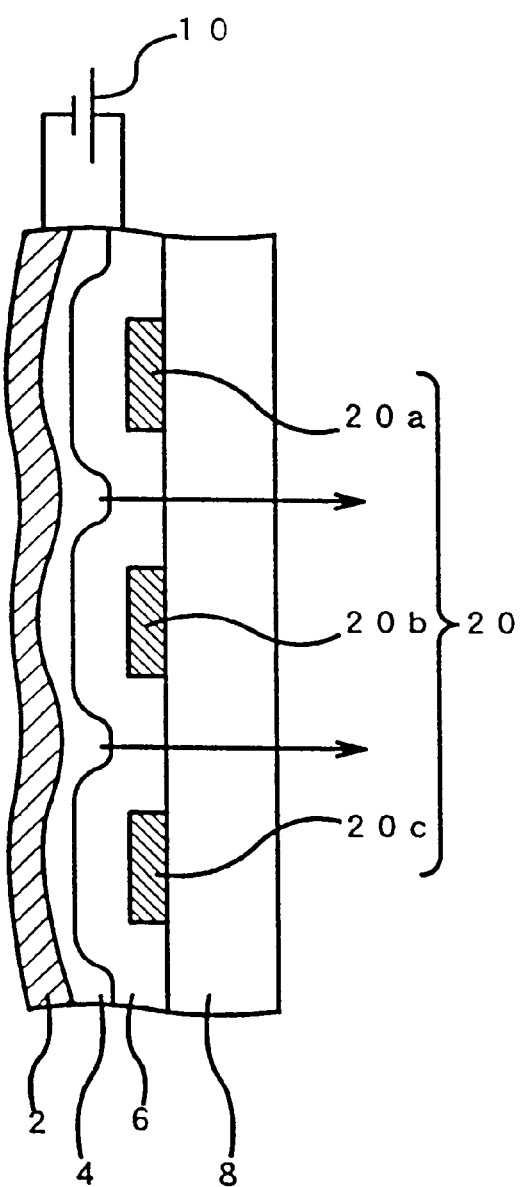
FIG. 7 is a sectional view showing far another examples of the structure of surface light-emitting device applicable to the present invention.

Further, in a surface light-emitting device shown in FIG. 7, a shielding layer 20 formed in a shape substantially corresponding to the patterns of interference fringes of holograms, is disposed at a position outside of the luminescent layer 4 and the light from the luminescent layer 4 is emitted through the shielding layer 20.

In this way, light corresponding to the patterns of interference fringes can easily be emitted by using the shielding layer 20 as a mask for the light emitted from the luminescent layer 4.

As a consequence, the shielding layer 20 may be formed with an easy-to-form material because not many restrictions exist on the material for the shielding layer 20. Consequently, the shielding layer 20 can easily and accurately be formed in the patterns of interference fringes. Although, there is no specific limitation on the materials of the shielding layer 20, for example, Au and the like may be used for the layer 20.

Further, the anode 6 is formed as a transparent electrode while disposing the shielding layer 20 at a position outside of the anode 6 in the surface light-emitting device shown in FIG. 7. In this manner, the entire portion of the luminescent layer 4 illuminates by applying a voltage between the anode 6 and the cathode 2, so that a part of the resulting light can be emitted through the shielding layer 20 formed corresponding to the patterns of interference fringes as a mask. Consequently, light reproduced with high fidelity to the patterns of interference fringes may be obtained.

Still further, the glass substrate 8 having transparency is disposed at a position outside of the shielding layer 20 and the light from the luminescent layer 4 is emitted through the anode 6, the shielding layer 20, and the glass substrate 8 in the surface light-emitting device depicted in FIG. 7.

In this manner, the shielding layer 8 formed in a shape corresponding to the patterns of interference fringes can be formed on the glass substrate 8 prepared before forming the shielding layer. Consequently, a shape corresponding to the patterns of interference fringes can easily and accurately be obtained.

Figure 8A:
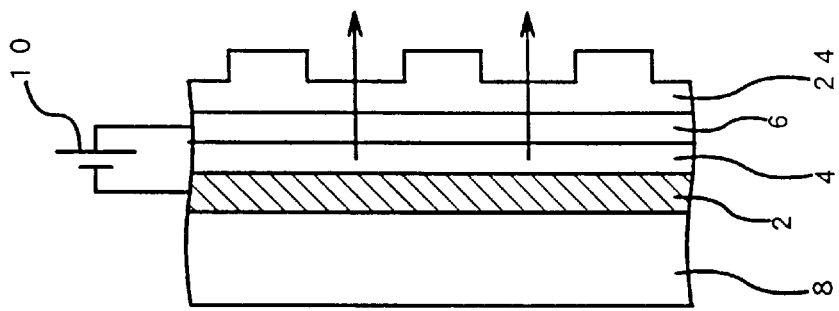
FIGS. 8A and 8B are sectional views showing still another examples of the structures of surface light-emitting devices applicable to the present invention.
Figure 8B:
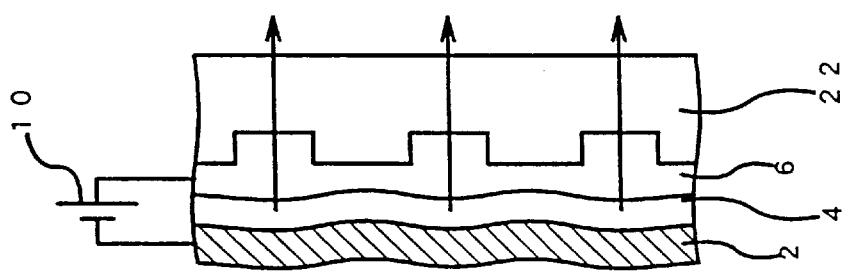

In both the surface light-emitting devices shown in FIGS. 8A and 8B, an uneven transparent layer formed unevenly in thickness substantially corresponding to the patterns of interference fringes, is disposed at a location outside of the luminescent layer 4, and the light from the luminescent layer 4 is emitted through the transparent layer.

In this way, light corresponding to the patterns of interference fringes can be emitted as a result of illuminating the light from the luminescent layer 4 through the uneven transparent layer. In addition, easy-to-form material(s) can be selected from various materials for the uneven transparent layer because the uneven transparent layer has not many restrictions on its material. As a consequence, the uneven transparent layer can easily and accurately be formed in a shape corresponding to the patterns of interference fringes.

Further, the structures of the surface light-emitting devices depicted in FIGS. 8A and 8B are characterized in that, the anode 6 is formed as a transparent electrode and the uneven transparent layer is disposed at a position outside of the anode 6.

In this manner, the entire portion of the luminescent layer 4 illuminates by applying a voltage between the anode 6 and the cathode 2, so that the resulting light can be emitted through the uneven transparent layer formed unevenly in thickness substantially corresponding to the patterns of interference fringes. Consequently, light reproduced with high fidelity to the patterns of interference fringes may be obtained.

In the surface light-emitting device shown in FIG. 8A out of the drawings, the uneven transparent layer is formed as a glass substrate 22 having transparency and the light from the luminescent layer 4 is emitted through the anode 6 and the glass substrate 22.

As a consequence, a shape corresponding to the patterns of interference fringes can easily and accurately be obtained by just forming convex/concave patterns corresponding to the patterns of interference fringes on the surface of the glass substrate 22 having transparency.

In the surface light-emitting device shown in FIG. 8B, on the other hand, the uneven transparent layer is formed as a passivation layer 24 having transparency and the light from the luminescent layer 4 is emitted through the anode 6 and the layer 24.

Consequently, a shape corresponding to the patterns of interference fringes can be obtained easily and accurately by just forming concave and convex corresponding to the patterns of interference fringes on the surface of the layer 24.

Subsequently, embodiments of the present invention to realize a light source suitable for the reproduction of holograms will be described.

Figure 9:
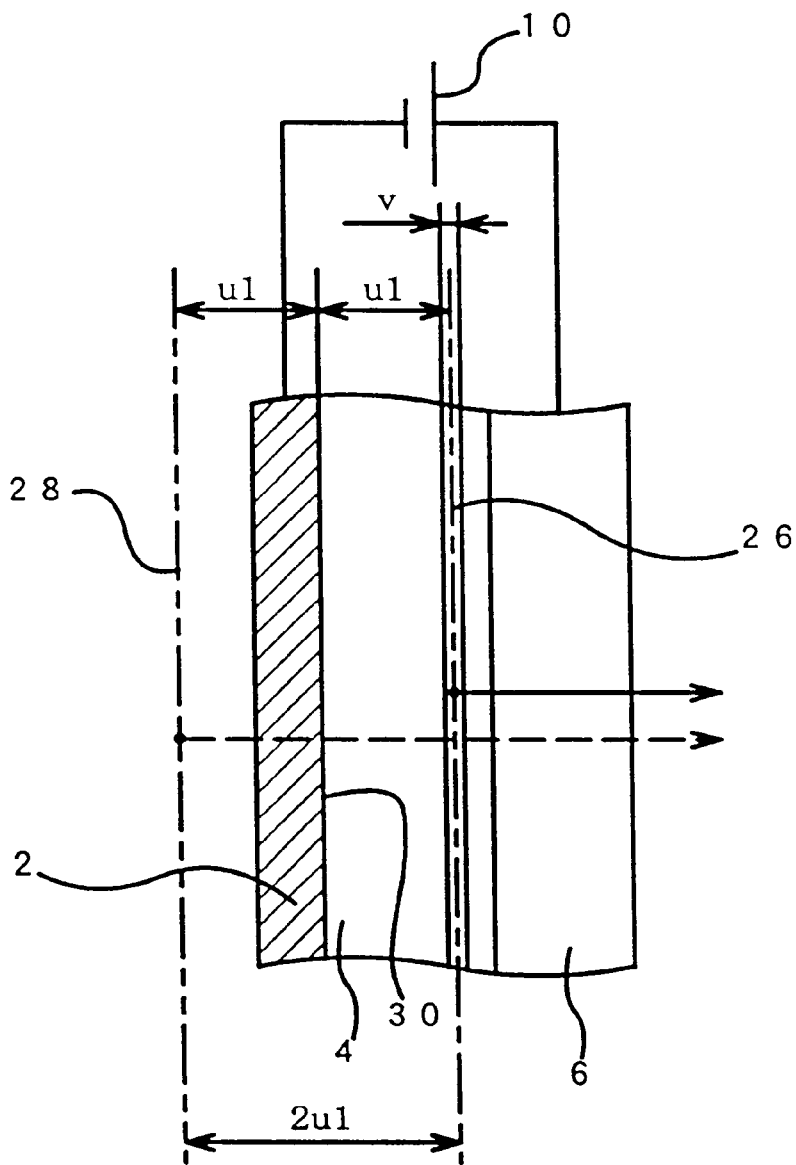
FIG. 9 is a sectional view for describing an embodiment of a surface light-emitting device realizing a light source much suitable for reproduction of holograms.

One of such embodiments will be described with reference to FIGS. 9 through FIG. 10B. As shown in FIG. 9, an active thickness (optical depth) v of the luminescent part 26 emitting light in the luminescent layer 4 can be formed in a thickness negligible (approximately 5 nano-meters) in comparison with the wavelength of the emitted light (as described above) when the luminescent layer 4 is made of organic material(s).

However, an imaginary light source 28 created by reflection of the light directed to the backside (a direction other than a predetermined optical path) is located at a position apart from the luminescent part 26. The light source can not keep its optical depth narrow if the imaginary light source 28 is located at such a position. In other words, the depth of the imaginary light source 28 substantially becomes approximately to 2 u1 unexpectedly when an optical distance between the luminescent part 26 and a reflective plane 30 forming the surface of the cathode 2 is defined as u1.

There might be too many restrictions on the reproduction of holograms if the optical distance is in an unexpected depth. The restriction might cause the following problems such as; 1) the spatial coherence is unexpectedly lowered, 2) the holograms need to be handled as thick holograms and so on.

Figure 10B:
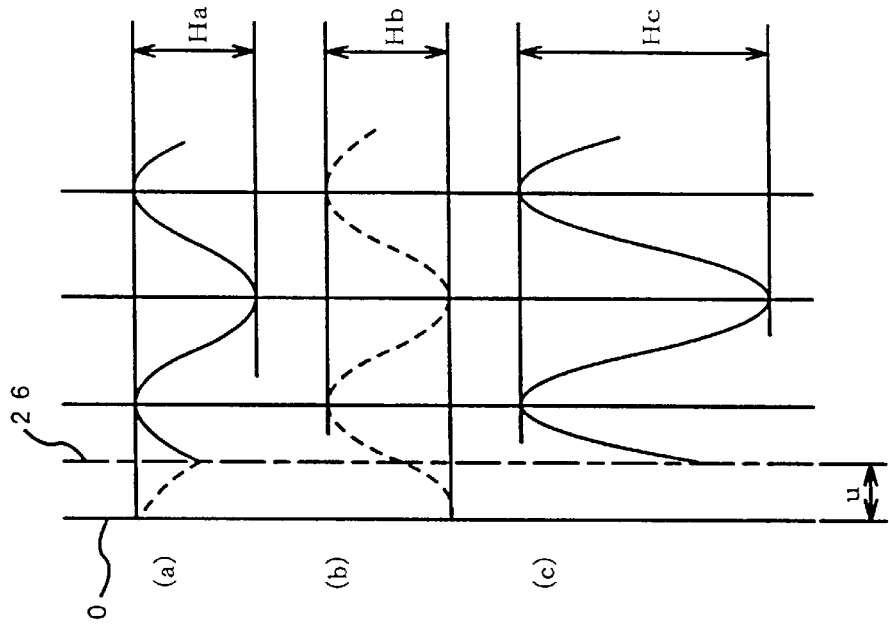
FIG. 10B is a graph illustrating the functions of said surface light-emitting device.
Figure 10A:
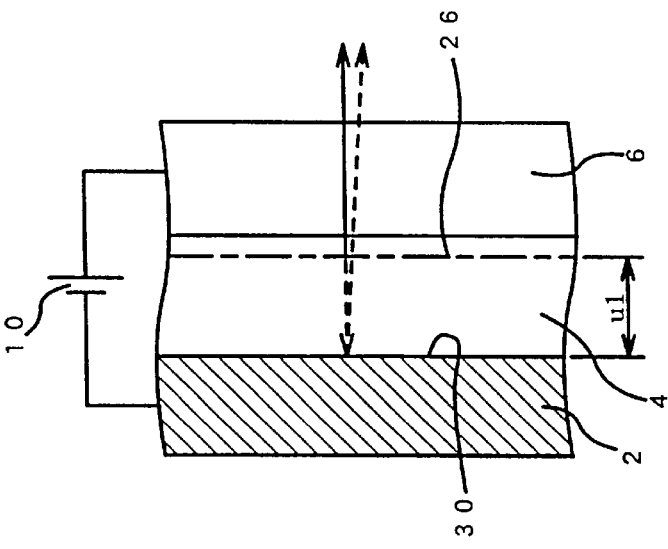
FIG. 10A is a sectional view showing the structure of embodiment of the surface light-emitting device realizing the light source much suitable for reproduction of holograms.

In order to avoid such restrictions, the anode 6 is formed as a transparent electrode and the reflective plane 30 is disposed on the surface of the cathode 2 so that both the light go through the anode 6 and the light reflected on the reflective plane 30 are incorporated so as to intensify the resulting light as shown in FIG. 10A.

For example, an optical distance u1 between the luminescent part 26 and the reflective plane 30 of the cathode 2 may be defined as the following equation;

$$u1 \approx (2n-1)\lambda/4$$

wherein "n" is a positive integer, and "$\lambda$" equals to a wavelength of the light desirably emitted from the device.

As shown in FIG. 10B, phase of reflected light of the light directed to the backside (to the cathode 2) of the luminescent layer 4 therefrom (see FIG. 10B (b)) and that directed to the front-side (to the anode 6) therefrom (see FIG. 10B (a)) are nearly matched. It is, therefore, possible to emit light suitable for the reproduction of holograms.

Amplitude of the resulting light Hc (see FIG. 10B (c)) may be calculated under the equation below when amplitude of the lights directed to the front-side and reflected light of the light directed to the back-side of the luminescent layer 4 therefrom respectively defined as "Ha" and "Hb";

$$Hc \approx Ha + Hb.$$

In other words, the resulting light having a higher intensity than that of the light emitted from the luminescent layer 4 can be obtained by forming the device as shown in FIG. 10A. Consequently, it is possible to provide a surface light-emitting device realizing the light source much suitable for the reproduction of holograms.

Subsequently, another embodiment realizing a light source much suitable for the reproduction of holograms will be described with reference to FIGS. 1A through 12B.

Figure 11A:
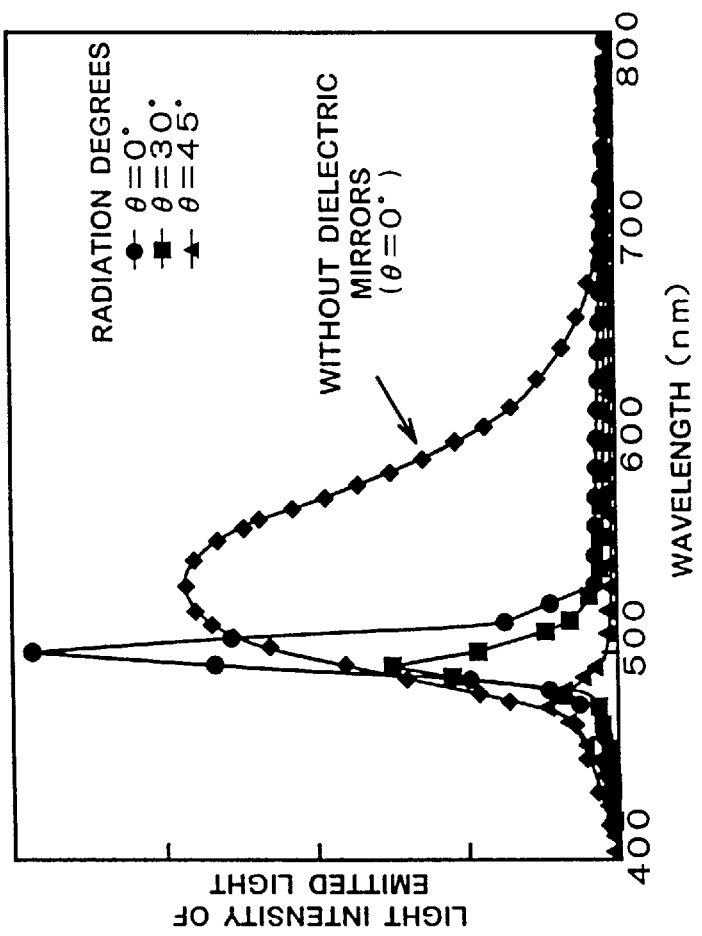
FIG. 11A is a sectional view showing the structure of another embodiment of the surface light-emitting device realizing the light source much suitable for reproduction of holograms.

As shown in FIG. 11A, in this embodiment, an anode 6 in the device is formed as transparent electrodes, and a cathode 2 is formed as an electrode reflecting lights access thereto. Both a light-emitting layer 4 and a hole transport layer 14 are disposed between the cathode 2 and the anode 6 in that order. In addition, four pairs of dielectric mirrors 36 forming a dielectric reflective layer are disposed at a position outside (at the side light emits therefrom) of the anode 6 so as to build up a stacked layer. Each of the mirrors 36 is formed of a stacked-structure composed of an oxide titanium layer 32 and a silicon oxidation layer 34 formed in that order.

By forming the device as described above, the light from the luminescent layer 4 is resonated between the reflective plane 30 of the cathode 2 and reflective planes of the mirrors 36 (inner planes of the mirrors 36), and the light thus resonated is emitted.

For example, another optical distance u2 between the reflective plane 30 of the cathode 2 and one of the reflective planes of the mirror 36 may be defined as the following equation;

$$U2 \approx n\lambda/2$$

wherein "$\lambda$" represents a wavelength of the light desirably emitted from the device.

The device fabricated under the structure described above can obtain monochromatic radiation having a high intensity effectively with a simple structure. Also, light having a high directivity can be obtained with the device as well. Lights having similar phase can further be obtained. In other words, it is possible to provide a surface light-emitting device realizing the light source suitable for reproduction of holograms.

FIGS. 11A through 12B are views illustrating a case in which the wavelength $\lambda$ of the light desirably emitted from the device is 490 nano-meters. In these examples, the oxide titanium layer 32 and the silicon oxidation layer 34 both composing a pair of the mirror 36 are respectively formed 61 nano-meters and 96 nano-meters in thickness. The optical distance of the two pairs of the mirrors 36 provided adjacent to the anode 6 is approximately 1.1$\lambda$ because index of refraction of the both the oxide titanium layer 32 and the silicon oxidation layer 34 is respectively 2.3 and 1.45.

The luminescent layer 4, the hole transport layer 14, and the anode 6 are respectively formed as 30 nano-meters, 40 nano-meters, and 40 nanometers in thickness. A sum total of the optical distance across the luminescent layer 4, the hole transport layer 14, and the anode 6 becomes approximately 0.4$\lambda$ because index of refraction of both the luminescent layer 4 and that of the hole transport layer 14 is 1.7, and that of the anode 6 (ITO layer) is 1.9.

As a result, an optical distance between the reflective plane 30 of the cathode 2 and the reflective plane in the third pair of the mirror 36 becomes approximately 3/2$\lambda$. In other words, it is apparent that the emitted light is in a resonant condition. Light having similar phase further can be obtained by making the emitted light in the resonant condition.

Figure 11B:
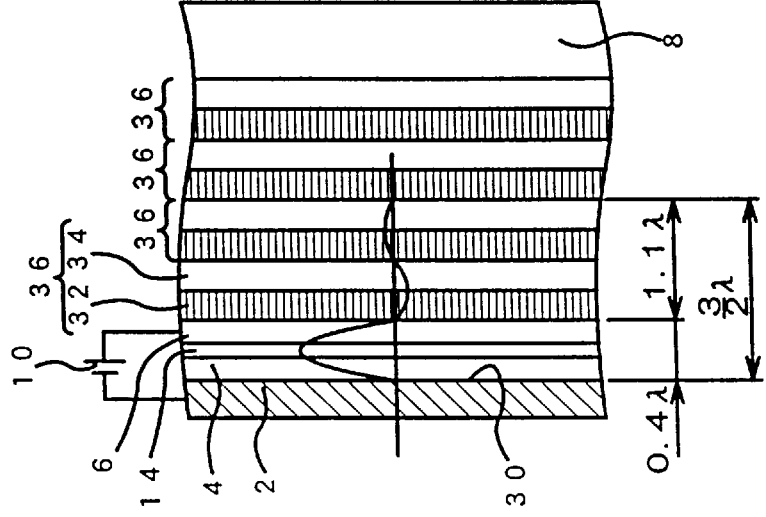
FIG. 11B is a graph illustrating the functions of said surface light-emitting device.

FIG. 11B is a graph illustrating spectra of the emitted light from the device shown in FIG. 11A using radiation degrees of the light as parameters. It is apparent from the graph that these lights have a narrower frequency range (much like monochromatic radiation) with higher light intensity in comparison with the lights without providing the mirrors 36.

Figure 12A:
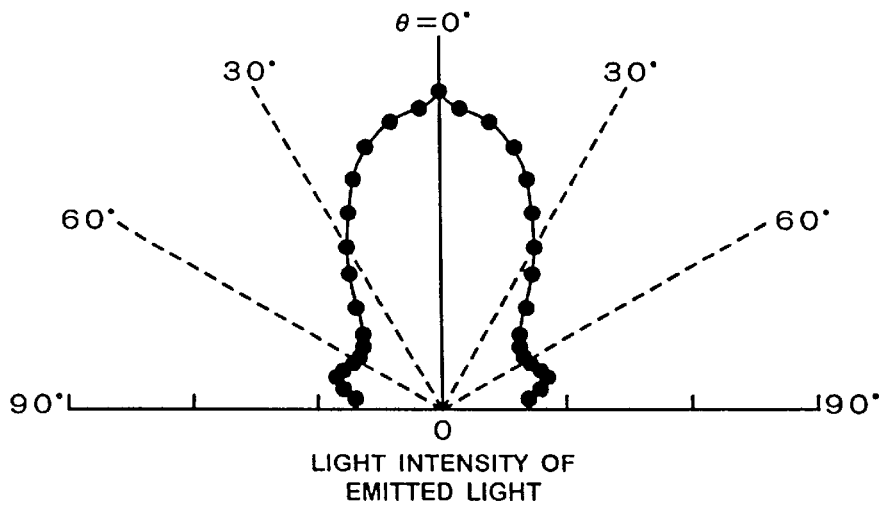
FIGS. 12A and 12B are graphs illustrating the function of the surface light-emitting device shown in FIG. 11A.
Figure 12B:
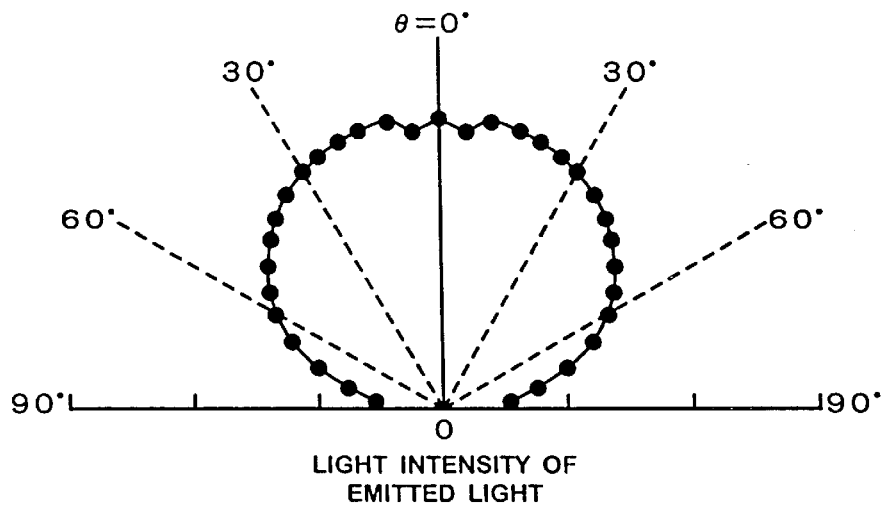

FIG. 12A is a graph illustrating radiation patterns of the emitted lights from the device shown in FIG. 11A. Also, FIG. 12B is a graph illustrating radiation patterns of emitted lights from the device without the mirrors 36 It is apparent from both the graphs shown in FIGS. 12A and 12B that directivity of the emitted lights becomes keen by providing the mirrors 36 thereto.

Subsequently, another embodiment of the present invention to realize a light source suitable for the reproduction of holograms will be described with reference to FIGS. 13A and 13B.

Figure 13A:
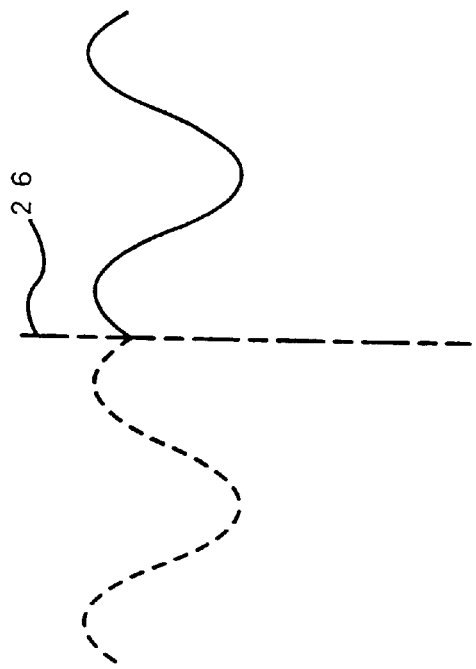
FIG. 13A is a sectional view showing the structure of still another embodiment of the surface light-emitting device realizing the light source much suitable for reproduction of holograms.
Figure 13B:
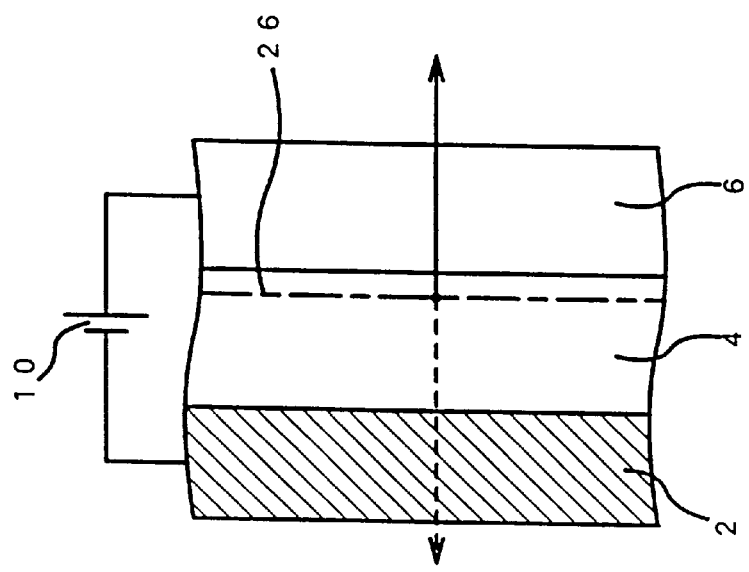
FIG. 13B is a view illustrating the functions of said surface light-emitting device.

As shown in FIG. 13A, both an anode 6 and a cathode 2 in a device of this embodiment are formed as transparent electrodes. In addition, a luminescent layer 4 is disposed between the anode 6 and the cathode 2.

Most of lights (shown in a dotted line) directed to the backside (other direction than a predetermined optical path) out of the lights emitted from a luminescent part 26 are not reflected and go straight to the backside by forming both the anode 6 and the cathode 2 as transparent electrodes as a result of suppressing its reflection factors in a lower level. In this way, the light source never widens its practical optical depth.

As a consequence, localization of an imaginary light source created by reflection of the lights directed to the backside to a position other than that of the luminescent part 26 may be avoided by permitting the travel of most of the lights go to the backside from the luminescent layer 4 in the backward-direction.

As a result, the light source can keep its optical depth narrow. There is no probability to interfere phase of the lights directed to the front-side (shown in actual line) with reflection of the lights directed to the backside (shown in dotted line). It is, therefor, possible to obtain the lights suitable for reproduction of holograms.

Although, glass substrates are used as the supporting member in the embodiments described earlier, there is no limitation to use the glass substrates as the supporting member. Any other substrates appropriate such as substrates made of synthetic resin may also be used as the supporting member. In addition, substrates having no transparency may also be used for the supporting member.

Although, the electrodes in the embodiments described earlier are formed as pairs of electrode layers (anode 6 and cathode 2) so as to interpose the light-emitting players 4, any other structures may also be employed.

Alternatively, organic materials forming the luminescent layers are disposed in a direction substantially parallel to the electrodes in the embodiments described earlier, the molecular alignment of the organic materials is not limited to that direction. For example, organic materials forming the luminescent layers may also be disposed in a direction substantially perpendicular to the electrodes.

Although, organic materials are used for the luminescent layers in the earlier embodiments, the materials of the luminescent layers are not limited to organic materials. For example, inorganic material(s) may also be used for the luminescent layers.

The anode 6, the cathode 2, the shielding layer 20 and so on are examples as hologram layers corresponding to the patterns of interference fringes of holograms in the earlier embodiments. The hologram layers are not limited to these layers. For example, the luminescent layer 4, the hole transport layer 14, the electron transport layer 16, and the hole injection layer 18 and so on may also be used as the hologram layers. In addition, the hologram layer may be formed by combining any of these layers. In short, a hologram layer formed substantially corresponding to the patterns of interference fringes of holograms should be disposed either on a layer related to light emission or on an optical path for emitting lights from the luminescent layer.

Although, patterns of holograms of a condensing lens forming an optical element are exmapled in the earlier embodiments, the hologram patterns of the optical element are not limited to these patterns. Hologram patterns of other lenses such as that of a collimator lens, a concave lens and so on may also be used as the patterns of holograms. In addition to hologram patterns of those lenses, hologram patterns of any other optical elements for example, hologram patterns of mirrors such as a flat-surface mirror, a curved-surface mirror and so on, hologram patterns of transparent glasses, that of diffusing board such as frosted glasses may also be used depending on the usage. Hologram patterns combining any of these elements can also be used as the patterns of holograms.

In the earlier embodiments, hologram patterns of the optical elements are used as the patterns of interference fringes of holograms, the usage of the patterns of interference fringes of holograms is not limited to the hologram patterns of the optical elements. It is, therefore, possible to use the patterns of interference fringes of holograms, for example, created by a combination of optical element(s) and another object(s), and that created by object(s) other than the optical element(s) as the patterns of interference fringes of holograms.

Although, the beam generators are used for the optical pickup devices in the above-described embodiments, the usage of those beam generators is not limited to that. As applicable items of the beam generator, for example, barcode-readers, laser printers, flash lights, turn signals for an automobile and other vehicles, laser pointers using laser beams may be exampled.

Further, the usage of the surface light-emitting devices according to the present invention is not limited to the device used for the beam generator, it can also applicable generally to a surface light-emitting device for an optical-input/output device, for example, one for an image display device.

Chapter 2

Figure 14:
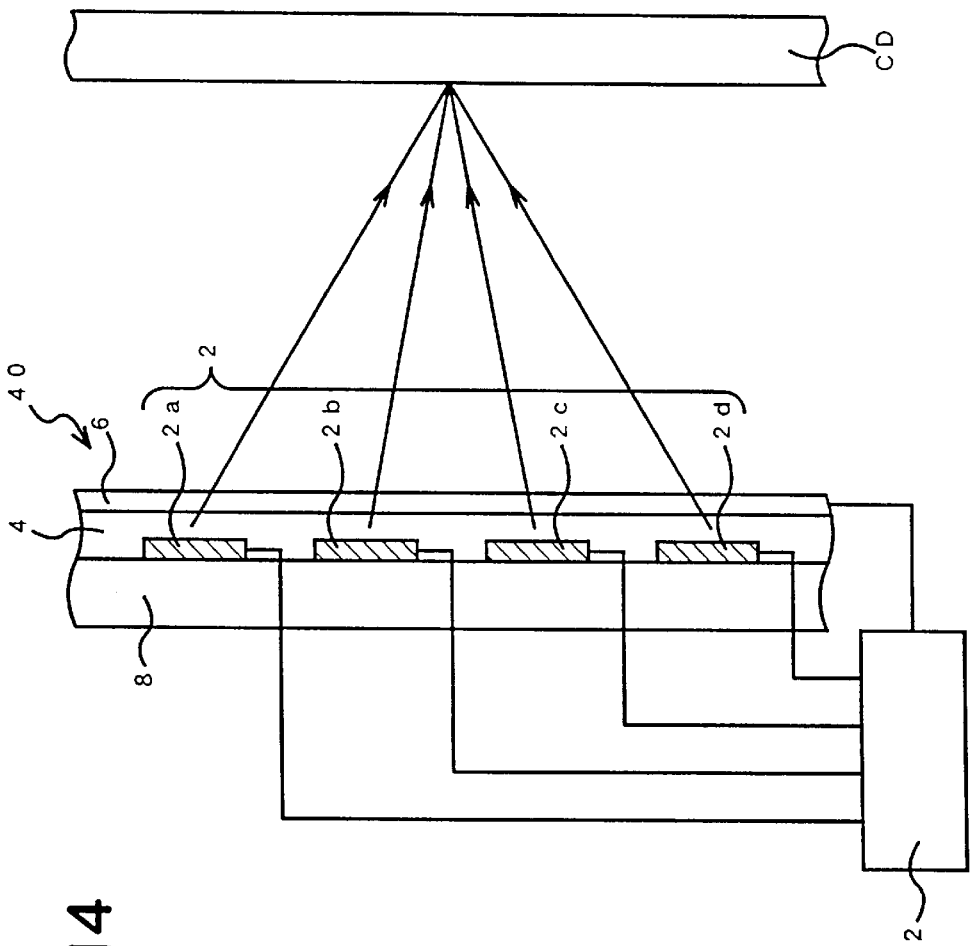
FIG. 14 is a sectional view for describing the structure of yet another beam generator 40 according to another embodiment of the present invention.

FIG. 14 is a sectional view for describing the structure of another beam generator 40 according to another embodiment of the present invention. The beam generator 40 comprises stacked-layers formed of a cathode 2 acting as an electrode layer, a luminescent layer 4 and an anode 6 forming another electrode layer in that order, the stacked-layers being located adjacent to a glass substrate 8 forming a supporting body.

The cathode 2 is formed in a shape substantially corresponding to the patterns of interference fringes of holograms. The cathode 2 forms a hologram layer. In other words, arrangement of portions 2a, 2b, 2c, 2d, and so on composing the cathode 2 correspond to the patterns of interference fringes of holograms.

Each of the portions 2a, 2b, 2c, 2d, and so on composing the cathode 2, and the anode 6 are connected to a control part 42. A DC voltage is applied to both the portions 2a, 2b, 2c, 2d, and so on, and the anode 6 in accordance with the control of the control part 42. All the components of the beam generator 40 except for the control part 42 form a surface light-emitting device.

In this embodiment, description of the present invention will be made under an assumption in which the beam generator 40 is applied to an optical pickup device. It is also assumed that patterns of holograms of a condensing lens forming an optical element, are used as the patterns of interference fringes of holograms.

Figure 15:
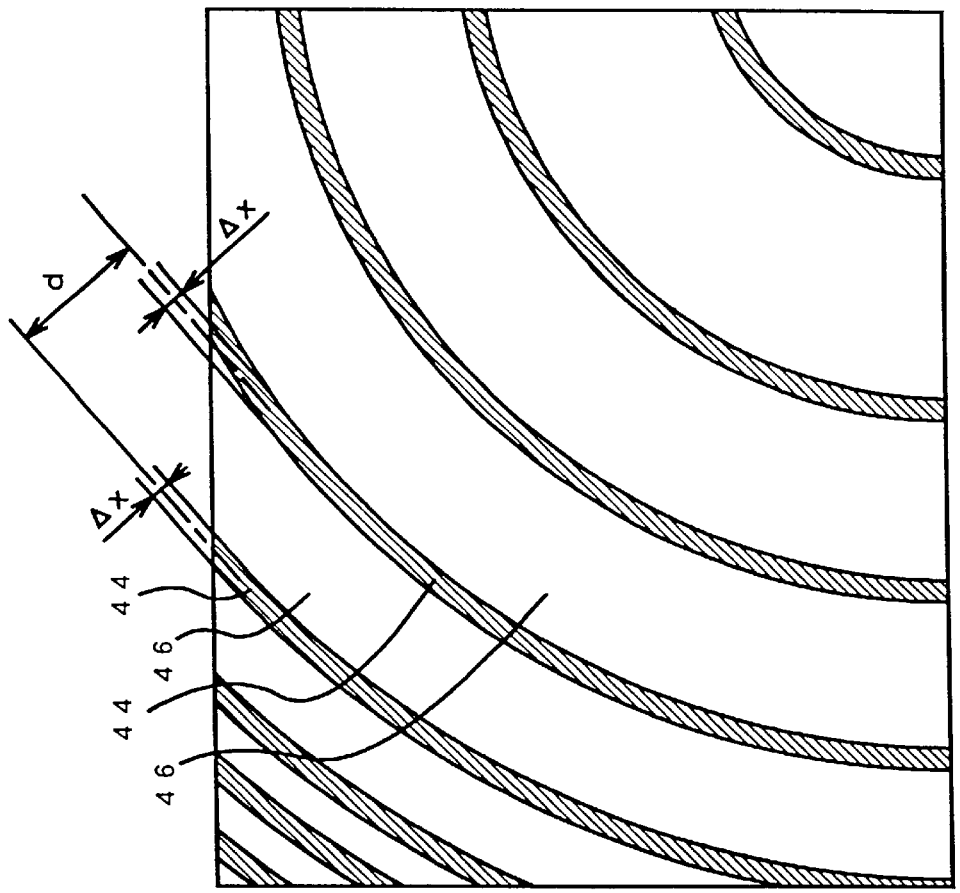
FIG. 15 is a plan view illustrating typical planar structure of hologram layers.
Figure 16:
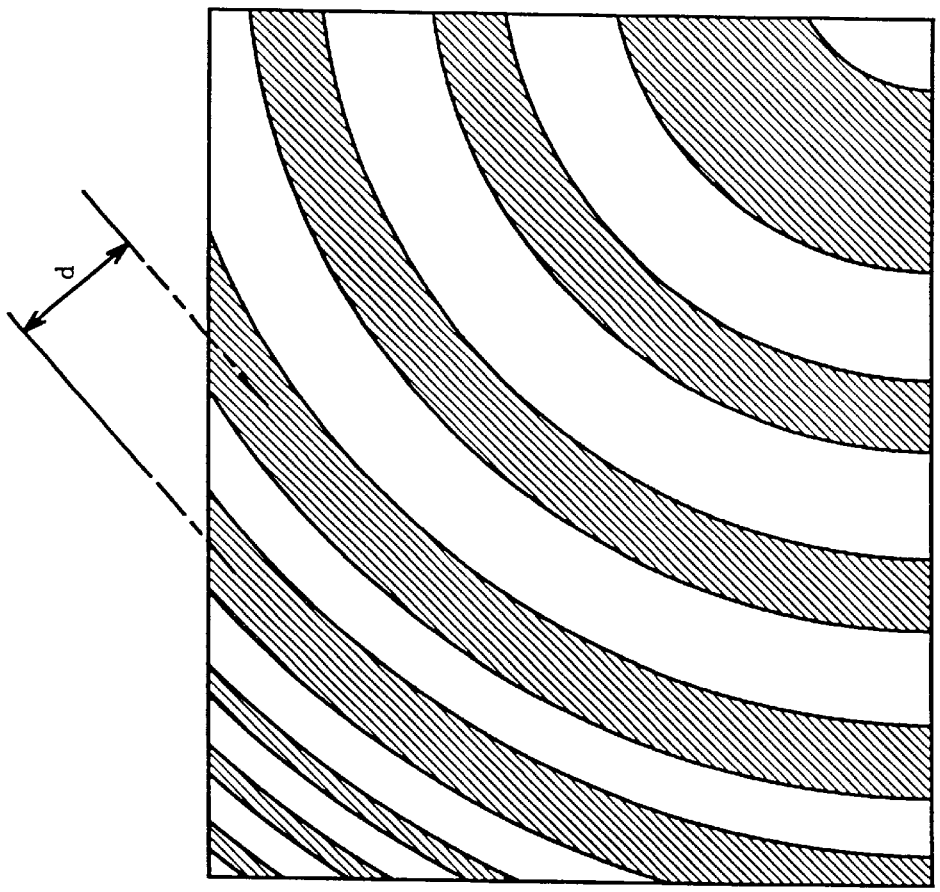
FIG. 16 is a view illustrating typical patterns of interference fringes themselves corresponding to the hologram layers shown in FIG. 15.

FIG. 15 is a plan view illustrating typical planar structure of hologram layers (the cathode 2, in this embodiment). FIG. 16 is a view illustrating typical patterns of interference fringes themselves corresponding to the hologram layers shown in FIG. 15.

The hologram layer shown in FIG. 15 includes both light-pattern 44 and dark-pattern 46. In this embodiment, the light-pattern 44 correspond to the portions 2a, 2b, 2c, 2d, and so on, shown in FIG. 14. The dark-pattern 46 correspond to the parts situated between the portions 2a, 2b, 2c, 2d, and so on. Portions corresponding to the light-pattern 44 shown in FIG. 15 out of the luminescent layer 4 emit light when a DC voltage is applied between the cathode 2 and the anode 6 shown in FIG. 14, so that portions corresponding to the dark-pattern 46 not illuminates light.

It is known that holograms can be reproduced even with a part of the interference fringes of the holograms. In this embodiment, a hologram layer is formed by using patterns located periphery (see FIG. 16) of the interference fringes of the holograms alone.

Figure 17:
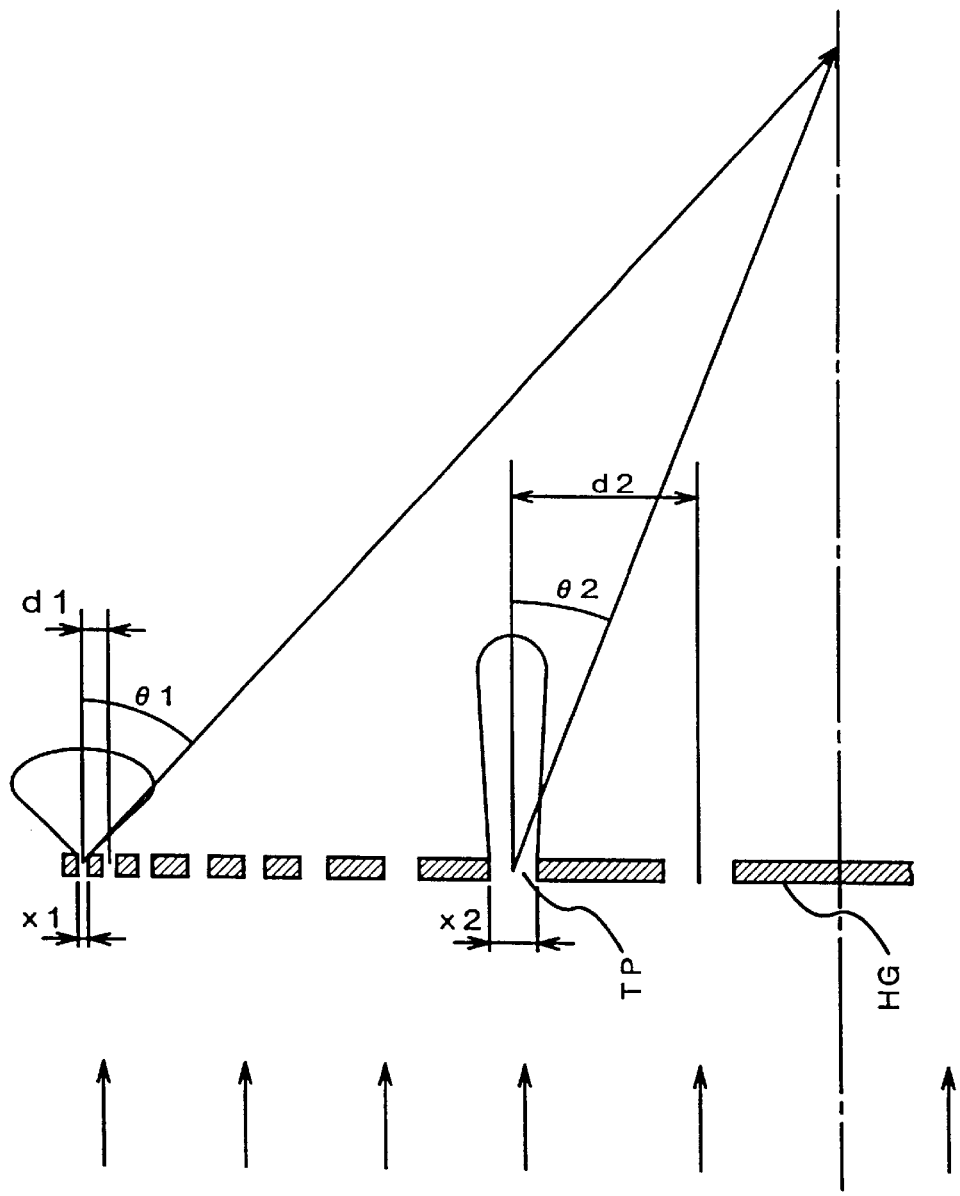
FIG. 17 is a view illustrating a typical condition in which collimated light is directed to ordinary transmission-type holograms HG in a direction of arrows extending from the left-hand side to the right-hand side in the drawing.

The reason of using the peripheral patterns is described with reference to FIG. 17. FIG. 17 is a view illustrating a typical condition in which collimated light is directed to ordinary transmission-type holograms HG on which a hologram pattern of the condensing lens is formed in a direction of arrows extending from the left-hand side to the right-hand side of the drawing.

It is known that directivity of lights after passing through holograms HG (on the side of a light path toward the holograms HG) depending upon the conditions of the lights before passing therethrough (on the opposite side of the light path toward the holograms HG) and a distance between the interference fringes of the holograms HG.

According to the principle, directivity of lights after passing through holograms HG receives much influence of the conditions of the lights before passing therethrough than that created by a distance d of the fringe because the distance d is wider (d=d2) at vicinity of the center of fringes (bottom of FIG. 17). In this way, the directivity must directly reflect the conditions of the lights before passing the holograms HG at positions adjacent to the center of the fringes.

The directivity of lights after passing through holograms HG, on the other hand, receives much influence of the distance d of the fringes than that created by the conditions of the lights before passing therethrough because the distance d is narrower (d=d1) at vicinity of the periphery of fringes (top of FIG. 17).

As a consequence, directivity of lights possibly be controlled in accordance with the distance d departing from the conditions of the lights before passing through the hologram HG at positions adjacent to the center of the fringes.

In other words, it is possible to realize a hologram layer suitable for the reproduction of holograms by using the patterns located periphery of the interference fringes of the holograms alone.

In this embodiment, a width $\Delta x$ of the light-pattern 44 is substantially formed in a range of a wavelength of the light or less than said range as shown in FIG. 15. As a consequence, the width $\Delta x$ of the light-pattern 44 could be narrower than that of the interference fringes originally recorded on the hologram layers shown in FIG. 16 in some places. The distance (pitch) d between the light-patterns 44 is equal to a distance d between the originally recorded interference fringes shown in FIG. 16.

The reason of narrowing the width $\Delta x$ of the light-pattern 44 will be described with reference to FIG. 17. It is known that the directivity of lights after passing through the holograms HG, also, depending upon conditions of the lights before passing therethrough as well as the width of transparent portions TP out of the interference fringes of the holograms HG.

According to the theory, the directivity of lights after passing through holograms HG receives much influence of the conditions of the lights before passing therethrough at a transparent portion TP having a wider width (x=x2), particularly at a portion adjacent to the center of the interference fringes of the holograms HG. In this way, the light directivity must be largely influenced by the conditions of the lights before passing through the hologram HG at the portion having a wider width x.

The light directivity, on the contrary, receives not much influence of the conditions of the lights before passing therethrough at a transparent portion TP having a narrower width (x=x1), particularly at a portion located periphery of the interference fringes of the holograms HG.

It is considered that the light directivity can be controlled regardless of the conditions of the lights before passing through the hologram layer if the hologram layer is formed so as to narrow the width $\Delta x$ of the light-pattern 44 as shown in FIG. 15. In other words, a hologram layer much suitable for reproduction of holograms may be realized.

In addition, light intensity of the holograms is reproduced by adjusting brightness of the portions in the luminescent layer 4 corresponding to the light-pattern 44 while narrowing each light-pattern 44 in a fixed width $\Delta x$ as shown in FIG. 15 in this embodiment.

The brightness of the portions in the luminescent layer 4 where correspond to each light-pattern 44 is controlled by adjusting a current value flowing through the portions out of the luminescent layer 4.

In a concrete form, the brightness of the portions where corresponding to each light-pattern 44 is controlled by respectively adjusting current values flowing through the luminescent layer 4 via each of the portions 2a, 2b, 2c, 2d, and so on composing the cathode 2 in accordance with the control of the control part 42 shown in FIG. 14. Information containing phase of the holograms may be reproduced by allocating each light-pattern 44 (pattern element).

In this way, the hologram layer can be formed by just allocating each of the light-patterns 44 having the fixed width A x at proper locations. Consequently, the hologram layer can be formed easily. Further, the information containing light intensity of the holograms may easily be reproduced by just controlling current values flow through the portions out of the luminescent layer 4 corresponding to each of the light-patterns 44. In other words, it is possible to realize a hologram layer suitable for the reproduction of holograms.

In order to fabricate a surface light-emitting device used for the beam generator 40 depicted in FIG. 14, the following steps need to be carried out. A layer made of metals and the like for forming the cathode 2 is formed on the surface of the glass substrate 8 by evaporation method or the like. Then, the metal layer is patterned in a shape corresponding to the interference fringes by etching process or the like. On the patterned metal layer, another layer made of organic materials for forming the luminescent layer 4 is formed by vacuum evaporation process or the like, and another layer made of oxide materials for transparent electrodes for forming the anode 6 is formed on the organic layer by evaporation method.

The operation of the beam generator 40 will be described. Electric currents, each having a predetermined value flow respectively through the portions 2a, 2b, 2c, 2d, and SQ on composing the cathode 2. In this way, portions out of the luminescent layer 4 between the portions 2a, 2b, 2c, 2d, and so on composing the cathode 2 and the anode 6 illuminate light.

As described earlier, allocation of the portions 2a, 2b, 2c, 2d, and so on corresponds to that of the interference fringes of holograms on the condensing lens (see FIG. 16), and the current values flowing through the portions 2a, 2b, 2c, 2d, and so on respectively correspond to the information containing light intensity of the holograms of the condensing lens. As a consequence, the light from the luminescent layer 4 is focused on the focal point of the condensing lens as a result of proceeding the light in a direction of optical path (a direction in which a compact disc CD and the like is allocated) through the anode 6.

The compact disc CD is allocated at a position so that the focal point of the condensing lens is on the recording layer (not shown) thereof. The data recorded on the recording layer are read out by detecting the amount of light reflected thereby.

As described above, the cathode 2 is formed in a shape substantially corresponding to the hologram patterns of the condensing lens. In this way, a part of the luminescent layer 4 illuminates light correspondingly to the hologram patterns of the condensing lens by flowing appropriate electric currents through the cathode 2 and the anode 6.

As a consequence, the surface light-emitting device alone can be used for both the light source and the condensing lens. Consequently, the beam generator 40 can be manufactured with compact-profile and in reasonable cost by using the surface light-emitting device according to the present invention.

Although, the width of the light-pattern composing the hologram layer is substantially formed in a range of a wavelength of the light or less than said range in the above embodiment, the width can be formed in a range substantially exceeding the wavelength.

Although, light intensity of the holograms is reproduced by adjusting brightness of the portions corresponding to the light-pattern while making each light-pattern in a fixed width in the above embodiment, the brightness of the portions may be fixed to a certain degree while making the width of the each light-pattern in a width corresponding to that of the interference fringes of the holograms originally recorded.

In the above embodiment, the hologram layer is formed alone with a part located periphery of interference fringes of the hologram, any other portions may also be used for forming the hologram layer forms the hologram layer.

All the descriptions in the chapter 1 are applied to this chapter unless otherwise they are not clearly applicable to this chapter. For example, the description on materials of the luminescent layer 4, the anode 6 and that of the cathode 2, each composing the surface light-emitting device, and the description on stacked layer structure of the device referring to FIGS. 2 through 13 may also be applicable to this chapter.

Chapter 3

Figure 18:
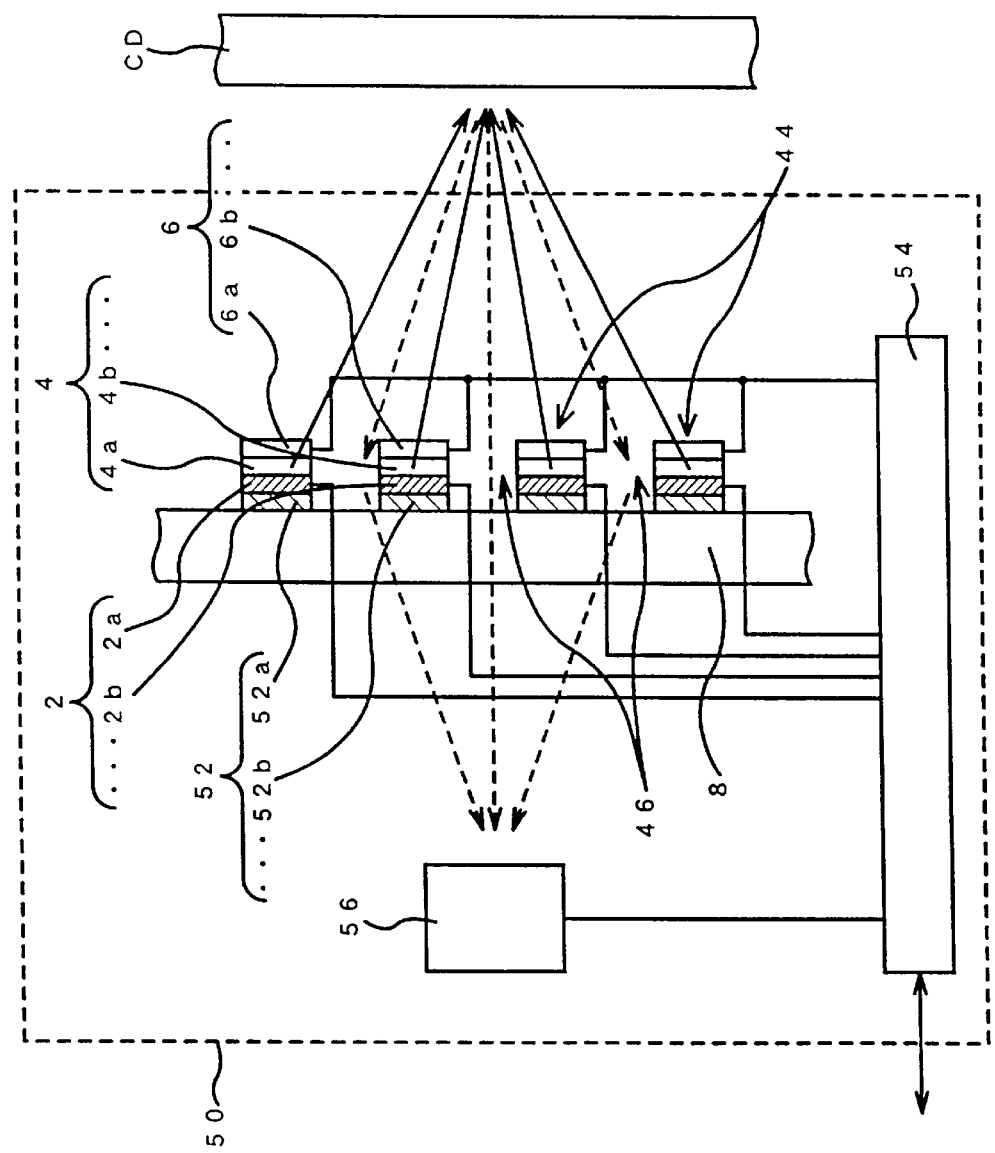
FIG. 18 is a sectional view for describing the structure of an optical pickup device 50 in another embodiment of the present invention.

FIG. 18 is a sectional view for describing the structure of an optical pickup device 50 forming not only a light-input/output device but also a device for monitoring reflected light using a surface light-emitting device according the present invention. The optical pickup device 50 comprises a stacked-layer formed of a non-light-transparent layer 52, a cathode 2 acting as an electrode layer, a luminescent layer 4 and an anode 6 forming another electrode layer in that order, the stacked-layer being located adjacent to a glass substrate 8 forming a supporting body.

The non-light-transparent layer 52 includes a plurality of portions 52a, 52b and so on. The cathode 2 also comprises a plurality of portions 2a, 2b and so on. The luminescent layer 4 includes a plurality of portions 4a, 4b and so on. The anode 6 is composed of a plurality of portions 6a, 6b and so on.

The stacked-layer including the non-light-transparent layer 52, the cathode 2, the luminescent layer 4 and the anode 6 is substantially formed in patterns corresponding to the patterns of the interference fringes of the holograms. Three layers such as the cathode layer 2, the luminescent layer 4 and the anode layer 6 out of layers in the stacked-layer form the hologram layer. The hologram patterns of the condensing lens forming the optical element are used as the patterns of the interference fringes of the holograms. Each of the portions 2a, 2b and so on forming the cathode 2 and the portions 6a, 6b and so on composing the anode 6 are respectively connected a control part 54. A direct current flow through each of the portions 2a, 2b and so on and the portions 6a, 6b and so on under the control of the control part 54. As described earlier, the portions 52a, 52b and so on composing the non-light-transparent layer 52 are disposed between the portions 2a, 2b and so on forming the cathode 2 and the glass substrate 8.

A detector 56 forming an optical sensor is allocated at a position behind the glass substrate 8 (on the left-hand side in the drawing). The detector 56 is controlled by the control part 54. The data read out with the detector 56 is outputted externally through the control part 54. All the components of the optical pickup device 50 except for both the control part 54 and the detector 56 form the surface light-emitting device.

For simplicity, it is assumed that FIG. 15 is a plan view illustrating typical planar structure of hologram layers (a stacked-layer composed of the cathode 2, the luminescent layer 4, and the anode 6, in this embodiment), and another assumption is made that FIG. 16 is a typical view illustrating the patterns of interference fringes of the holograms themselves corresponding to the hologram layer depicted in FIG. 15.

The hologram layer depicted in FIG. 15 is composed of the light-pattern 44 and the dark-pattern 46. In this embodiment, for example, a stacked body composed of the portion 2a forming the cathode 2, the portion 4a of the luminescent layer 4, and the portion 6a forming the anode 6, and another stacked body composed of the portion 2b of the cathode 2, the portion 4b forming the luminescent layer 4, and the portion 6a of the anode 6, and so on depicted in FIG. 18 form the light-pattern 44. On the other hand, the portions between the stacked bodies form the dark-pattern 46. As a consequence, both the light-pattern 44 and the dark-pattern 46 make patterns corresponding to the hologram patterns of the condensing lens.

The portion corresponding to the light-pattern 44 illuminates light and that corresponding to the dark-pattern 46 not illuminates light when a direct voltage is applied between the cathode 2 and the anode 6 shown in FIG. 18, both the portions being depicted in FIG. 15.

In addition, the light from the luminescent layer 4 travels in a forward-direction (on the right-hand side in the drawing) to the optical path but not proceeds in a backward-direction thereto because the non-light-transparent layer 52 is disposed at the portions corresponding to the light-pattern 44. On the contrary, the light penetrates the portions corresponding to the dark pattern 46 and travels in the backward-direction because none of the non-light-transparent layer 52 is formed thereon.

In order to fabricate a surface light-emitting device composing the pickup device 50 depicted in FIG. 18, the following steps need to be carried out. A layer made of metal and the like which is used for the non-light-transparent layer 52 is formed on the surface of the glass substrate 8, and then another layer made of metal and the like which is used the cathode 2 is disposed thereon by evaporation method or the like. These metal layers thus formed are patterned in a shape corresponding to the interference fringes by carrying out etching process or the like. On the patterned metal layers, another layer made of organic material(s) for forming the luminescent layer 4 and another layer made of oxide material(s) for transparent electrodes for forming the anode 6 are formed by vacuum evaporation method or evaporation method and similar method by utilizing a shadow mask(s) or the like.

Subsequently, the operation of the pickup device 50 will be described with reference to FIG. 18. Electric currents each having a predetermined value respectively flow between the portions 2a, 2b and so on composing the cathode 2 and the portions 6a, 6b and so on forming the anode 6. In this way, each of the portions 4a, 4b and so on composing the luminescent layer 4 illuminate the light.

As described earlier, allocation of the portions 4a, 4b and so on composing the luminescent layer 4 corresponds to that of the interference fringes of holograms on the condensing lens (see FIG. 16), and the current values flowing through the portions 4a, 4b and so on respectively correspond to the information containing light intensity of the holograms of the condensing lens. As a consequence, the light from the luminescent layer 4 (indicated as solid lines in FIG. 18) is focused on the focal point of the condensing lens as a result of traveling the light in a direction of optical path (a direction in which a compact disc CD and the like is allocated) through the anode 6. The light from the luminescent layer 4 never travels in a backward-direction (to the left-hand side in the drawing) to the optical path because of the existence of the non-light-transparent layer 52 as described earlier.

The compact disc CD is allocated at a position so that the focal point of the condensing lens is focused on the recording layer (not shown) thereof. The reflected light from the recording layer (indicated as dotted lines in FIG. 18) travels in the backward-direction to the optical path and returns to the hologram layer. A part of the reflected light pass through the dark-pattern 46 and further travels in the backward-direction to the optical path.

As described earlier, not only the light-patter 46, but also the dark-pattern 46 are patterns corresponding to the hologram patterns of the condensing lens. The reflected light passing through the dark-pattern 46 is focused on another focal pint of the condensing lens located in the backward-direction to the optical path of the hologram layer. The detector 56 is disposed at a position so that the optical sensing portion thereof (not shown) is situated on the focal point. The data recorded on the recording layer of the CD and other data recording mediums are read out by detecting the amount of light reflected thereby with the detector 56.

The stacked layer composed of the cathode 2, the luminescent later 4, and anode 6, is used as the hologram layer while the light once emitted is returns through the hologram layer in this embodiment.

In this way, the light source, lens and the half mirror can be replaced with just the surface light-emitting device by making the patterns of interference fringes of holograms with the hologram patterns of optical elements such as lens, for example. In other words, the optical pickup device 50 can be manufactured with compact-profile and in reasonable cost by using the surface light-emitting device according to the present invention. Followings are features of the surface light-emitting device used in this embodiment: the hologram layer is composed of the light-pattern 44 and the dark-pattern 46; the light travels in a forward-direction to the optical path but not travels in a backward-direction thereto at the portions corresponding to the light-pattern 44; and the light travels in the backward-direction to the optical path at the portions corresponding to the dark-pattern 46.

The light emitted from the light-pattern 44 only travels in the forward-direction and reflected by the recording layer of the CD. The reflected light passes through the dark-pattern 46 and travels to the backward-direction of the optical path. As a consequence, the pickup device 50 with compact-profile and in reasonable cost can easily be realized by composing the hologram layer with both the light-pattern 44 and the dark-pattern 46 described above.

Further, the non-light-transparent layer 52 formed in a shape corresponding to the light-pattern 44, is disposed at a position in the backward-direction of the optical path of the cathode 2.

In this way, leakage of the light from the light-pattern 44 in the backward-direction may certainly be avoided. Under the circumstances, any electrode material(s) for the cathode 2 having superior capabilities of electric charge-injection and formability may be selected without concerning the capability of light shielding of the cathode 2.

The structure of the surface light-emitting device capable of applying to the present invention is not limited to that shown in FIG. 18.

Figure 19A:
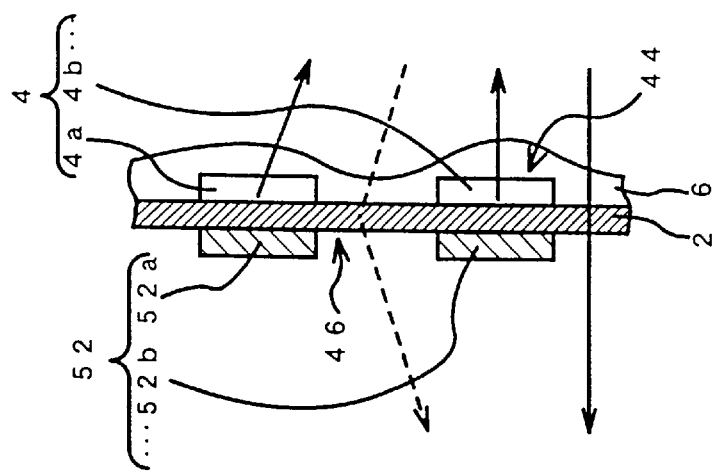
FIGS. 19A through 19C are sectional views showing another examples of the structures of surface light-emitting devices applicable to the present invention.
Figure 19B:
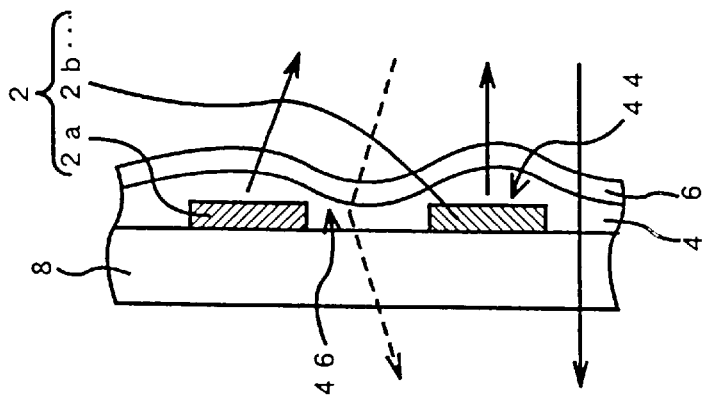
Figure 19C:
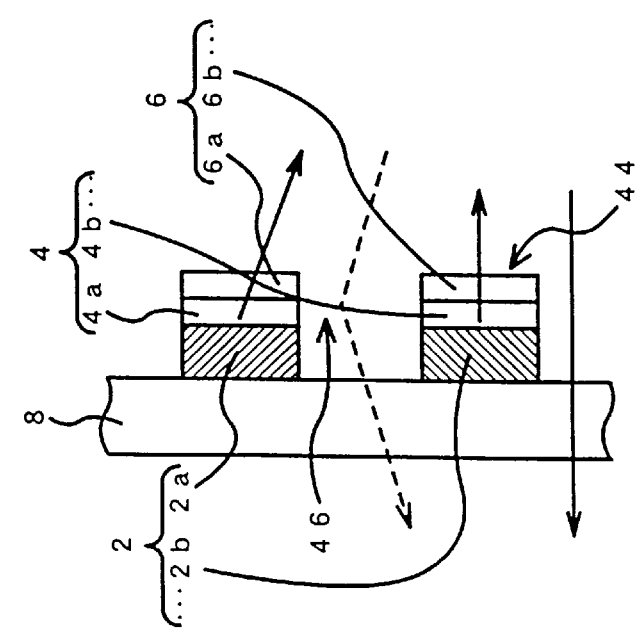

FIGS. 19A through 19C are sectional views showing examples of the structures of other surface light-emitting devices applicable to the present invention. The structure of a surface light-emitting device depicted in FIG. 19 A is the surface light-emitting device removing the non-light-transparent layer 52 from the device shown in FIG. 18.

The cathode 2 of the surface light-emitting device is made of material(s), which is hard to pass through light. In this way, the structure of the surface light-emitting device may be simplified.

The structure of a surface light-emitting device depicted in FIG. 19B is similar to that of the device shown in FIG. 19A in view of forming the cathode 2 with material(s) which is hard to pass through light, but the surface light-emitting device shown in FIG. 19B includes both a luminescent layer 4 and an anode 6 each formed as a complete layer. In this way, layers can further be formed easily and accurately in a shape corresponding to the patterns of interference fringes of holograms because no patterning of the layers except for the cathode 2 is required. In this case, the cathode 2 corresponds to the hologram layer. Further, the luminescent layer 4 has a certain transparency.

In a surface light-emitting device depicted in FIG. 19C, a luminescent layer 4 is used as the hologram layer. In other words, the luminescent layer 4 is formed in a shape corresponding to the patterns of interference fringes of holograms. Both the cathode 2 and the anode 6 are electrodes having transparency.

A non-light-transparent layer 52 is disposed at a position in the backward-direction to the optical path via the cathode 2. The arrangement of the non-light-transparent layer 52 is exactly the same as that of the luminescent layer 4.

All the description in the earlier chapters may be applied to this chapter unless otherwise they are not clearly applicable to this chapter. For example, the description on materials of the luminescent layer 4, the anode 6 and that of the cathode 2, each composing the surface light-emitting device, and the description on layered structure of the device with FIGS. 2 through 4, FIGS. 9 through 12, and FIGS. 15 through 17 may also be applicable to this chapter.

Chapter 4

Figure 20:
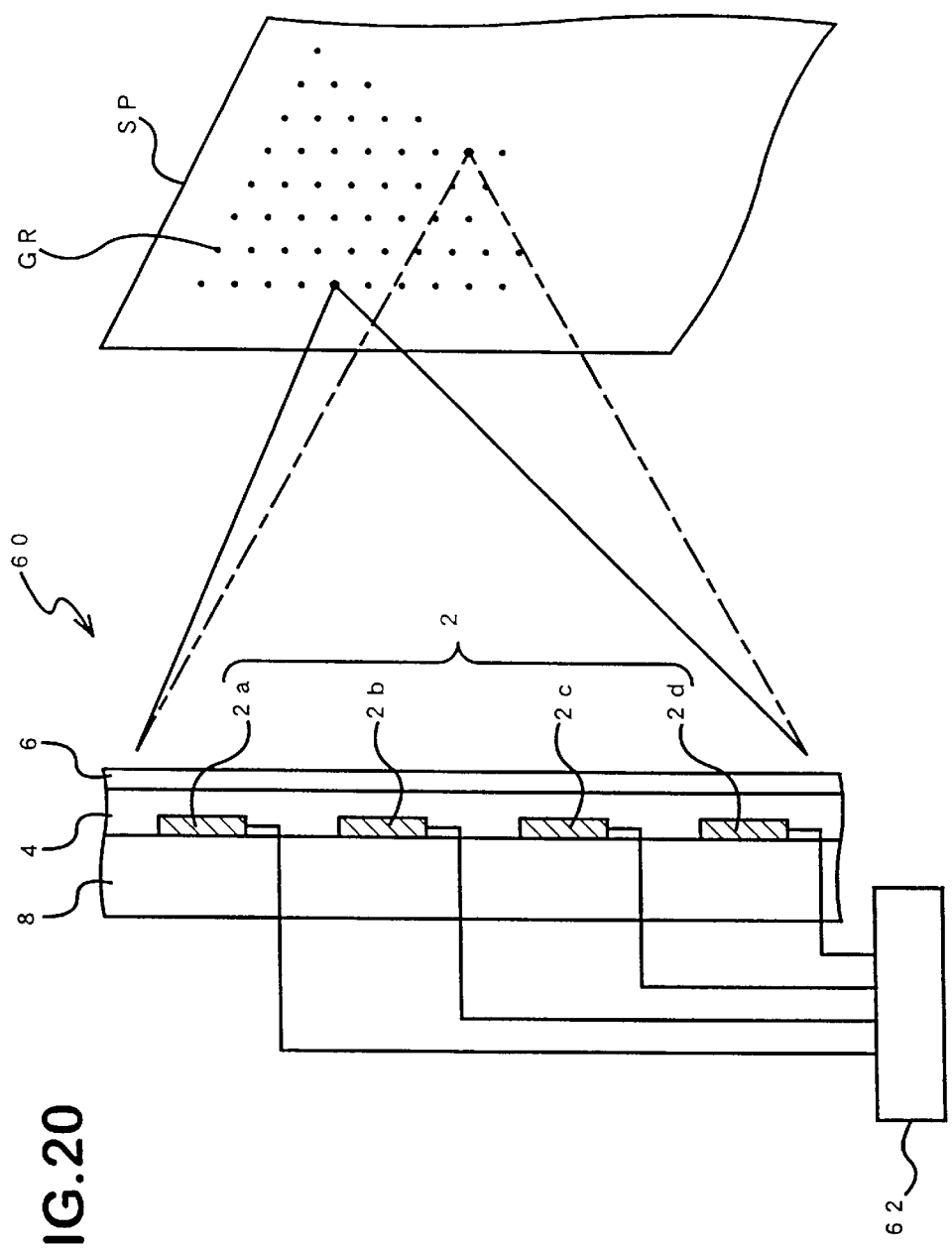
FIG. 20 is a sectional view for describing the structure of far another beam generator 60 according to another embodiment of the present invention.

FIG. 20 is a sectional view for describing the structure of far another beam generator 60 forming a light-input/output device using a surface light-emitting device according to another embodiment of the present invention. The beam generator 60 comprises a stacked-layer formed of a cathode 2 acting as an electrode layer, a luminescent layer 4 and an anode 6 forming another electrode layer in that order, the stacked-layer being located adjacent to a glass substrate 8 forming a supporting body. The cathode 2 forming the hologram layer is composed of portions 2a, 2b, 2c, 2d and so on. Each of the portions 2a, 2b, 2c, 2d and so on respectively forms element region (element electrode).

Figure 22:
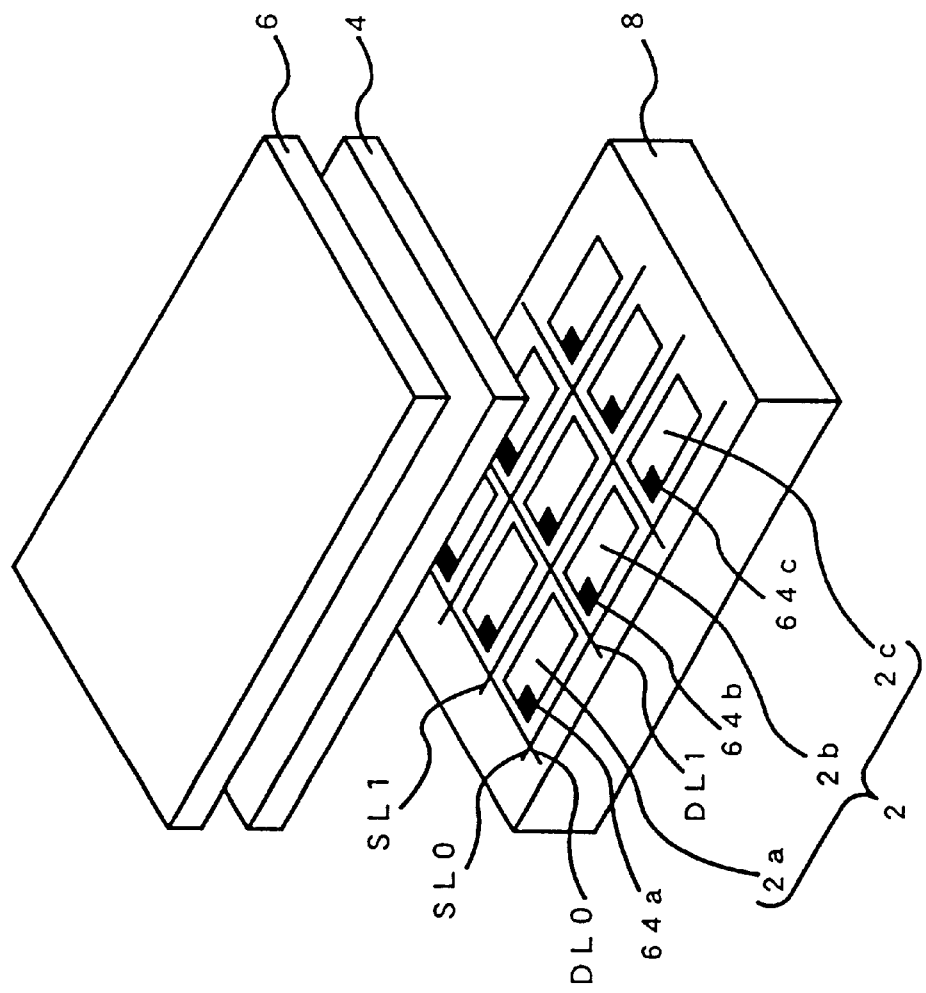
FIG. 22 is an exploded perspective view of the beam generator 60.

FIG. 22 is an exploded perspective view of the beam generator 60 for describing the structure thereof. As apparent from FIG. 22, all the portions 2a, 2b, 2c, 2d and so on are formed identical in shape and are allocated in matrix manner. The portions 2a, 2b, 2c and so on are formed on the glass substrate 8, and thin-Film-Transistor (TFT) circuits 64a, 64b and so on are disposed on the glass substrate 8 correspondingly to the portions 2a, 2b, 2c, 2d and so on. The TFT circuits 64a, 64b and so on form a storing part.

Selection lines SL0, SL1 and so on for selecting rows in the matrix composed of the portions 2a, 2b, 2c, 2d and so on and data lines for providing information containing brightness of the portions 2a, 2b, 2c, 2d and so on, are further arranged on the glass substrate 8.

Figure 23:
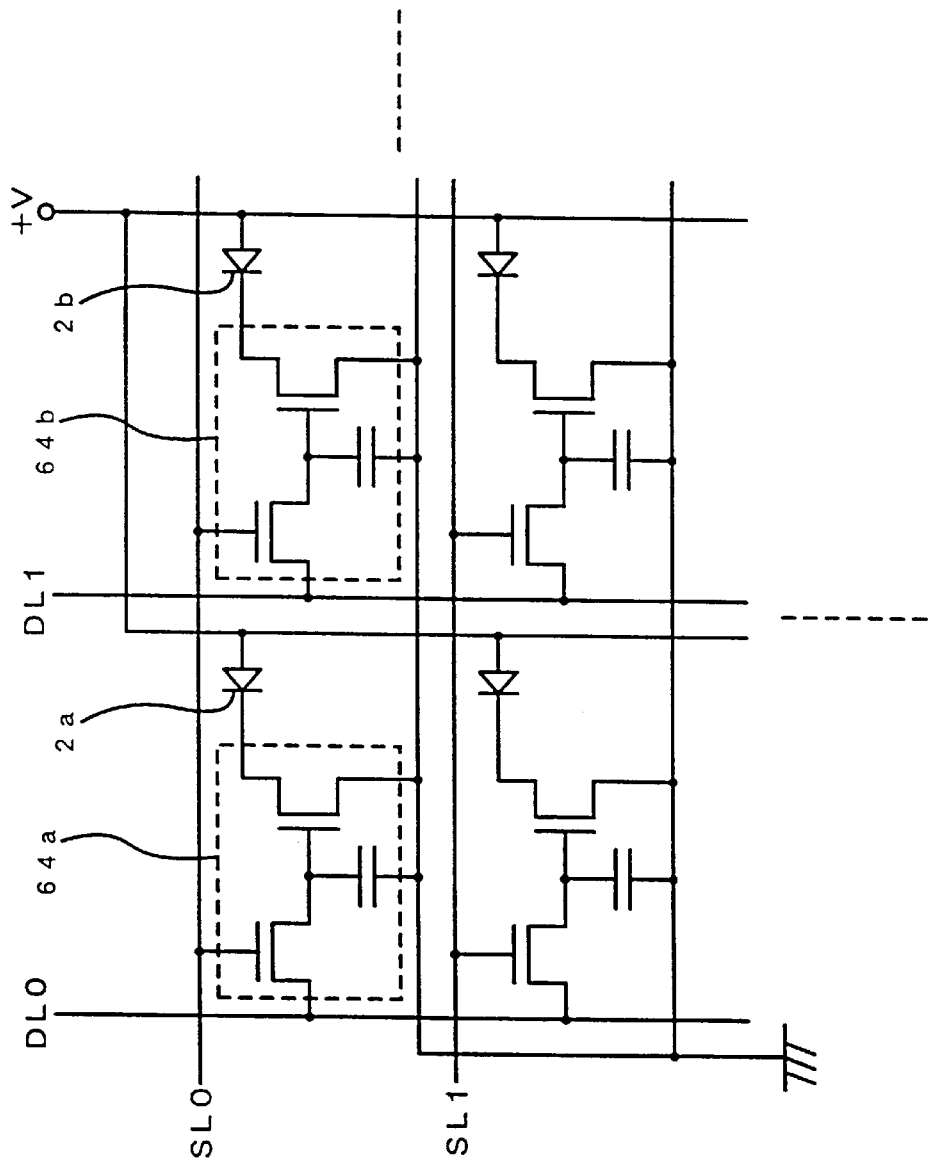
FIG. 23 is a circuit diagram showing part of a circuit in the beam generator 60.

FIG. 23 is a circuit diagram showing a part of the circuits in the beam generator 60. The TFT circuit 64a includes a total of two transistors and one capacitor. Electric charges corresponding to information containing its brightness provided through the data line DL0, are stored in the capacitor while flowing an electric current corresponding to the information through a portion corresponding to the portion 2a out of the luminescent layer 4 when the selection line SL0 is selected. In this way, the portion corresponding to the portion 2a illuminates light under the brightness responding to the information provided through the data line DL0. The corresponding portion maintains its brightness for a predetermined time period (at least a period until selection of all the selection lines of the surface light-emitting device is completed) because of the function of the capacitor even when the selection of the selection line SL0 is cancelled. The remaining TFT circuits 64b and so on have the same structure as well as the same function to that of the TFT circuit 64a.

As a consequence, portions in the luminescent layer 4 corresponding to each of the portions 2a, 2b, 2c, 2d, and so on composing a row belong to the selection line SL0 simultaneously illuminate in a predetermined brightness while maintaining their brightness. Thereafter, the portions corresponding to the selection line SL1 out of the luminescent layer 4 simultaneously illuminate in the predetermined brightness when the selection line SL1 is in selection.

In this way, the number of portions illuminating light in the luminescent layer 4 is sequentially increased under the basis of the portion corresponding to one complete selection line. The portions in the luminescent layer 4 corresponding to all the portions 2a, 2b, 2c, 2d and so on of the cathode 2 simultaneously illuminate in the predetermined brightness (could be brightness at 0, in other words, there are portions show no illumination) when all the selection lines are selected.

Reproduction of the holograms can be assured by simultaneously illuminating each of the portions corresponding to the portions 2a, 2b, 2c, 2d and so on where brightness thereof are previously determined corresponding to the interference fringes of a desired hologram.

A control part 62 depicted in FIG. 20 comprises the TFT circuits 64a, 64b and so on. The control part 62 is designed so as to provide information containing brightness corresponding to one of the selected patterns out of more than one patterns of interference fringes to the TFT circuits 64a, 64b and so on. A direct voltage is applied between each of the portions 2a, 2b, 2c, 2d and so on composing the cathode 2 and the anode 6 in accordance with the control of the control part 62. All the components of the beam generator 60 except for the control part 62 form the surface light-emitting device.

In this embodiment, a plotting device using the beam generator 60 will be described. Under the circumstances, it is assumed that plurality hologram patterns of the condensing lens forming an optical element, are prepared as the patterns of interference fringes of holograms.

Each of the patterns of holograms is designed so as to locate the focal point of the emitted light from the beam generator 60 on any desired point of grid points GR defined on a photosensitive plate SP included in the device depicted in FIG. 20. The focal point of the emitted light can be located any desired point of the grid points GR by selecting an appropriate hologram pattern and then emitting light.

It is known that using even a part of the interference fringes of the holograms may reproduce the holograms. In this embodiment, the holograms are reproduced by using even a part located periphery of the interference fringes. As a consequence, the holograms can be reproduced much accurately as described above (see FIG. 17).

Further, the maximum width of each of the portions 2a, 2b, 2c, 2d and so on respectively for meters through 100 nano-meters.

It is considered that the light directivity can be controlled regardless of the conditions of the lights before passing through the hologram layer if the hologram layer is formed so as to narrow the maximum width of the element regions (see FIG. 17). In other words, a hologram layer much suitable for reproduction of holograms may be realized.

In order to fabricate the beam generator 60 shown in FIG. 20, the following steps need to be carried out. A layer made of metals and the like for forming the cathode 2 is formed on the surface of the glass substrate 8 by evaporation method or the like. Then, the metal layer is patterned in a shape corresponding to the interference fringes by etching process or the like. On the patterned metal layer, another layer made of organic materials for forming the luminescent layer 4 is formed by vacuum evaporation process or the like, and another layer made of oxide materials for transparent electrodes for forming the anode 6 is formed on the organic layer by evaporation method.

Figure 24:
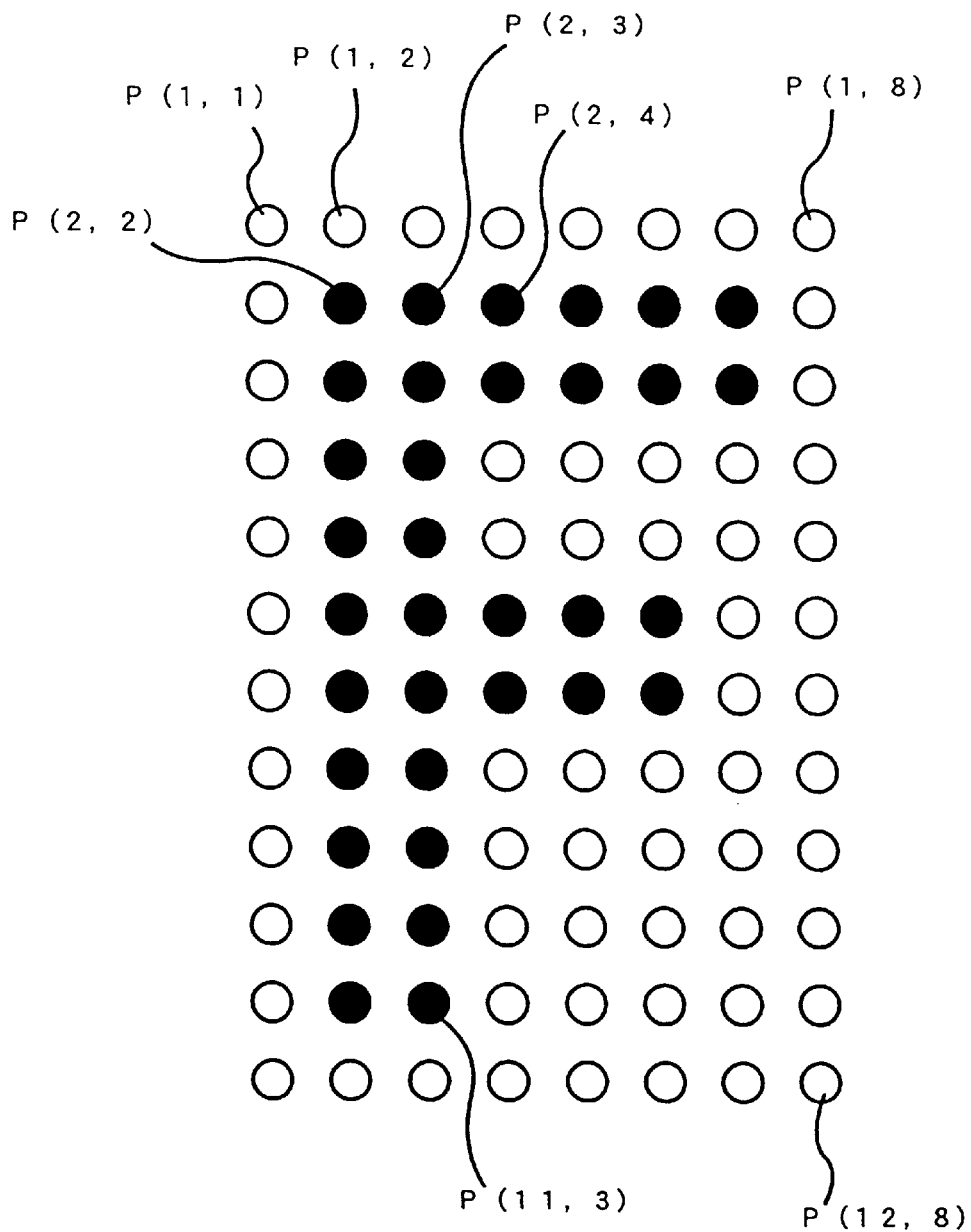
FIG. 24 is a view for describing a series of operations to display an alphabetical character "F" with the beam generator 60.

Subsequently, the operation of the beam generator 60 will be described hereunder. Detailed operation thereof, to print an alphabetical character "F" shown in FIG. 24, is exampled. For simplicity, it is assumed that a total of 96 dots from points P (1, 1) through P (12,8) in maximum (12 longitudinal dots by 8 lateral dots) are required to do so. Each of the pitches defined among the points P (1,1) through P (12,8) corresponds to that defined among the grid points GR shown in FIG. 20.

In order to print the character "F", a total of 34 dots (shown as black dots in the drawing) out of the 96 dots such as from points P (2,2) through P (11, 3) are used.

As described earlier, the patterns of holograms of the condensing lens thus prepared are designed so as to locate the focal point of the emitted light from the beam generator 60 on any desired dots of grid points GR defined on a photosensitive plate SP included in the device depicted in FIG. 20. The surface of the photosensitive plate SP is precharged and the electric charges on a certain part are eliminated when the light is emitted to the part.

At first, the control part 62 shown in FIG. 20 selects a hologram pattern by which the focal point of the emitted light is located on a grip point GR corresponding to the point P (2,2) (see FIG. 24). Then, electric currents corresponding to the selected hologram pattern respectively flow through each of the portions 2a, 2b, 2c, 2d, and so on composing the cathode 2 in accordance with the control of the control part 62.

As a consequence, the parts in the luminescent layer 4 interposed between the portions 2a, 2b, 2c, 2d, and so on and the anode 6 illuminates light correspondingly to the selected hologram pattern. The light illuminated from the luminescent layer 4 travels in a forward-direction (a direction in which the photosensitive plate SP is allocated) through the anode 6, and then the light is focused on the grid point GR corresponding to the point P (2,2) (see FIG. 24). In this way, a grid point GR corresponding to the point P (2,2) can be exposed.

Subsequently, the control part 62 selects another hologram pattern by which the focal point of the emitted light is located on another grid point GR corresponding to the point P (2,3) shown in FIG. 24. By carrying similar steps to the exposure of the grid point GR corresponding to the point P (2,2), the grid point GR corresponding to the point P (2,3) shown in FIG. 24 is exposed. All the grid points corresponding to the points P (2,4) through P (11, 3) shown in FIG. 24 are exposed by performing the similar steps described earlier.

As a consequence, electric charges on the grid points GR defined on the photosensitive plate SP composing the character "F" can be eliminated.

Thereafter, toner is attracted onto a certain area of the photosensitive plate SP in accordance with the presence of electric charges thereon, so that the character "F" may be printed on the printing paper and the like.

In the embodiment described above, the cathode 2 is formed as a hologram layer capable of corresponding to the hologram pattern of the condensing lens while emitting light through a predetermined optical path as a result of selecting one of hologram patterns provided to the beam generator, the emitted light corresponding to the selected hologram pattern. In this way, the beam generator 60 alone functions as both the light source and the condensing lens.

In the above embodiment, location of the focal point can be moved easily on a two-dimensional basis by selecting one of the hologram patterns out of more than one hologram patterns of the condensing lens. By constructing that way, no mechanical components for mechanical movements such as polygon mirror(s) and photosensitive drum are required. Consequently, the focal point can be moved easily and speedy on a two-dimensional basis.

Further, in the conventional type laser printer using both the polygon mirror and the photo-conductive drum, light need to be scanned all over the drum even to the grid points where no exposure is required. Under the circumstances, a longer period of time is spent for the exposure than it actually required therefor if not many grid points to be exposed are existed on the drum. In the embodiment described above, on the contrary, the exposure can be performed by just selecting a hologram pattern capable of focusing the light on each of the grid points to be exposed, so that an exact time period required for the exposure is spent therefor. In this way, a less time period than that required by the conventional one is spent for the exposure, so that the exposure can be performed speedy.

In other words, a plotting device characterizing a lightweight, lower-profile, lower-cost, and high-speed operation with durability may be realized by utilizing the beam generator 60.

Further, in the embodiment described above, the hologram layer is composed of portions 2a, 2b, 2c, 2d, and so on (element regions), and brightness of portions in the luminescent layer 4 corresponding to each of the element regions is determined correspondingly to the hologram pattern of the condensing lens while illuminating the portions in the luminescent layer 4 in the predetermined brightness.

In this way, a plotting device capable of using a variety of hologram patterns of a condensing lens can be manufactured by just using one single beam generator 60 by carrying out the following steps: 1) forming the element regions in a simple shape used various purposes, and 2) correspondingly determining brightness of the portions in the luminescent layer 4 corresponding to each of the element regions to the hologram pattern of the condensing lens thus selected. As a consequence, the focal point can be moved flexibly on a two-dimensional basis in the former example.

In addition, pluralities of the element regions are substantially disposed in a matrix manner in this embodiment. As a result of forming the beam generator in that way, a plotting device capable of using more variety of hologram patterns of the condensing lens can be manufactured by just using one single beam generator 60 by utilizing the element regions disposed in a matrix manner which can be applied in more wide variety purposes. Consequently, the focal point can further be moved flexibly on a two-dimensional basis in the former example.

Further, in the embodiment described above, information containing light intensity of the holograms is reproduced in accordance with brightness of the portions in the luminescent layer 4 where corresponding to the element regions. In this case, information containing phase of the holograms may be reproduced in accordance with positions of the element regions corresponding to the portions under an illumination-state in the luminescent layer 4. In this way, the holograms can be reproduced by varying the brightness of the portions corresponding to the element regions in the luminescent layer 4.

In addition, brightness of the portions in the luminescent layer 4 corresponding to the element regions is respectively controlled by adjusting current values flowing through the portions in the luminescent layer 4 corresponding to each of the element regions in this embodiment. In this way, information containing light intensity of the holograms can easily be reproduced by just adjusting the current values. Consequently, reproduction of the holograms can easily be performed.

Further, the portions in the luminescent layer 4 corresponding to the element regions are controlled so as to turn into an illumination-state corresponding to the determined brightness substantially at the same time. In this way, reproduction of the holograms can be performed with certainty.

Still further, the portions in the luminescent layer 4 corresponding to the element regions are capable of maintaining their illumination-state, and the corresponding portions under a row basis of the matrix are controlled so as to sequentially turn into the illumination-state corresponding to the determined brightness and to maintain the illumination-state in the above-described embodiment.

In this way, the portions in the luminescent layer 4 corresponding to the element regions are simultaneously turned into an illumination-state corresponding to the determined brightness at the end of scanning for all the lines by sequentially scanning the portions in the luminescent layer 4 corresponding to the element regions under the row basis. Consequently, reproduction of the holograms can easily be performed with certainty.

Yet further, the plotting device described earlier is a plotting device using the beam generator 60 and is characterized in that, a pattern is plotted with beams corresponding to the pattern to be plotted which are generated in sequential manner. In this way, a plotting device characterizing lightweight, lower-profile, lower-cost, and high-speed operation with durability may be realized.

Further, the TFT circuits 64a, 64b, and so on for respectively storing current values flowing through the luminescent layer corresponding to each of the element regions are provided in the embodiment described earlier. In this way, illumination-state of each portion corresponding to each element region can be maintained by just storing the current values. Consequently, simultaneous illumination corresponding to the determined brightness of the portions in the luminescent layer 4 corresponding to the element region can further be carried out easily.

Figure 43:
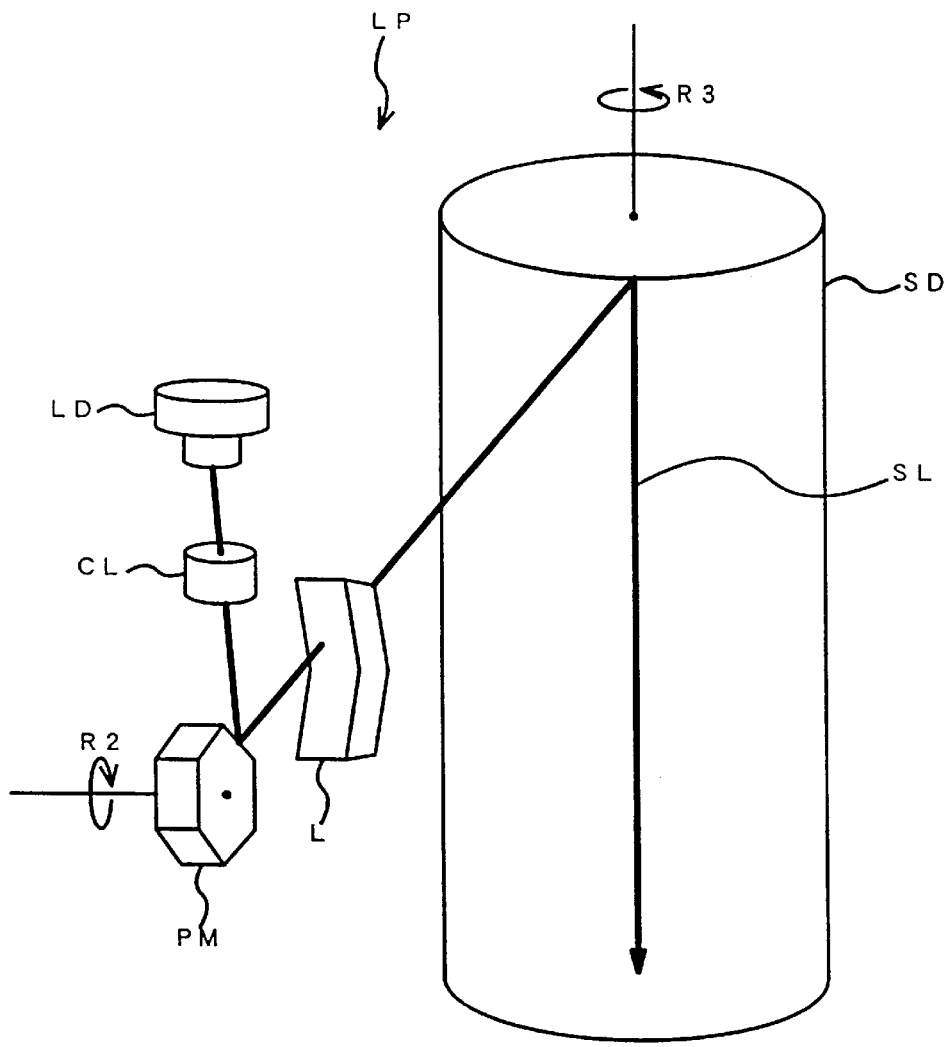
FIG. 43 is a conceptual view for describing a prior art laser printer LP.

Although, the beam generator 60 capable of applying to the plotting device using a photosensitive plate SP is described in the earlier embodiment, the present invention is not limited to that. The beam generator according to the present invention may also be applied to another plotting device using a photosensitive drum SD depicted in FIG. 43 instead of the photosensitive plate SP.

Figure 25:
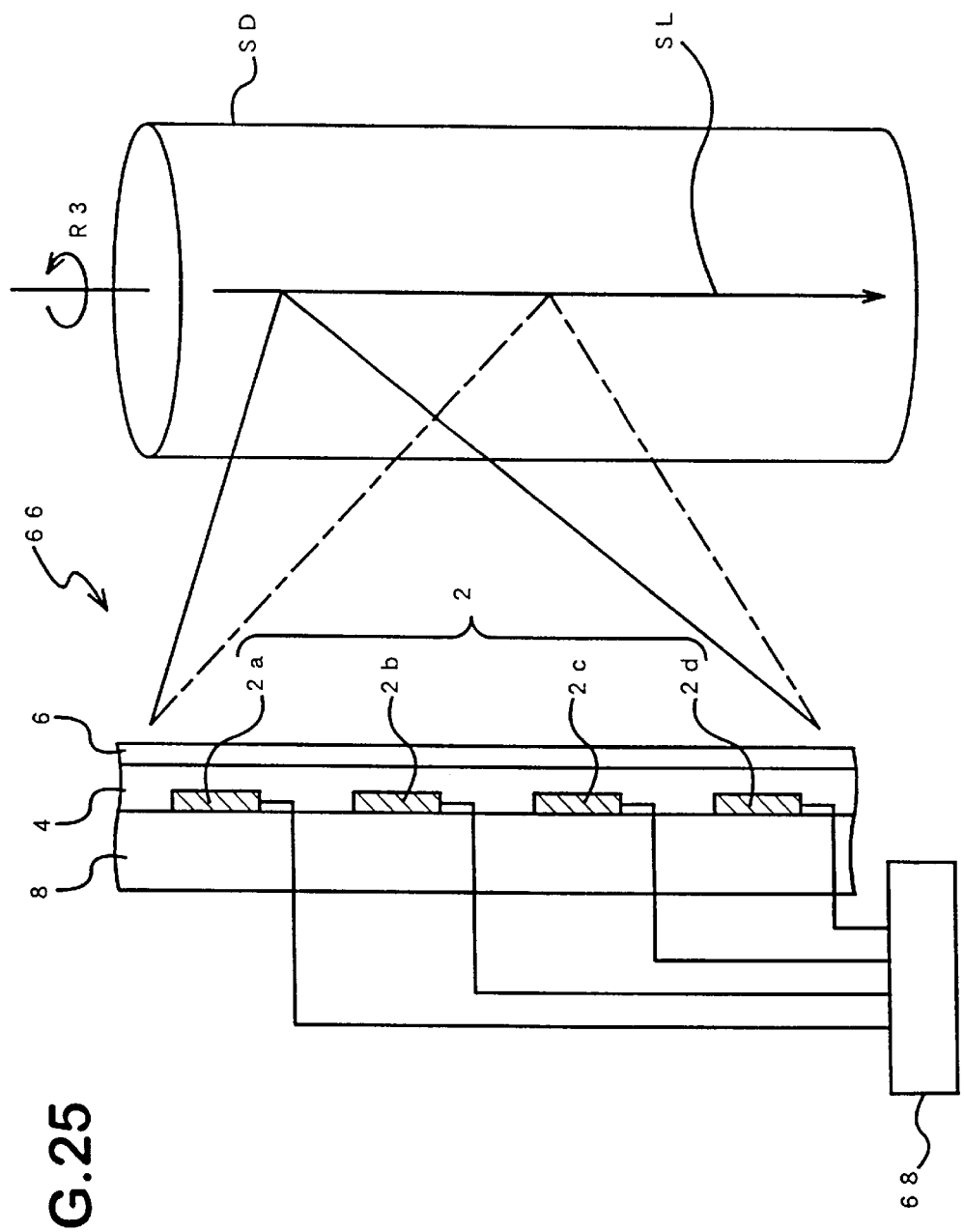
FIG. 25 is a sectional view for describing the structure of another beam generator 66 according to another embodiment of the present invention.

FIG. 25 is a sectional view for describing the structure of another beam generator 66 according to another embodiment of the present invention. The structure of the beam generator 66 is almost the same to that of the beam generator 60 shown in FIG. 20. Although, the focal point of the light is moved on a two-dimensional basis in the beam generator 60, the focal point of the emitted light is moved only on one-dimensional basis in the beam generator 66.

In other words, the hologram patterns designed so as to locate the focal point of the emitted light on any desired point of grid points GR on the photosensitive plate SP are prepared as hologram patterns of the condensing lens in the beam generator 60 depicted in FIG. 20. However, hologram patterns designed so as to locate the focal point of the emitted light on any desired point of a scanning line SL defined on the photosensitive drum SD are prepared as hologram patterns of the condensing lens in the beam generator 66 shown in FIG. 25.

In this way, light focused with the condensing lens may be directed to any desired point of the scanning line SL by generating the light after selecting the hologram pattern in an appropriate manner.

In this case, the light can be directed to any desired point on the drum SD by rotating the drum SD in direction shown as R3.

As a consequence, electric charges on the drum SD corresponding to the points P (2, 2) through P (11, 3) (see FIG. 24) composing the character "F" can be eliminated.

Thereafter, toner is attracted onto a certain area of the photosensitive drum SD in accordance with the presence of electric charges thereon, so that the character "F" may be printed on a printing paper and the like.

Although, the maximum width of each element region may be in a range of 10 nano-meters through 100 nano-meters in the embodiments described earlier, the maximum width of the element regions may also be defined either of a range less than 10 nano-meters or greater than 100 nanometers.

The surface light-emitting devices composed of a plurality of element regions disposed in a matrix manner and including TFT circuits are exampled in the embodiments described above. The present invention is not limited to the surface light-emitting device including the TFT circuits. In addition, the present invention is not limited to the surface light-emitting devices composed of a plurality of element regions disposed in a matrix manner.

Still further, information containing light intensity of the holograms is reproduced in accordance with the brightness of the portions corresponding to the element regions in the devices described in the above. The information may be reproduced by the number of the element regions illuminating light under the condition that the portions corresponding to the element regions are made to certain brightness.

Yet further, the portions corresponding to the element regions are controlled so as to sequentially turn into the illumination-state corresponding to the determined brightness and to maintain the illumination-state in the embodiments described earlier. The corresponding portions can be controlled so as to turn into an illumination-state corresponding to the determined brightness substantially at the same time.

Although, the holograms are reproduced by using only a part located periphery of the interference fringes in the embodiment described above, the holograms can also be reproduced by using other part of the fringes.

The structure of the surface light-emitting device applicable to the present invention is not limited to that depicted in FIG. 20. For example, the surface light-emitting devices having the structures shown in FIGS. 5A through 6B, and a surface light-emitting device having another structure depicted in FIG. 21 may also be applied to the present invention.

In the surface light-emitting devices shown in FIGS. 5A through 6B, the hologram layer is composed either of the anode 6 or the cathode 2. In this way, the element regions can be formed easily and appropriately because formation of a certain kind of electrodes such as the anode 6 or the cathode 2 is relatively easier than others.

Figure 21:
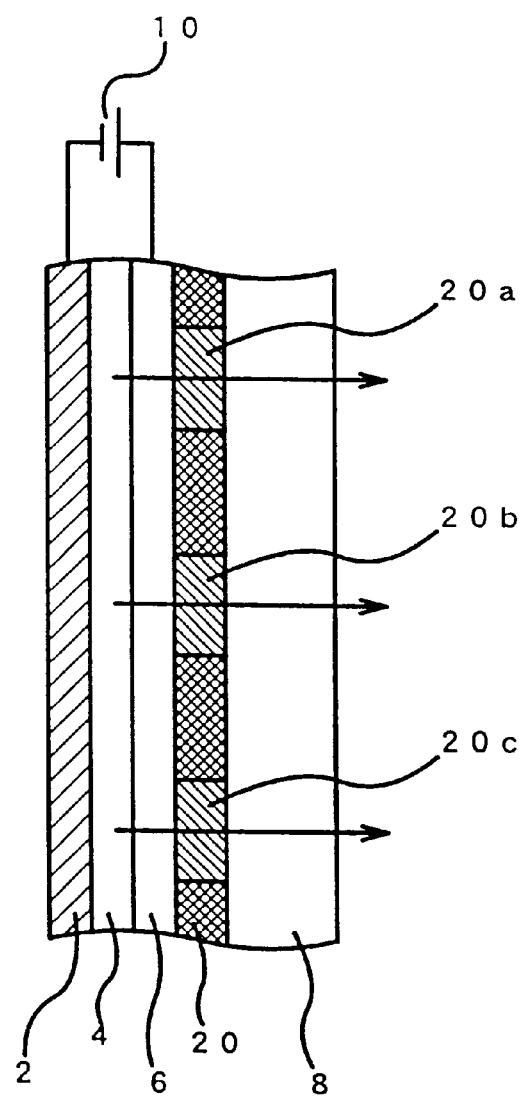
FIG. 21 is a sectional view showing an example of the structure of another surface light-emitting device applicable to the present invention.

In the surface light-emitting device depicted in FIG. 21, a shielding layer 20 forming the hologram layer is provided at a position outside of the luminescent layer 4, and the light from the luminescent layer 4 is emitted through the shielding layer 20.

In this way, the light corresponding to the shape of the element regions can be emitted by passing the emitted light through the shielding layer 20 used as a mask. Material(s) for forming the shielding layer 20 may be selected from a wide variety of materials capable of easily forming the layer because not much restriction is existed for the materials of the layer. Consequently, the element regions can be formed easily and appropriately.

There is no specific restriction on the material(s) of the shielding layer 20, so that liquid crystal or similar material(s) may be used therefor. In the case of using liquid crystal for the shielding layer, the orientation of molecular should be conducted for each of portions 20a, 20b, 20c and so on of the layer 20 so as to correspond to the hologram pattern.

The structure of the surface light-emitting device shown in FIG. 21 is characterized in that the anode 6 is formed as a transparent electrode layer while providing the shielding layer 20 at a position outside of the anode 6.

In this manner, the entire portion of the luminescent layer 4 illuminates by applying a voltage between the anode 6 and the cathode 2, so that a part of the resulting light can be emitted by using the shielding layer 20 forming the hologram layer as a mask. Consequently, light reproduced with high fidelity to the patterns of interference fringes may be obtained.

In the surface light-emitting device depicted in FIG. 21, a glass substrate 8 having transparency is disposed at a position outside of the shielding layer 20, and the light from the luminescent layer 4 is emitted through the anode 6, the shielding layer 20 and the glass substrate 8.

In this way, the shielding layer 8 forming the hologram layer can be formed on the glass substrate 8 after preparing the glass substrate 8 having transparency. Consequently, the element regions can be formed easily and appropriately.

Although, more than one pattern of interference fringes are prepared and light corresponding to one of patterns selected is emitted through the predetermined optical path in the embodiments described earlier, the present invention may be applicable to a surface light-emitting device preparing just one pattern of interference fringes.

All the descriptions in the chapters described earlier are applied to this chapter unless otherwise they are not clearly applicable to this chapter. For example, the descriptions on materials of the luminescent layer 4, the anode 6 and that of the cathode 2, each composing the surface light-emitting devices, and the descriptions on stacked layer structure of the devices referring to FIGS. 2 through 6, FIGS. 9 through 13, and FIG. 17 may also be applicable to this chapter.

Chapter 5

Figure 26:
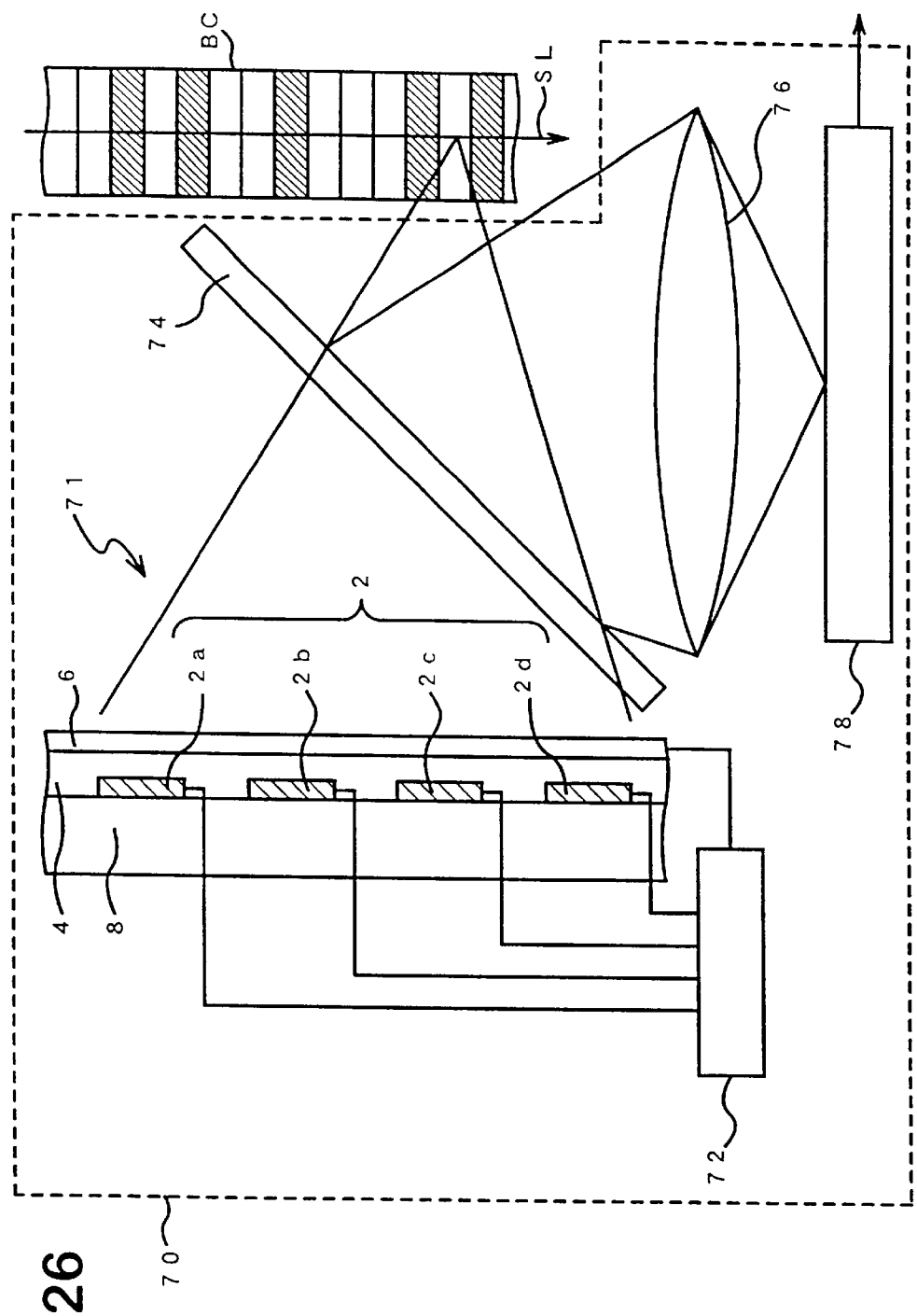
FIG. 26 is a view for describing the structure of a barcode reader 70 according to another embodiment of the present invention.

Subsequently, FIG. 26 is a view for describing the structure of a barcode reader 70 (light scanning and reading device) according to another embodiment of the present invention. The barcode reader 70 comprises a beam generator 71, a half-mirror 74, a lens 76, and a detector 78.

The beam generator 71 in the reader, has almost the same structure to that of the beam generator 60 described earlier (see FIG. 20), patterns of holograms of a condensing lens forming an optical element are prepared as the patterns of interference fringes of holograms.

In the beam generator 71, however, has a hologram pattern by which the focal point of the light emitted from the beam generator 71 is located on any of points of a scanning line SL defined on bar codes BC shown in FIG. 26 unlike to the earlier described beam generator 60 having a hologram pattern by which the focal point of the light emitted therefrom is located on any desired point of grid points GR defined on a photosensitive plate SP included in the device depicted in FIG. 20.

In this way, the light thus focused can be sequentially directed to the points on the scanning line SL defined on the bar codes BC along with a predetermined scanning direction by selecting appropriate hologram patterns of the condensing lens in accordance with the function of a control part 72 while emitting the light.

The structure of the beam generator 71 except for the control part 72 is exactly the same to that of the beam generator 60 shown in FIG. 20.

Subsequently, the operation of the barcode reader 70 will be described hereunder. As described above, all the pluralities of the hologram pattern of the condensing lens are patterns by which the focal point of the light emitted from the beam generator 71 is located on any of points of a scanning line SL defined on bar codes BC shown in FIG. 26.

The control part 72 depicted FIG. 26 controls other components so as to sequentially direct the light focused to the points on the scanning line SL defined on the bar codes BC along with the scanning direction. In other words, a part of the light emitted from the beam generator 71 is focused to the points on the scanning line SL defined on the bar codes BC sequentially as a result of passing through the half-mirror 74.

A part of the light reflected by the barcodes BC reaches to the detector 78 as a result of being focused with the lens 76 after reflecting the reflected light with the half-mirror 74. The data recorded on the barcodes BC are read out with the detector 78 by detecting the amount of light detected thereby sequentially.

Figure 27:
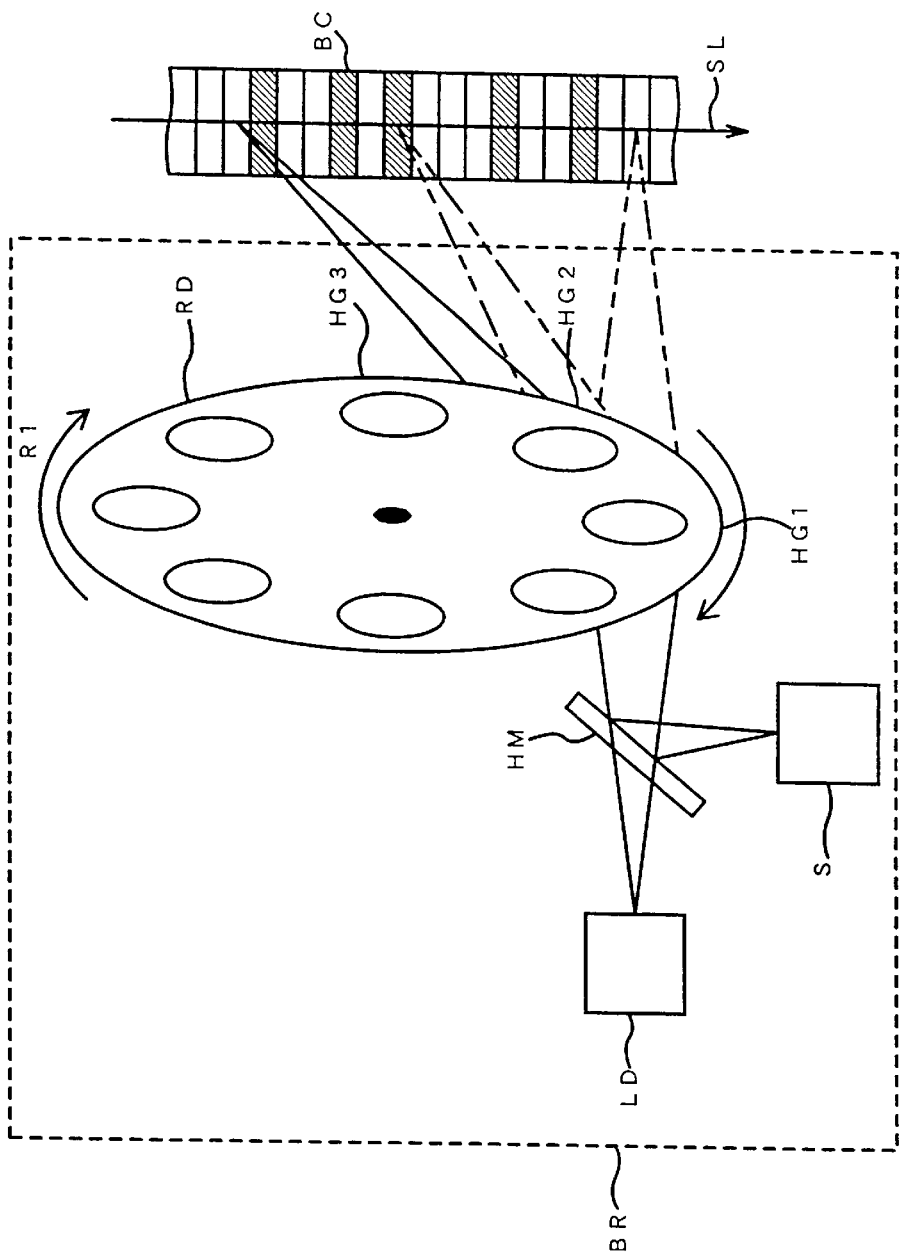
FIG. 27 is a conceptual view for describing an example of a prior art barcode reader BR.

For the record purpose, a conceptual view for describing an example of a prior art barcode reader BR is shown in FIG. 27. The prior art barcode reader BR comprises a laser diode LD, a half-mirror HM, a rotary plate RD, and a detector S. A plurality of holograms HG1, HG2 and so on are installed on the same circumference of the plate RD. Further, the reader is designed to rotate the plate RD in a direction RI.

All the holograms are formed in accordance with the hologram pattern of a condensing lens. The reader is designed to focus the lights passing through the holograms HG1, HG2 and so on, on the scanning line SL defined on the bar codes BC shown in FIG. 27 sequentially with a predetermined scanning direction when the lights emitted from the laser diode LD respectively pass through the holograms in a sequence of the holograms HG1, HG2 and so on.

In other words, the laser beams emitted from the laser diode LD and then passing through the half-mirror HM are respectively focused on the points of the scanning line SL defined on the barcode BC through the holograms HG1, HG2 and so on installed on the plate RD in a sequential manner.

A part of the laser beams reflected by the barcodes BC return to the half-mirror HM via the holograms HG1, HG2 and so on. The lights thus returned travel to the detector S as a result of the reflection with the half-mirror HM. The code printed as the barcode BC is read out with the detector S by detecting the amount of light detected thereby.

The prior art barcode reader, however, has the following problems to solve. The plate RD installing the hologram HG1, HG2 and so on is rotated mechanically in the barcode reader BR. It is, therefore, neither possible to operate the reader at high-speed nor to assure its durability. To make the matter worse, it is hard to make the reader compact and to manufacture it with a low manufacturing cost.

The barcode reader 70 shown in FIG. 26 is a barcode reader which solve the above-mentioned problems as well as realizing the following features such as lightweight, compact-profile, reasonable-cost highly durable, yet capable of operating at a high speed.

Beams are moved along with the scanning line SL by sequentially generating the beams, the focal point of which is located on any desired point of the scanning line SL without carrying out mechanical movement of the components in the barcode reader 70 depicted in FIG. 26. In this way, a lightweight, compact-profile, low-cost barcode reader capable of operating at a high-speed with durability can be realized.

Although, the barcode reader in which just one scanning line SL being defined has been described in this embodiment, the present invention may be applied to a barcode reader including more than one scanning lines SL, the scanning lines SL, for example, three lines SL being separately defined at 120 degree with one another. In this case, the barcode reader sequentially scans these scanning lines SL according to the function of the control part 72 depicted FIG. 26.

Figure 28:
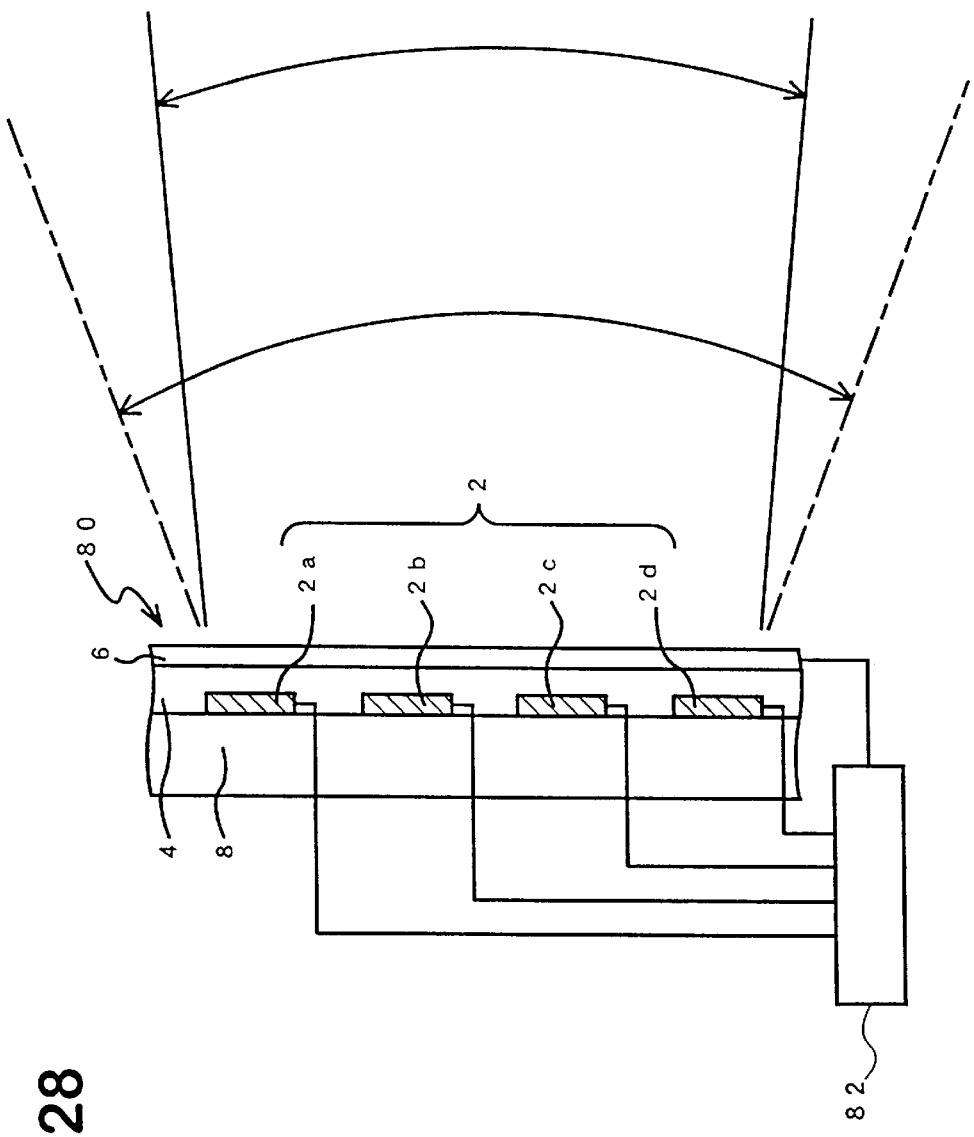
FIG. 28 is a sectional view for describing the structure of another beam generator 80 according to another embodiment of the present invention.

FIG. 28 is a sectional view for describing the structure of another beam generator 80 forming an optical-input/output device using the surface light-emitting device according to another embodiment of the present invention. The beam generator 80, has almost the same structure to that of the beam generator 60 described earlier (see FIG. 20), and patterns of holograms of a lens forming an optical element are prepared as the patterns of interference fringes of holograms.

In the beam generator 80, however, has hologram patterns by which the light emitted from the beam generator 80 has different radiation degree unlike to the earlier described beam generator 60 having a hologram pattern by which the focal point of the light emitted therefrom is located on any desired point of the grid points GR defined on a photosensitive plate SP included in the device depicted in FIG. 20.

Upon selecting a desired beam with a beam-selecting switch (not shown), a control part 82 performs a series operation as the followings; 1) selecting a hologram pattern appropriates for the desired beam and then 2) controlling so as to emit light. In this way, beams having different radiation degrees can be obtained depending upon its purpose with the beam generator 80 alone.

The structure of the beam generator 80 except for the control part 82 that is corresponding to a surface light-emitting device is exactly the same to that of the beam generator 60 shown in FIG. 20.

The usage of the beam generator 80 is not limited to any particular purposes, it may be applicable to the followings, for example, laser pointers, signals for an automobile and other vehicles, flashlights and the like.

The surface light-emitting devices composed of a plurality of element regions disposed in a matrix manner and including TFT circuits are exampled in the embodiments described earlier. The present invention is neither limited to the surface light-emitting device including the TFT circuits nor to the surface light-emitting device composed of a plurality of element regions disposed in a matrix manner.

Figure 29:
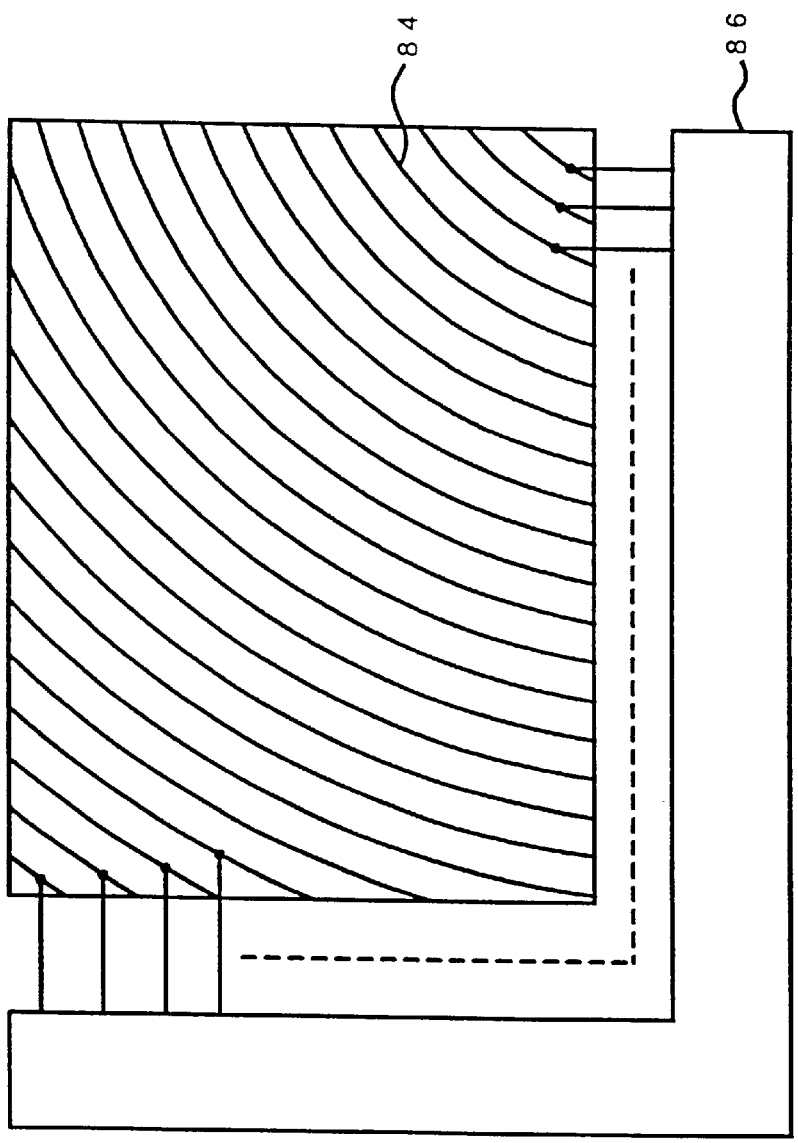
FIG. 29 is a view showing an example of a surface light-emitting device of another embodiment of the present invention.

For example, a surface light-emitting device shown in FIG. 29 can be used for the surface light-emitting device for the beam generator 80 depicted in FIG. 28. The surface light-emitting device shown in FIG. 29 comprises a plurality of element regions 84 (corresponding to the portions 2a, 2b, 2c, 2d and so on shown in FIG. 28) substantially disposed in a concentric manner unlike to the element regions being allocated in matrix manner (the portions 2a, 2b, 2c, 2d and so on depicted in FIG. 22) shown in FIG. 22.

In this embodiment, each of the element regions 84 depicted in FIG. 29 is formed in a range of 10 nano-meters through 100 nano-meters in width. Further, information containing light intensity of the holograms is reproduced in accordance with brightness of the portions corresponding to the regions 84 by forming the width of the regions 84 and its distance in fixed manner in this embodiment.

Figure 30A:
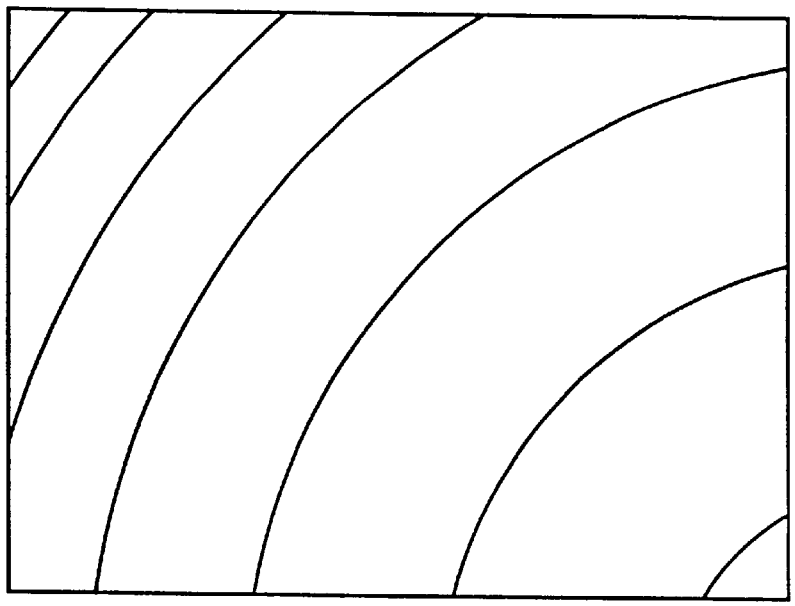
FIGS. 30A and 30B are views illustrating patterns of hologram obtained by the surface light-emitting device shown in FIG. 29.
Figure 30B:
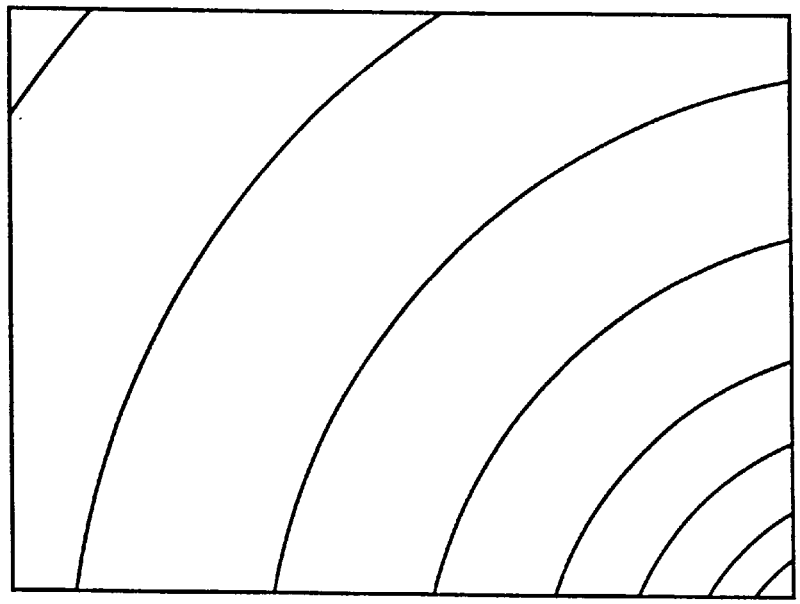

For example, a control part 86 controls which one of the element regions 84 depicted in FIG. 29 should be turn on and which one of the element regions 84 should be turn off. By changing the element regions 84 illuminating light, hologram patterns for plurality kinds of lens can be realized. In this case, beams having different radiation degrees can be obtained with the hologram patterns shown in FIGS. 30A and 30B.

As described above, the beam generator 80 in this embodiment is composed of the surface light-emitting device including a plurality of the element patterns 84 disposed in a concentric manner. In this way, beams having various modes and different focal points can be realized by using just one surface light-emitting device as a result of correspondingly determining brightness of the portions corresponding to each of the element regions 84 disposed in a concentric manner depending upon the interference fringes of the selected hologram.

Further, the surface light-emitting device in this embodiment, each of the element regions 84 is formed in a range of 10 nano-meters through 100 nano-meters in width. In this way, the element regions 84 each having a very narrow in width can be realized. Although, the directivity of lights after passing through the hologram is largely influenced by both the conditions of the lights before passing through the hologram and the width of the element regions 84 composing the hologram layer, the directivity receives not much influence of the conditions of the lights before passing therethrough if the width of the element regions 84 is formed in narrower in width.

It is considered that the light directivity can be controlled regardless of the conditions of the lights before passing through the hologram layer by forming the hologram layer with the element regions 84 having a very narrow width. In other words, a hologram layer much suitable for reproduction of holograms may be realized.

Further, the surface light-emitting device in this embodiment, the information containing light intensity of the holograms is reproduced in accordance with brightness of the portions corresponding to the regions 84 while forming the width of the regions 84 in fixed manner. As a consequence, the regions 84 formed in a fixed width can easily form a hologram layer capable of using various purposes.

In this case, information containing phase of the holograms may be reproduced in accordance with positions of the element regions corresponding to the portions under an illumination-state in the element regions 84. In this way, the holograms can be reproduced by varying the brightness of the element regions 84.

Although, the surface light-emitting device comprising a plurality of the element regions 84 disposed in a concentric manner is described in the embodiment described above, a surface light-emitting device comprising a plurality of the element regions 84 each having a part substantially formed in circular arc shape may be formed. Here, the element regions 84 each having a part substantially circular arc shape includes a concept in which the element region 84 formed in an oval shaped is included therein. By forming the element regions 84 in that shape, beams not only having different focal points but also capable of directing the beams in different directions having various modes can be realized.

Alternatively, each of the element regions 84 is formed in a range of 10 nano-meters through 100 nano-meters in width in the embodiment described above, the width of the light-pattern may be formed in less than 10 nano-meters or more than 100 nano-meters in width.

In the embodiment described above, though the width of each of the element regions 84 is formed in fixed manner, the width of each region 84 may be formed differently.

Although, the portions corresponding to the element regions are controlled so as to turn into an illumination-state corresponding to the determined brightness substantially at the same time in the embodiments described earlier, the portions corresponding to the element regions may be controlled so as to turn into the illumination-state corresponding to the determined brightness not substantially at the same time.

Further, a plurality of element regions capable of using various purposes are used for the hologram layer in the embodiments described earlier, the hologram layer may not be formed with such regions capable of using various purposes. The hologram layer also may be formed with dedicated pattern regions correspondingly formed with the patterns of the interference fringes corresponding to predetermined beams. In such a case, a desired beam can be obtained by illuminating one of the dedicated pattern regions.

The beam generators are applied to the following items such as plotting devices, barcode-readers, light pointers, turn signals for an automobile and other vehicles, flash lights in the embodiments described earlier. The usage of the beam generator is not limited to these devices, it can also applicable to an optical-pickup device and the like, for example.

All the description in the earlier chapters may be applied to this chapter unless otherwise they are not clearly applicable to this chapter. For example, the description on materials of the luminescent layer 4, the anode vice 6 and that of the cathode 2, each composing the surface light-emitting device, and the description on layered structure of the device with FIGS. 2 through 6, FIGS. 9 through 13, FIG. 17 and FIG. 21 through 23 may also be applicable to this chapter.

Chapter 6

Figure 31:
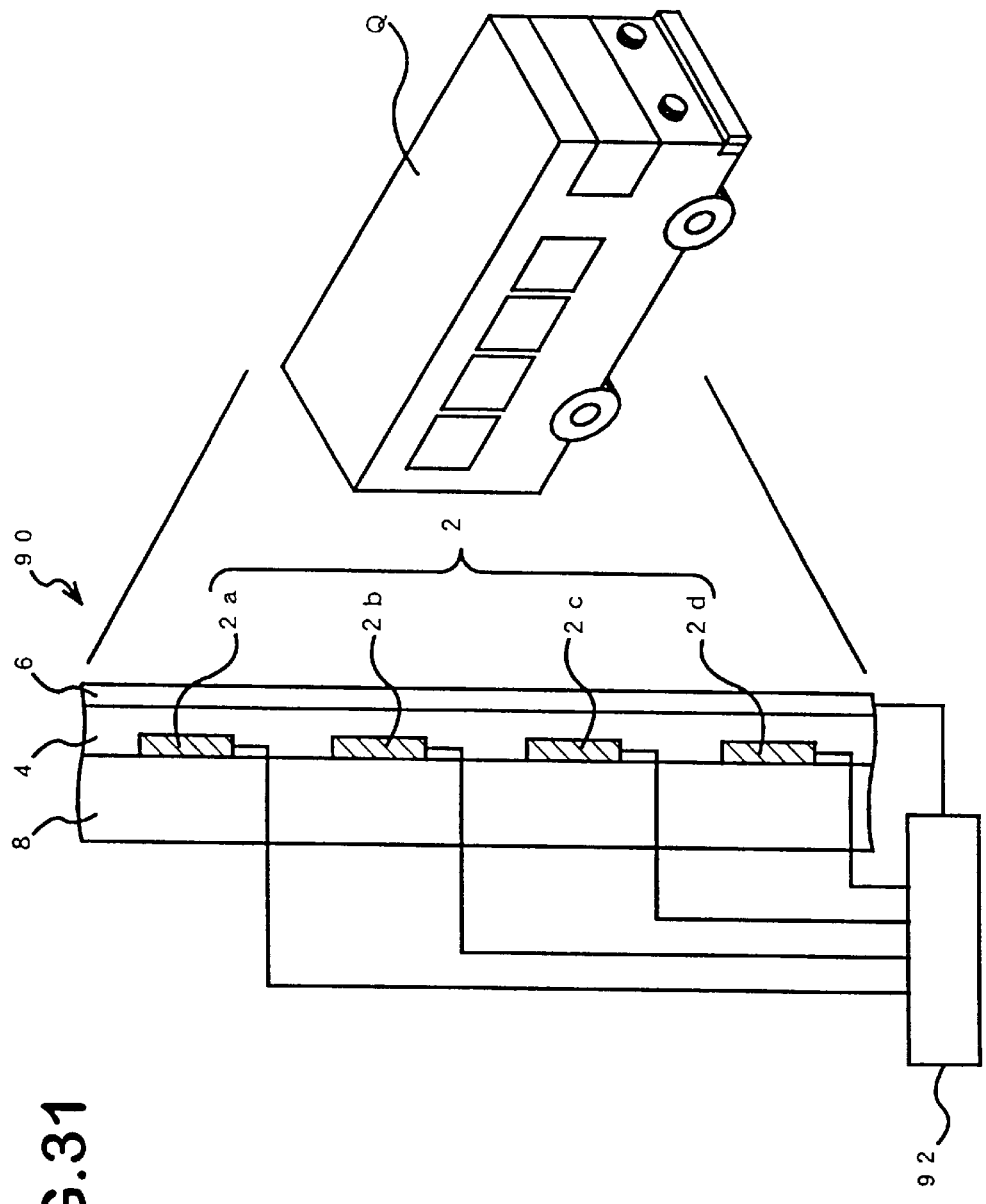
FIG. 31 is a sectional view for describing the structure of an image display device 90 according to another embodiment of the present invention.

FIG. 31 is a sectional view for describing the structure of an image display device 90 using a surface light-emitting device according to another embodiment of the present invention. The image display device 90 comprises stacked-layers formed of a cathode 2 acting as an electrode layer, a luminescent layer 4 and an anode 6 forming another electrode layer in that order, the stacked-layers being located adjacent to a glass substrate 8 forming a supporting body.

The cathode 2 is formed in a shape substantially corresponding to the patterns of interference fringes of holograms. The cathode 2 forms a hologram layer. In other words, arrangement of portions 2a, 2b, 2c, 2d and so on composing the cathode 2 correspond to the patterns of interference fringes of holograms.

Each of the portions 2a, 2b, 2c, 2d, and so on composing the cathode 2, and the anode 6 are connected to a control part 92. A DC voltage is applied to between the portions 2a, 2b, 2c, 2d, and so on, and the anode 6 in accordance with the control of the control part 92. All the components of the image display device 90 except for the control part 92 form a surface light-emitting device. It is assumed that a three-dimensional object (for example, a miniature of a bus) is used as the patterns of interference fringes of holograms. In other words, the structure of the image display device 90 except for using the hologram pattern of the three-dimensional object is almost the same to that of the beam generator 40 shown in FIG. 14, for example.

Subsequently, the operation of the image display device 90 will be described. Electric currents, each having a predetermined value flow respectively through the portions 2a, 2b, 2c, 2d, and so on composing the cathode 2. In this way, portions between the portions 2a, 2b, 2c, 2d, and so on composing the cathode 2 and the anode 6 illuminate light out of the luminescent layer 4.

As described earlier, allocation of the portions 2a, 2b, 2c, 2d, and so on corresponds to that of the interference fringes of holograms of the three-dimensional object (see FIG. 16), and the current values flowing through the portions 2a, 2b, 2c, 2d, and so on respectively correspond to the information containing light intensity of the holograms of the three-dimensional object. As a consequence, the light from the luminescent layer 4 under the three-dimensional manner displays a holographic image Q corresponding to the three-dimensional object.

As described above, the cathode 2 is formed in a shape substantially corresponding to the hologram patterns of the three-dimensional object. In this way, a part of the luminescent layer 4 illuminate light correspondingly to the hologram patterns of the three-dimensional object by flowing appropriate electric currents through the cathode 2 and the anode 6.

As a consequence, the surface light-emitting device alone can play both roles as the light source and the three-dimensional hologram. Consequently, the image display device 90 can be manufactured with compact-profile and in reasonable cost by using the surface light-emitting device according to the present invention.

Although, the hologram patterns of the three-dimensional object is formed as the hologram pattern in the above embodiment, the hologram pattern is not limited to the three-dimensional hologram pattern. Hologram pattern formed under pictures, planar drawings, characters and so on can be used as the hologram pattern of this embodiment. Further, combination of those can also be used as the hologram pattern.

The image display device according to the present invention can be manufactured so as to selectively display a plurality of images such as either of static images or dynamic images such as animations. In such case, the image display device shown in FIG. 22 may be used instead of the image display device 90 depicted in FIG. 31.

In this case, the TFT circuits 64a, 64b and so on are included in the control part 92 shown in FIG. 31. The control part 92 is designed so as to provide information containing brightness corresponding to one of the selected patterns out of more than one patterns of interference fringes to the TFT circuits 64a, 64b and so on. A DC voltage is applied between each of the portions 2a, 2b, 2c, 2d and so on composing the cathode 2 and the anode 6 in accordance with the control of the control part 92. All the components of the image display device 90 except for the control part 92 form the surface light-emitting device.

Three-dimensional objects can be reproduced in dynamic manner by sequentially reproducing a variety of hologram patterns corresponding to each motion of the three-dimensional object, which is previously prepared.

In the embodiments described earlier, the hologram layer is composed of portions 2a, 2b, 2c, 2d and so on (element regions) forming the cathode 2, and brightness of the portions in the luminescent layer 4 corresponding to each of the element regions is determined correspondingly to the hologram pattern of the three-dimensional object while illuminating the portions in the luminescent layer 4 in the predetermined brightness.

In this way, a variety of holograms can be reproduced with just one image display device 90 by forming the element regions in a simple shape capable of using various purposes while determining the brightness of the portions in the luminescent layer 4 corresponding to each of the element regions correspondingly to the selected hologram pattern. As a consequence, three-dimensional objects can easily be reproduced in dynamic manner in the previous case.

Moreover, pluralities of the element regions are substantially disposed in a matrix manner in the embodiment described earlier. In this way, more variety of holograms can be reproduced with just one image display device 90 by using the element regions substantially disposed in a matrix manner capable of using various purposes. Consequently, more variety of dynamic images can be reproduced in the previous case.

Information containing light intensity of the holograms is reproduced in accordance with brightness of the portions in the luminescent layer 4 where corresponding to the element regions. In this case, information containing phase of the holograms may be reproduced in accordance with positions of the element regions corresponding to the portions under an illumination-state in the luminescent layer 4. In this way, the holograms can be reproduced by varying the brightness of the portions in the luminescent layer 4 corresponding to the element regions.

In addition, brightness of the portions in the luminescent layer 4 corresponding to the element regions is respectively controlled by adjusting current values flowing through the portions in the luminescent layer 4 corresponding to each of the element regions in this embodiment. In this way, information containing light intensity of the holograms can easily be reproduced by just adjusting the current values. Consequently, reproduction of the holograms can easily be performed.

Further, the portions in the luminescent layer 4 corresponding to the element regions are controlled so as to turn into an illumination-state corresponding to the determined brightness substantially at the same time in the embodiment described above. In this way, reproduction of the holograms can be performed with certainty.

Still further, the portions in the luminescent layer 4 corresponding to the element regions are capable of maintaining their illumination-state and the corresponding portions under a row basis of the matrix are controlled so as to sequentially turn into the illumination-state corresponding to the determined brightness and to maintain the illumination-state in the above-described embodiment.

In this way, the portions in the luminescent layer 4 corresponding to the element regions are simultaneously turned into the illumination-state corresponding to the determined brightness at the end of scanning for all the lines by sequentially scanning the portions in the luminescent layer 4 corresponding to the element regions under the row basis. Consequently, reproduction of the holograms can easily be performed with certainty.

Yet further, the TFT circuits 64a, 64b, and so on for respectively storing current values flowing through the luminescent layer corresponding to each of the element regions are provided in the embodiment described earlier. In this way, the illumination-state of each portion in the luminescent layer 4 corresponding to each element region can be maintained by just storing the current values. Consequently, simultaneous illumination of the portions in the luminescent layer 4 corresponding to the element region can further be carried out easily.

The structure of the surface light-emitting device applicable to the image display device capable of selectively displaying a plurality of images is not limited to that depicted in FIG. 31. The surface light-emitting devices have shown in FIGS. 5A through 6B can also be applied to the image display device. In addition, the surface light-emitting device depicted FIG. 32 can further be applied to such image display device.

Figure 32:
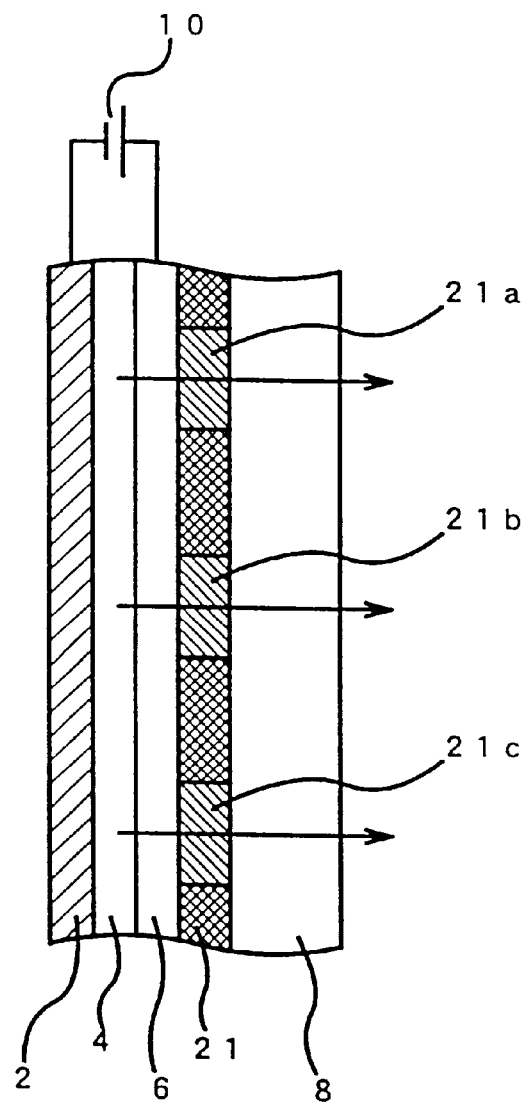
FIG. 32 is a sectional view showing an example of the structure of another surface light-emitting devices applicable to the present invention.

In the surface light-emitting device depicted in FIG. 32, a shielding layer 21 forming the hologram layer is disposed at a position outside of the luminescent layer 4 and the light from the luminescent layer 4 is emitted through the shielding layer 21.

Although, no specific limitations on the material of the shielding layer 21, for example, liquid crystal may be used therefor. In the case of using liquid crystal for the shielding layer, molecular alignment of the liquid crystal may be determined respectively to portions 21a, 21b, 21c in the shielding layer 21 in accordance with hologram patterns. The reason of carrying out such step is to utilize the feature of the liquid crystal in which light transmission vary depending upon molecular alignment thereto.

Figure 33:
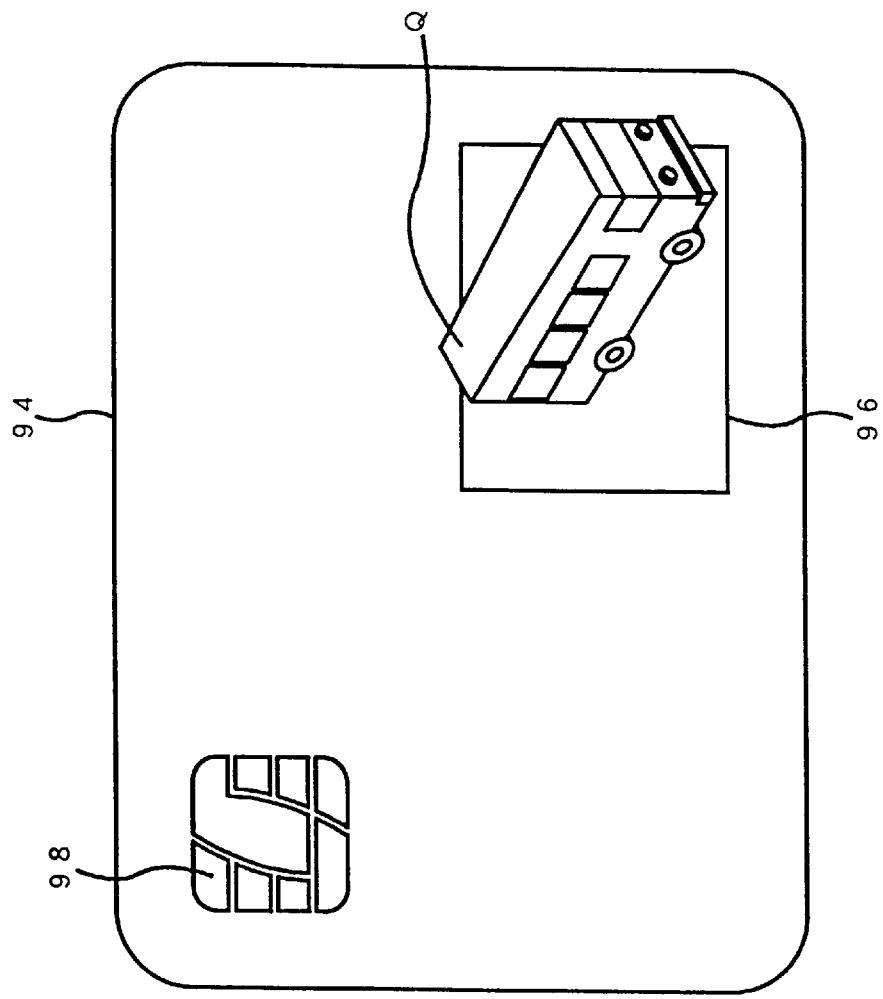
FIG. 33 is a view showing appearance of an IC card 94, an example of applying the image display device 90.

FIG. 33 is a view showing appearance of an IC card 94, an example of applying the image display device 90. In the IC card 94, a microcomputer, a memory and peripherals are installed, the card 94, for example, is used as a credit card and the like. Such IC card 94 is a contact type card and supply of its electric power and data communications are performed through a terminal 98.

The image display device 90 is installed in the IC card 94, the surface of the surface light-emitting device composing the image display device 90 is exposed from the surface of the card 94 as an image display part 96. The holographic image Q is displayed on the image display part 96 in three-dimensional manner.

In this embodiment, the IC card 94 is characterized in using the image display device 90. In this way, a lightweight, compact-profile with reasonable price IC card capable of reproducing visual information in three-dimensional manner can be realized. With the IC card 94, a higher advertising-effect and difficulties in forgery can be expected because visual information is reproduced in three-dimensional manner.

Although, the contact type IC card 94 is exampled as a card in this embodiment, the present invention may also be applied to a non-contact type IC card. The usage of the image display device according to the present invention is not limited to IC cards.

Although, the surface light-emitting devices composed of a plurality of element regions disposed in a matrix manner and including TFT circuits is exampled in the embodiment described above, the present invention can be applied to any surface light-emitting device except for the device including the TFT circuits. The present invention can further be applied to any surface light-emitting device except for the device composed of a plurality of element regions disposed in a matrix manner.

Further, information containing light intensity of the holograms is reproduced in accordance with the brightness of the portions corresponding to the element regions in the devices described in the above. The information may be reproduced by the number of the element regions illuminating light under the condition that the portions corresponding to the element regions are made to certain brightness.

Yet further, the portions corresponding to the element regions are controlled so as to sequentially turn into the illumination-state corresponding to the determined brightness and to maintain the illumination-state in the embodiments described earlier. The corresponding portions can be controlled so as to turn into an illumination-state corresponding to the determined brightness substantially at the same time.

All the description in the earlier chapters may be applied to this chapter unless otherwise they are not clearly applicable to this chapter. For example, the description on materials of the luminescent layer 4, the anode vice 6 and that of the cathode 2, each composing the surface light-emitting device, and the description on layered structure of the device with FIGS. 2 through 13, FIGS. 15 through 17, and FIGS. 22 and 23 may also be applicable to this chapter.

Chapter 7

Luminescent layers composing surface light-emitting devices are made of organic material(s) in all the chapters described earlier. Inorganic material(s) may also be used for the luminescent layer as described above. There is no specific limitation on the inorganic material(s) used for the luminescent layers, for example, a semi-conducting substance may be used. An example of using a semi-conducting substance for a luminescent layer composing a surface light-emitting device will be described hereunder.

Figure 34:
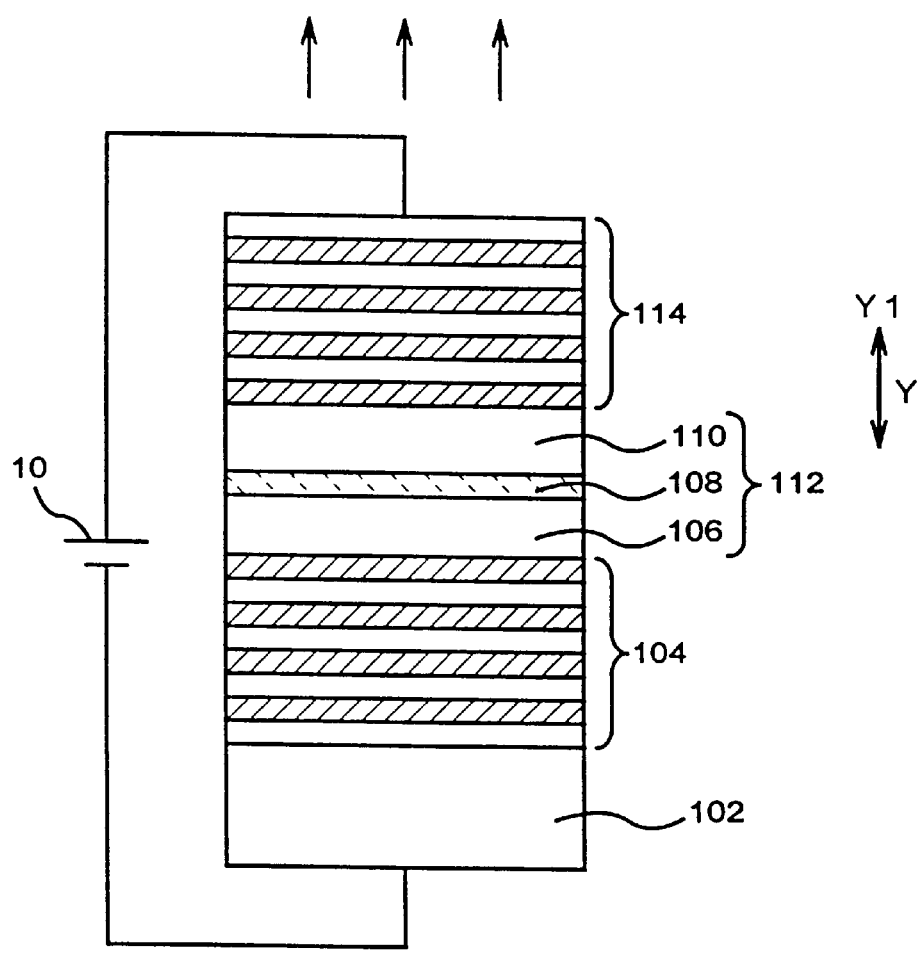
FIG. 34 is a sectional view showing the overall structure of an example of a surface-emitting laser device.

FIG. 34 is a sectional view showing the overall structure of an example of a surface-emitting laser device. The surface-emitting laser device depicted in FIG. 34 is a kind of semiconductor-laser devices in which light radiated from a luminescent layer 112 is emitted in a direction of Y1 as a laser beam after resonation of the radiated light in a direction perpendicular to the luminescent layer 112 (shown as Y in the drawing).

The laser device depicted in FIG. 34, roughly comprises stacked-layers formed of a substrate 102 made of a semi-conductor substance, a Distributed Bragg Reflector located at a lower position (hereinafter referred to as lower DBR layer) 104, the luminescent layer 112 made of a semiconductor substance, another Distributed Bragg Reflector located at an upper position (hereinafter referred to as upper DBR layer) 114 in that order.

The substrate 102 is made of a semi-conducting chemical compound, for example, an n type gallium and arsenic (Ga As).

The lower DBR layer 104, for example, also has stacked-layers in which pluralities of pairs (a total of thirty four (34) pairs in this embodiment) each including two kinds of thin films both having a different refractive index such as quarter of A thin film (thin films each having an equivalent thickness of $\lambda/4$ of wavelength of laser beam emitted from the laser, the thin films hereinafter referred to as $\lambda/4$ thin films). As for materials for forming these two $\lambda/4$ thin films, for example, a chemical compound of aluminum and arsenic (Al As), another chemical compound of aluminum, gallium and arsenic (Al Ga As) are used. In order to provide conductivity to these λ/4 thin films composing the lower DBR layer 104, n-type impurities are added to the films.

The upper DBR layer 114 also has almost the same structures to that of the lower DBR layer 104. However, P-type impurities are added to the two kinds of λ/4 thin films composing upper DBR layer 114 in order to provide conductivity thereto. A total of twenty two (22) pairs of the λ/4 thin films are included in the upper DBR layer 114 in this embodiment.

The luminescent layer 112 forming a composite semiconducting substance comprises a stacked-layer formed of an n-clad layer 106 forming a first semi-conductor layer, a Multi-Quantum Well layer (hereinafter referred to as MQW layer) 108, a p-clad layer 110 forming a second semiconductor layer in that order.

The n-clad layer 106, for example, is made of a semiconducting chemical compound of Al Ga As adding n-type (first conductive type) impurities therein. The p-clad layer 110, for example, is made of a semi-conducting chemical compound of Al Ga As adding p-type (second conductive type) impurities therein. Both the n-clad layer 106 and the p-clad layer 110 are respectively formed in a thickness of approximately 0.1 μm, for example.

The MQW layer is a semiconductor layer having double-layer structure made of Al Ga As/Ga As with no impurities. The MQW layer 108 is also referred to as an active layer and is formed in a thickness of approximately 6 nano-meters, for example.

The MQW layer 108, very thin in its thickness and situated adjacent to the boundary between the p-clad layer 110 and the n-clay layer 106 illuminates when a direct current is applied to the surface-emitting laser device having such structure by the DC power source 10. The light illuminated from the MQW layer 108 is reflected by the λ/4 thin films composing both the lower DBR layer 104 and the upper DBR layer 114, and the reflected light is resonated in the direction of Y thereby, both the lower DBR layer 104 and the upper DBR layer 114 being located at both sides of the luminescent layer 112. The resulting laser beam by the resonation is emitted in the direction of Y1 through the upper DBR layer 114.

The upper DBR layer 114 comprises a plurality of reflecting mirrors while functioning a part of an electrode for applying an electric current to the p-clad layer 110. The lower DBR layer 104 comprises a plurality of reflecting mirrors while functioning as a part of an electrode for providing a electric current to the n-clad layer 106.

Figure 35:
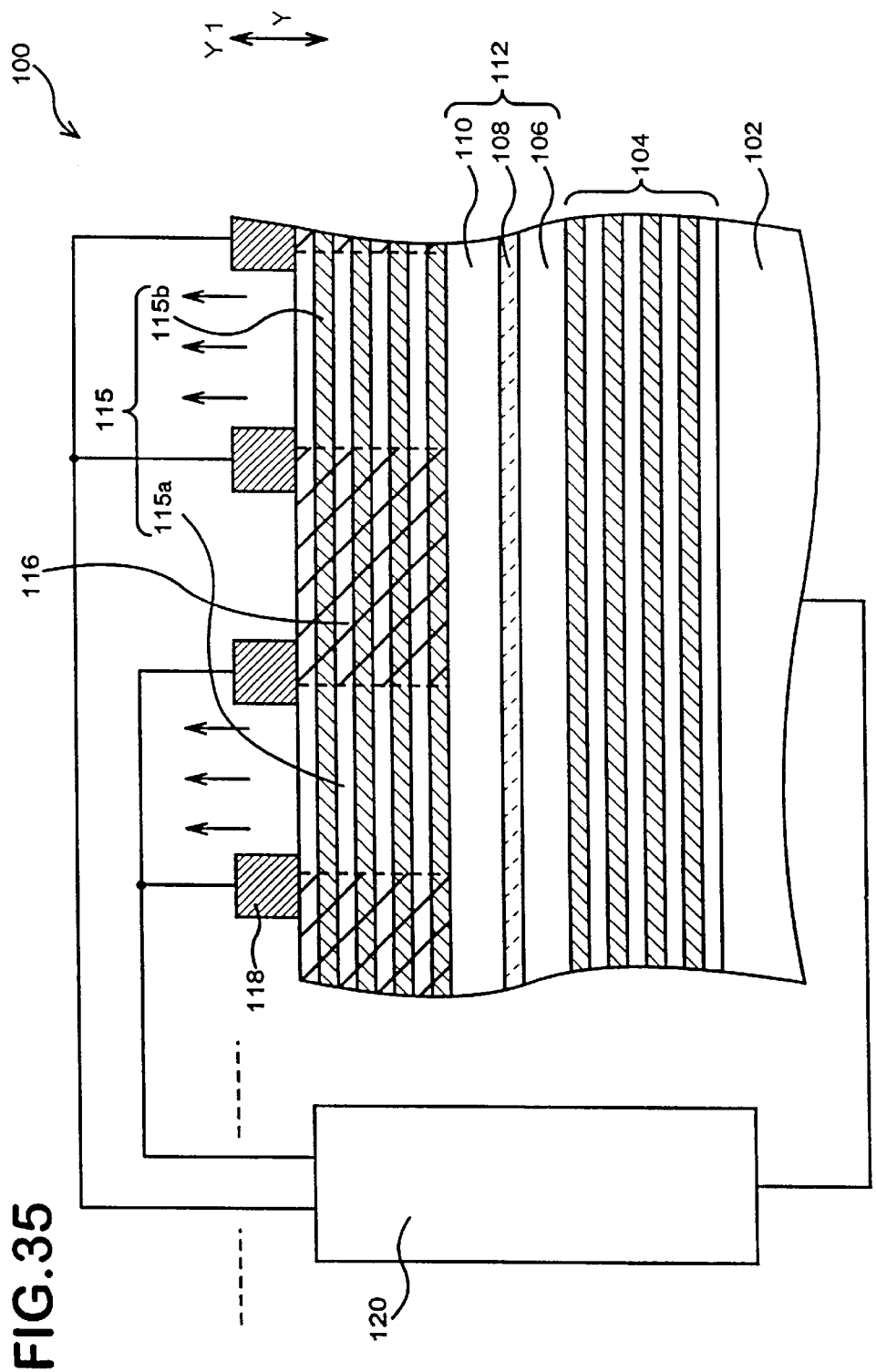
FIG. 35 is a view for describing the structure of another beam generator 100 according to far another embodiment of the present invention.

FIG. 35 is a view for describing the structure of another beam generator 100 forming an optical-input/output device using the surface light-emitting device according to far another embodiment of the present invention. The beam generator 100 uses the surface-emitting laser device depicted in FIG. 34.

In the beam generator 100, a lower DBR layer 104, a luminescent layer 112, an upper reflecting mirror portion 115 forming the hologram layer, an insulating part 116, and an aluminum wire 118 are formed on a substrate 102.

The structure of the substrate 102, the lower DBR layer 104, and the luminescent layer 112 is similar to that of these included in the surface-emitting laser device shown in FIG. 34.

The upper reflecting mirror portion 115 includes a plurality of portions 115a, 115b, and so on. The portions 115a, 115b and so on corresponds to a part of the upper DBR layer 114 shown in FIG. 34. As will be subsequently described, the insulating part 116, however, may be formed by making other part of the upper DBR layer 114 shown in FIG. 34 as an insulated part. The portions 115a, 115b, and so on respectively forms element region (element electrode).

Figure 36:
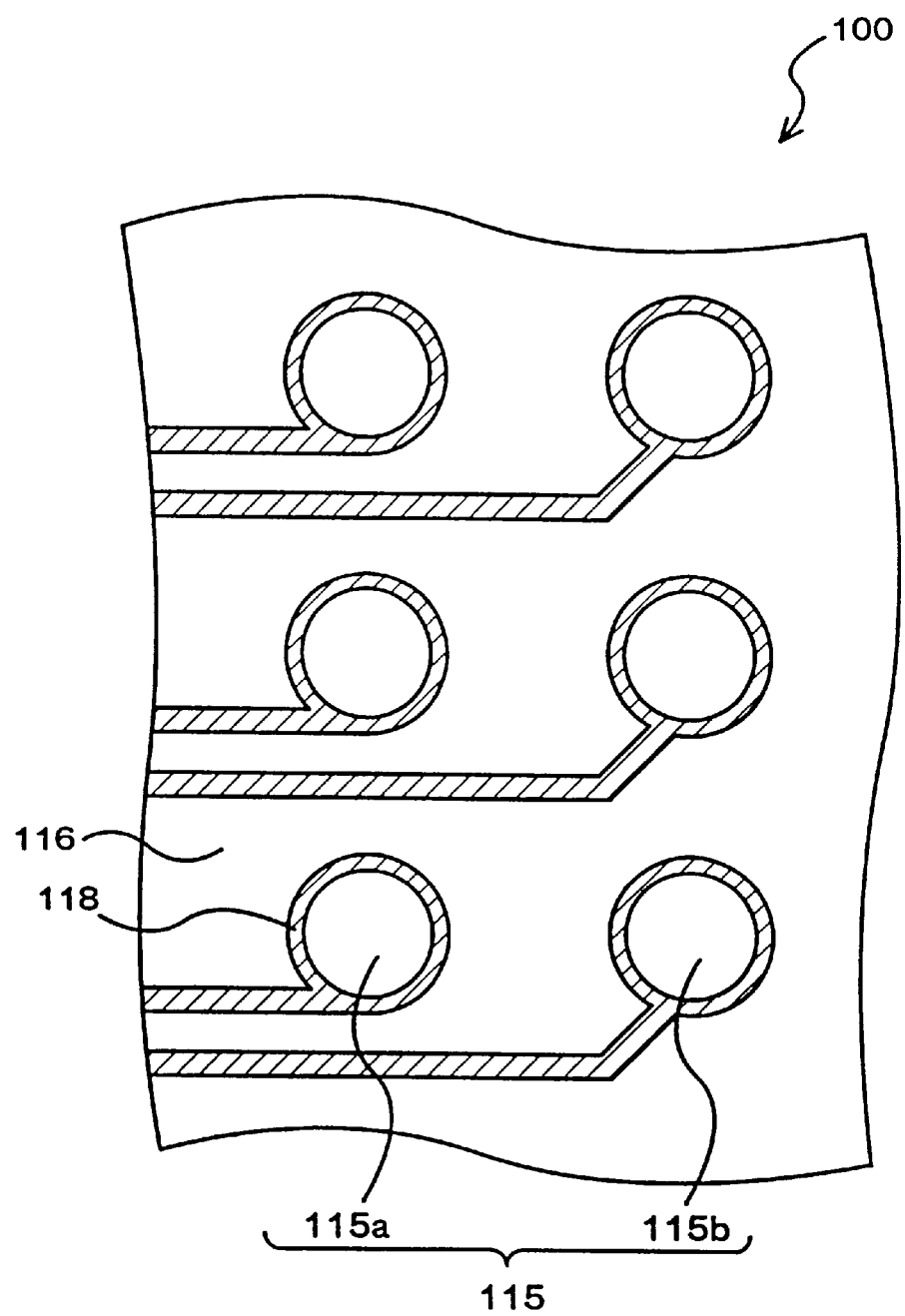
FIG. 36 is a plan view for describing the structure of the beam generator 100.

FIG. 36 is a plan view for describing the structure of the beam generator 100. As apparent form FIG. 36, all the portions 115a, 115b, and so on are formed identical in shape (in this embodiment, round shape in plane) and are allocated in matrix manner.

Among the portions 115a, 115b, and so on are insulated one another with the insulating part 116.

The aluminum wirings 118 each having doughnut shape are disposed on the boundaries between the portions 115a, 115b and so on and the insulating part 116, the boundaries being exposed from the surface. In this way, lower ends of the aluminum wirings 118 are electrically connected to upper ends located peripheries of the portions 115a, 115b and so on.

The portions 115a, 115b and so on composing the mirror portion 115 are respectively connected to a control part 120 via the wirings 118. Further, the substrate 102 is connected to control part 120 as well. A DC voltage is applied between both the portions 115a, 115b and so on composing the upper reflecting mirror portion 115 and the substrate 102 in accordance with the control of the control part 120. In other words, a laser beam is emitted in the direction Y1 from any desired portions 115a, 115b and so on in accordance with the control of the control part 120. All the components of the beam generator 100 except for the control part 120 form a surface light-emitting device.

Figure 37A:
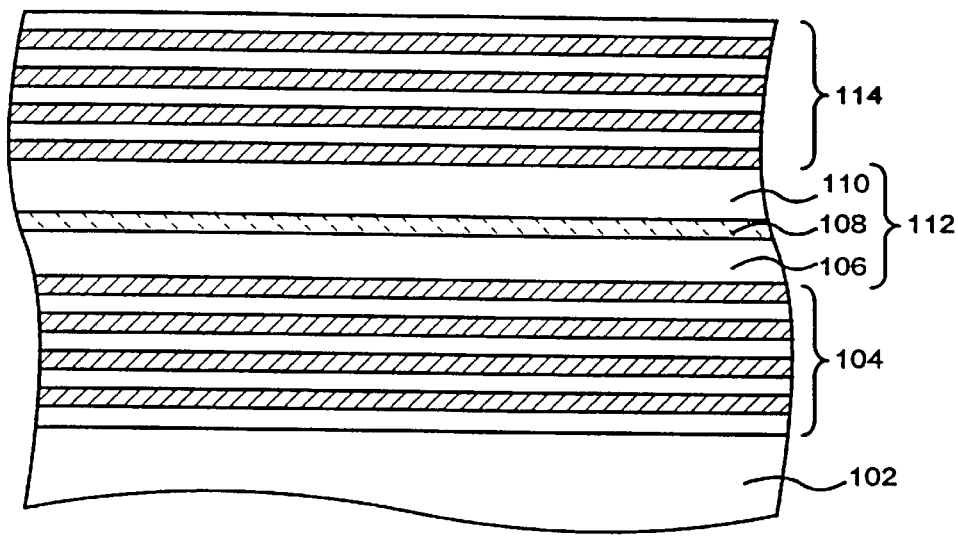
FIGS. 37A and 37B are sectional views for describing a manufacturing method of a surface light-emitting device composing the beam generator 100.

Subsequently, a manufacturing method of a surface light-emitting device included in the beam generator 100 will be described with reference to FIGS. 37A through 38B. At first, the lower DBR layer 104, the luminescent layer 112 (including the n-clad layer 106, the MQW layer 108, and the p-clad layer 110), and the upper DBR layer 114 are formed on the substrate 102 in that order with epitaxial process and the like as shown in FIG. 37A.

Figure 37B:
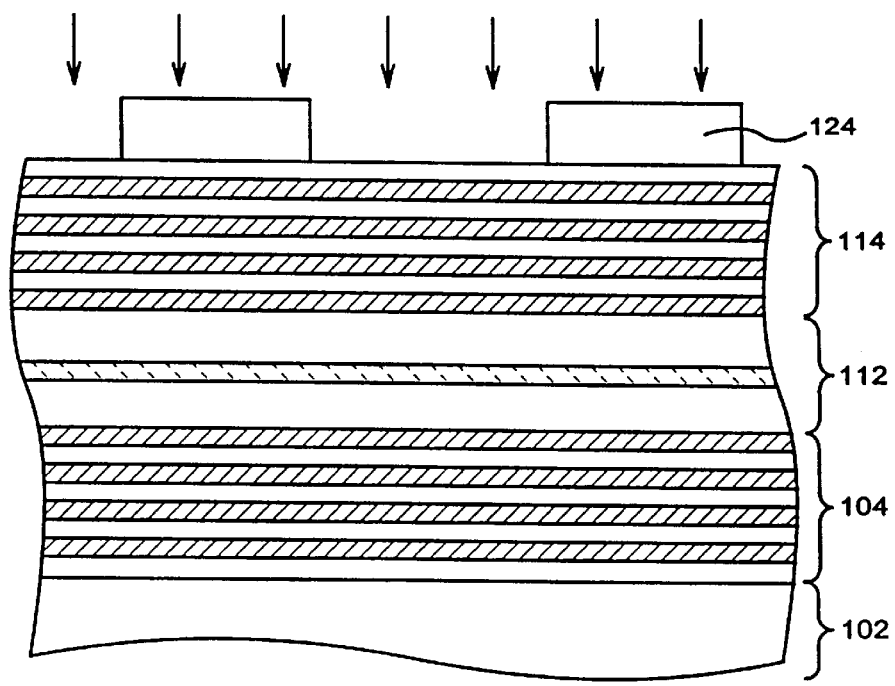

Substantially, a silicon oxidation layer 124 is formed on the upper DBR layer 114 as shown in FIG. 37B. The silicon oxidation layer 124 is then patterned so as to cover the portions to be turned into the portions 115a, 115b, and so on. Thereafter, proton is implanted ionically into the upper DBR layer 114 by using the resulting silicon oxidation layer 124 as a mask.

Figure 38A:
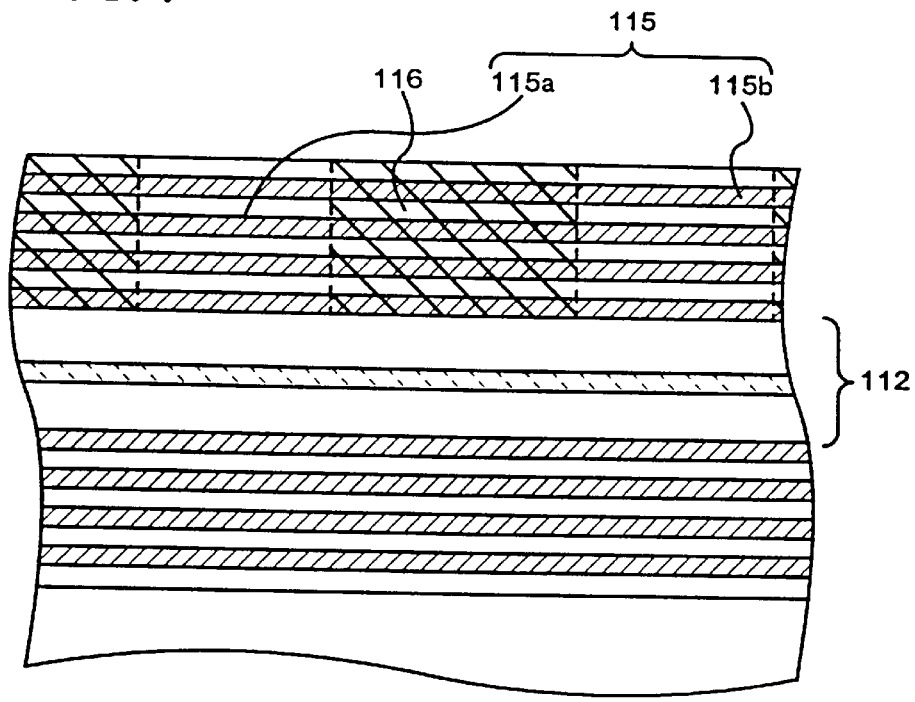
FIGS. 38A and 38B are sectional views for describing the manufacturing method of the surface light-emitting device composing the beam generator 100.

Next, the resulting silicon oxidation layer 124 is removed as shown in FIG. 38A. The portions implanting proton lose their conductivity so that these portions are turned into the insulating part 116. The portions not implanting proton, on the other hand, not lose their conductivity. The portions not losing their conductivity are turned into the upper reflecting mirror portion 115. In this way, the mirror portion 115 (hologram portion) having a desired pattern (a pattern in matrix manner in this embodiment) can easily be formed.

Figure 38B:
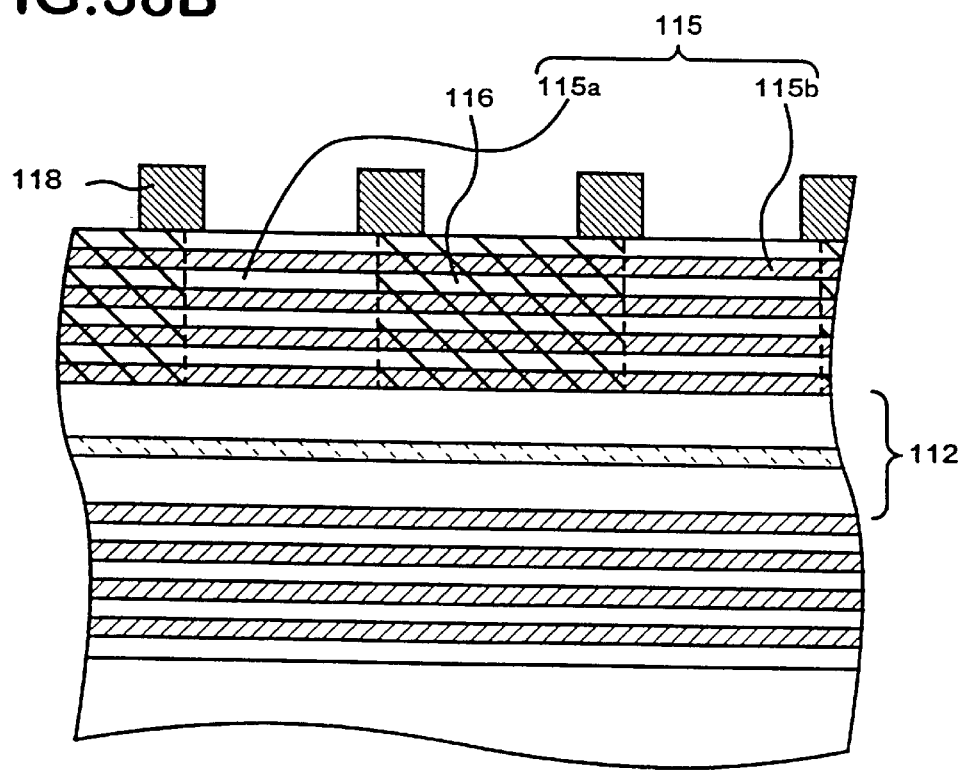

Subsequently, the aluminum wirings 118 are wired as shown in FIG. 38B. AS described earlier, the aluminum wirings 118 each having doughnut shape are disposed on the boundaries between the portions 115a, 115b and so on and the insulating part 116, the boundaries being exposed from the surface (see FIG. 36). By performing these steps, the surface light-emitting device used for the beam generator 100 is manufactured.

Figure 39:
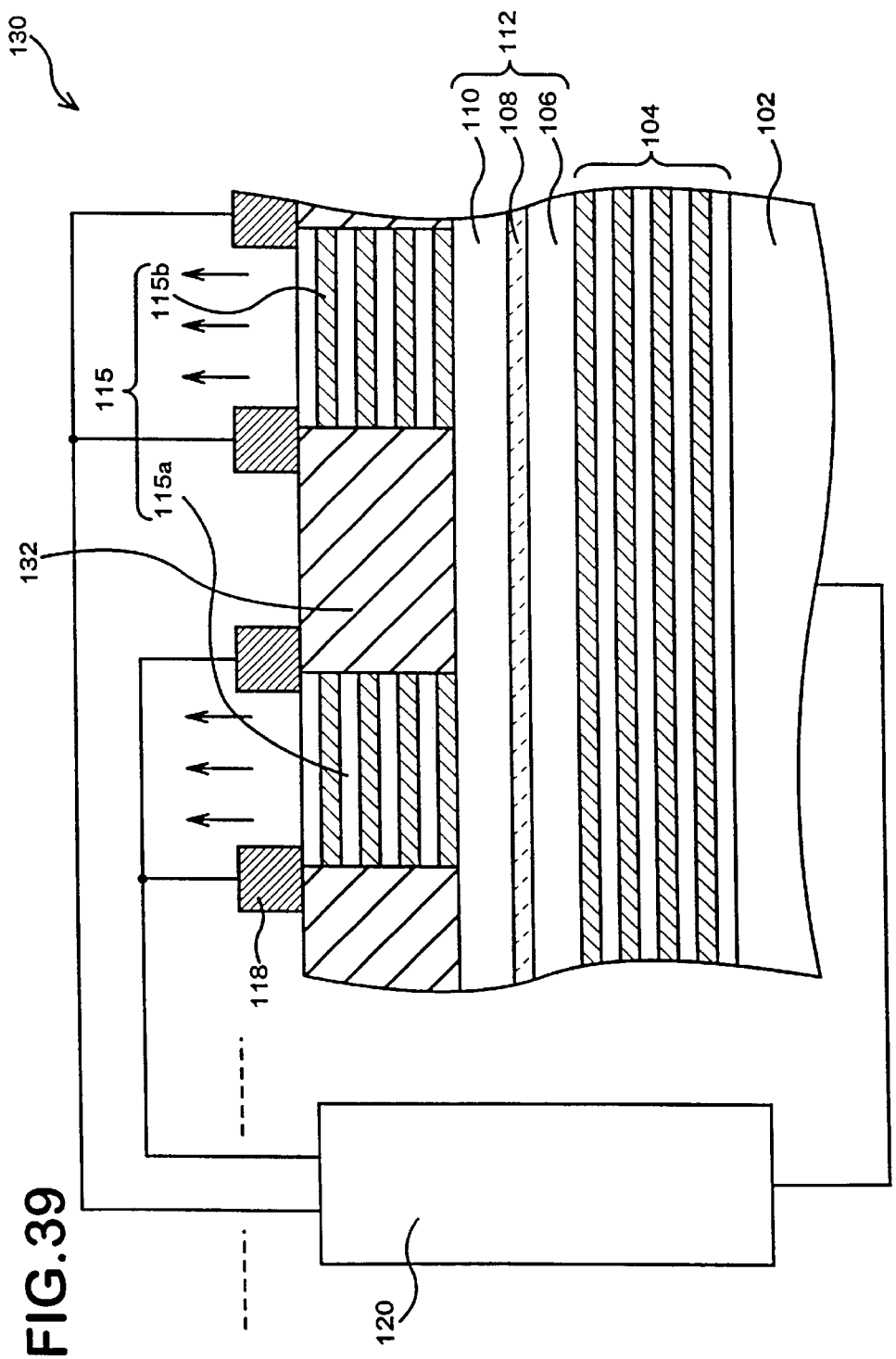
FIG. 39 is a view for describing the structure of another beam generator 130 according to another embodiment of the present invention.

FIG. 39 is a sectional view for describing the structure of another beam generator 130 forming an optical-input/output device using the surface light-emitting device according to another embodiment of the present invention. The beam generator 130 uses the surface-emitting laser device depicted in FIG. 34 and has the similar structure to that of the beam generator 100 shown in FIG. 35.

However, the beam generator 130 shown in FIG. 39 differs from the beam generator 100 shown in FIG. 35 in view of forming an insulating part 132 with other material, for example, polyimide.

In order to fabricate the beam generator 130 shown in FIG. 39, the upper DBR layer 114 is etched so as to leave the portions 115*a*, 115*b* and so on composing the upper reflecting mirror portion 115 after carrying out the step shown in FIG. 37A. Thereafter, insulation material(s) such as polyimide is applied so as to fulfill the spaces formed among the portions 115*a*, 115*b*, and so on forming the mirror portion 115. The step for disposing the aluminum wirings 118 is also carried out similar to the manufacturing steps of the beam generator 100 shown in FIG. 35.

Figure 40:
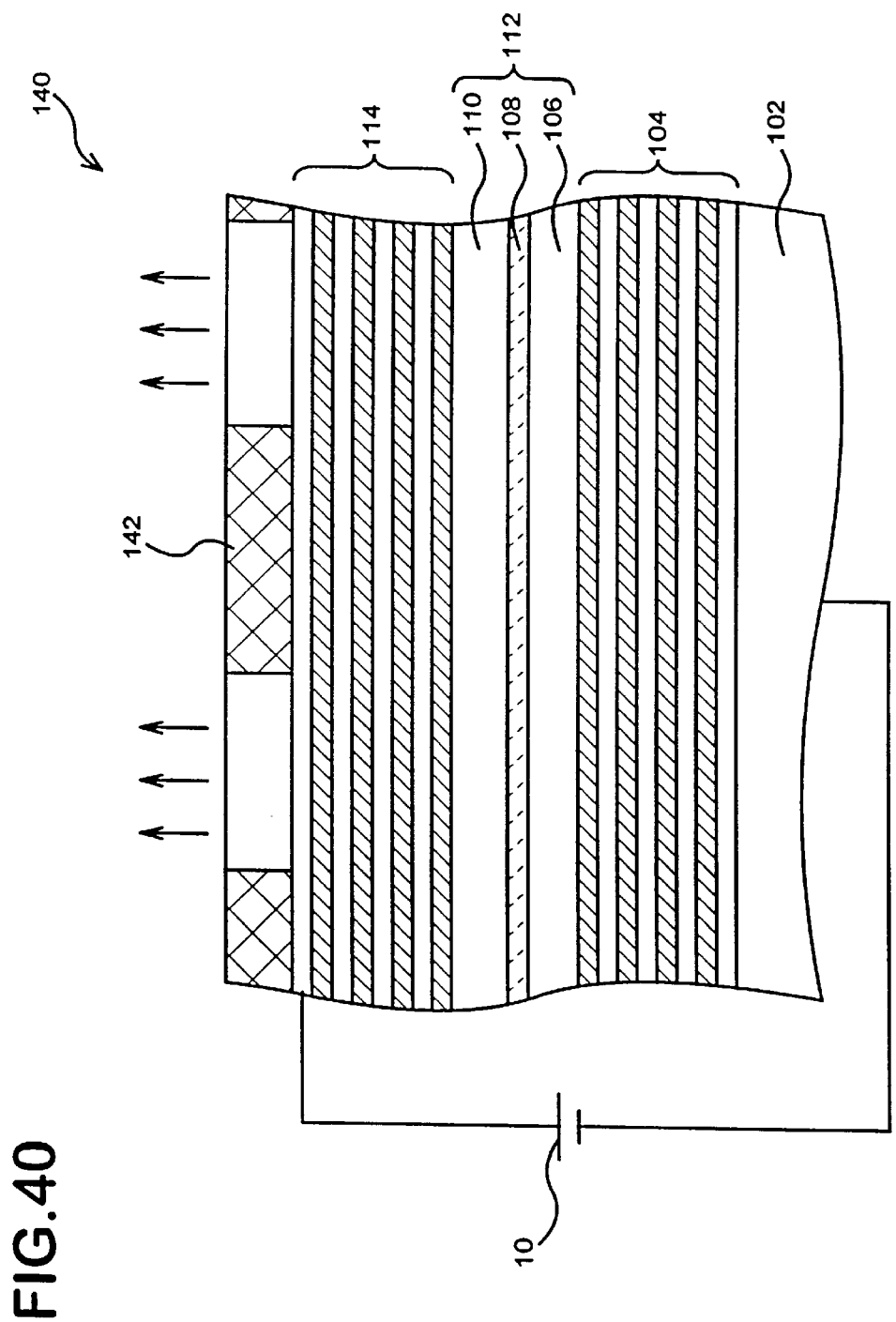
FIG. 40 is a sectional view for describing the structure of another beam generator 140 according to another embodiment of the present invention.
Figure 41:
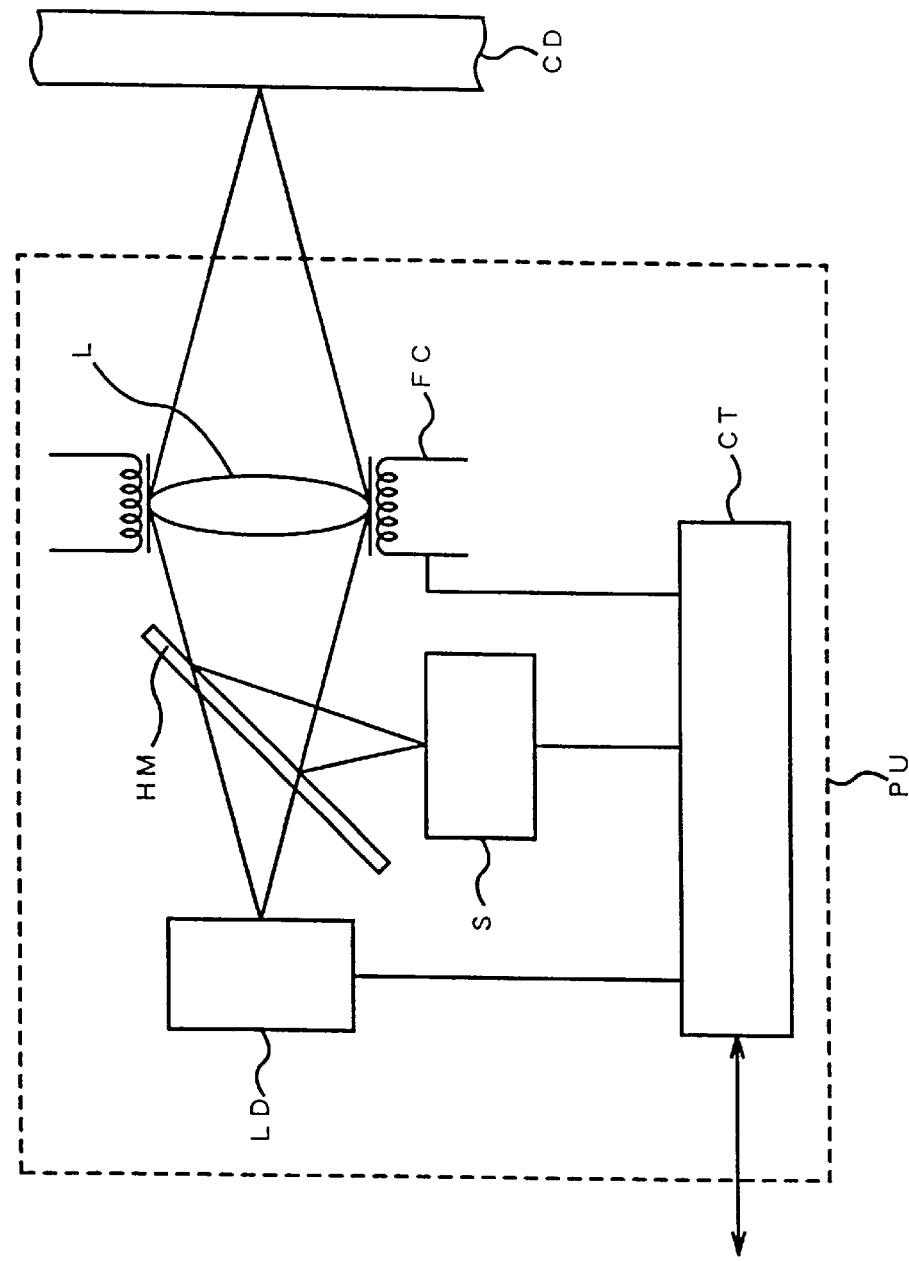
FIG. 41 is a conceptual view for describing a prior art optical pickup device PU.
Figure 42:
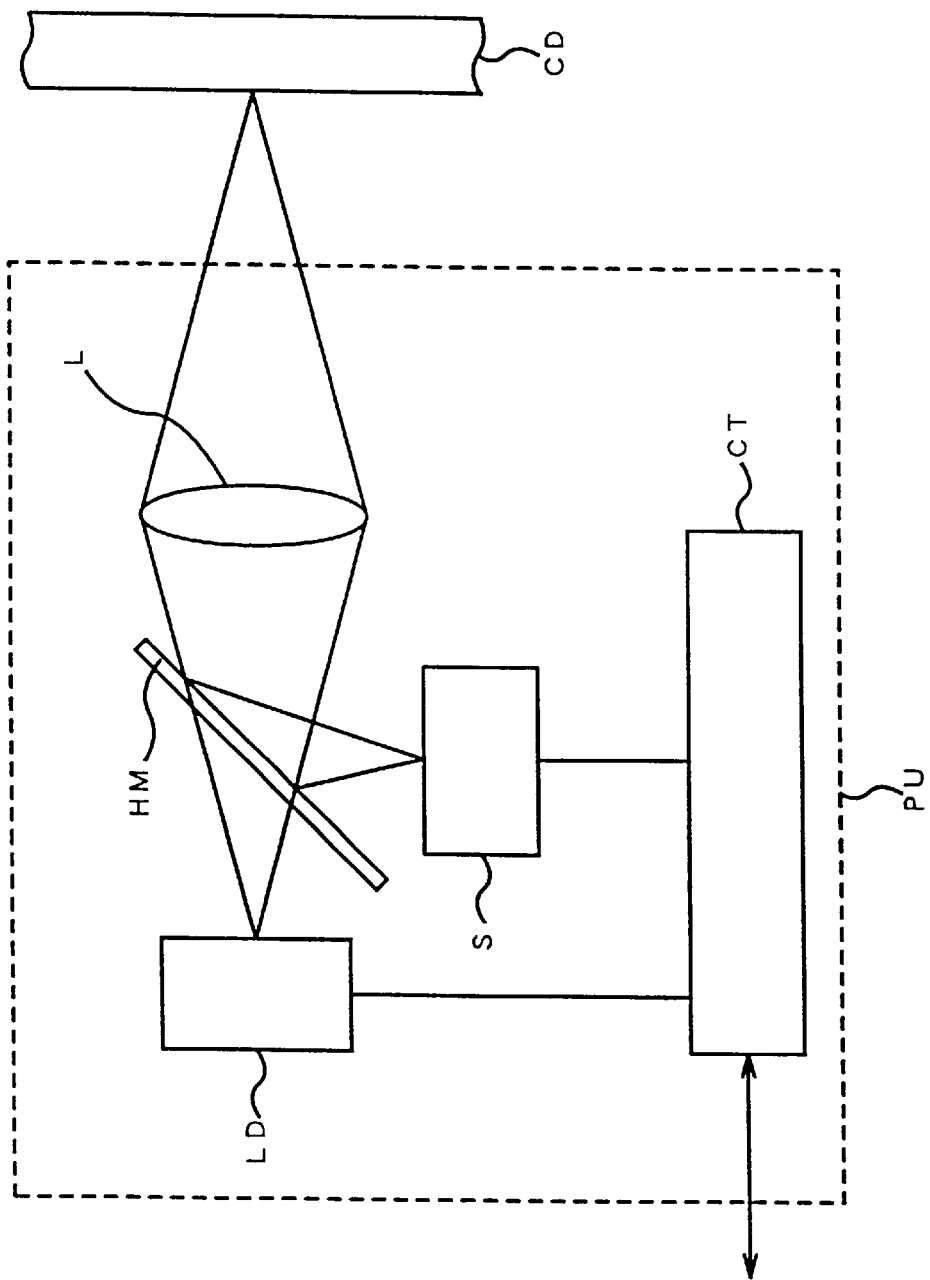
FIG. 42 is a conceptual view for describing another prior art optical pickup device PU.

FIG. 40 is a sectional view for describing the structure of another beam generator 140 forming an optical-input/output device using the surface light-emitting device according to another embodiment of the present invention. The beam generator 140 also uses the surface-emitting laser device depicted in FIG. 34 and has the similar structure to that of the beam generator 100 shown in FIG. 35.

However, the beam generator 140 shown in FIG. 40 differs from the beam generator 100 shown in FIG. 35 in view of the followings: 1) remaining the upper DBR layer 114 as it is, 2) providing a shielding layer 142 having a shape corresponding to interference fringes of holograms so as to cover the shielding layer 142, and 3) emitting a laser beam from the spaces formed among the shielding layer 142.

Further, a DC power supply 10 is used instead of the control part in the beam generator 140 shown in FIG. 40. In other words, laser beams having desired shape can be realized by emitting a laser beam from the spaces formed among the shielding layer 142 out of the generated laser beam as a result of applying a DC voltage between the upper DBR layer 114 and the substrate 102 in the beam generator 140 shown in FIG. 40.

In this way, desired laser beams and the like can be obtained by just forming the shielding layer 142 in the shape corresponding to the interference fringes of the holograms without providing the control part as well as complicated wirings.

In this embodiment, electric resistance of the upper most plane of the upper DBR layer is lowered, and a cable from the power supply 10 is connected to the uppermost plane thus lowered in electric resistance. It is preferred to design in this way because electric potential is in stable all over the upper DBR layer 114.

As described above, the luminescent layer 112 comprise a stacked-layer formed of the n-clad layer 106, the MQW layer 108, the p-clad layer 110 in that order, and the light radiated from the MQW layer 108 is emitted in a direction perpendicular to the luminescent layer 112 as a laser beam after resonation of the radiated light in the embodiments described in this chapter.

In this way, it is possible to realize a surface light-emitting device much suitable for reproduction of holograms by using the emitted laser beams. Moreover, a desired illumination pattern may easily be obtained by emitting the laser beam in the direction perpendicular to the luminescent layer 112. In other words, a desired hologram pattern can easily be obtained. Further, laser oscillation can easily be performed by employing a semi-conducting substance having a high heat resistance for the luminescent layer 112.

Both the lower DBR layer 104 and the upper DBR layer 114 (or the upper reflecting mirror portion 115) each provided so as to interpose the luminescent layer 112 and having reflecting planes substantially parallel to the luminescent layer 112 are included in the generators in the embodiments described in this chapter, and light radiated from the luminescent layer 112 is resonated in a direction perpendicular to the luminescent layer 112.

As a consequence, the volume of areas interposed between the lower DBR layer 104 and the upper DBR layer 114 (or the upper reflecting mirror portion 115) can be reduced. In this way, the threshold value for initiating the laser oscillation can be lowered. In other words, a surface light-emitting device and the like with low-power consumption can be realized. In addition, the upper DBR layer 114 can further be patterned in detail. In other words, hologram pattern with finer patterning may easily be obtained.

The surface-emitting laser device comprising a plurality of reflecting mirrors for resonating the generated light in the direction substantially perpendicular to the luminescent layer in the embodiments described in this chapter. The usage of the present invention is not limited to the surface-emitting laser device. The present invention may also be applicable to a surface-emitting laser device comprising two reflecting mirrors one of which is used for resonating the generated light beam in the direction substantially parallel to the luminescent layer and the other one is used for emitting the resulting laser beam resonated with the former mirror in a direction substantially perpendicular to the luminescent layer. The semi-conducting material(s) conductive material(s), insulation material(s) composing the luminescent layer are not limited to those mentioned in the embodiments described earlier.

The shape of the luminescent layer is not limited to those described in the embodiments described earlier.

The surface-emitting laser devices emitting laser beams by using the luminescent layer made of a semi-conducting substance are described in the embodiments described in this chapter. The present invention is not limited to semi-conducting substance. A surface-emitting laser device emitting laser beams by using the luminescent layer made of inorganic material(s) other than semi-conducting substance and/or organic material(s) and the like may also be applicable to the present invention. For example, laser beams may be obtained by a surface-emitting laser device using the luminescent layer made of organic material(s) instead of semi-conducting substance.

All the descriptions in each of the chapters described earlier are applied to this chapter unless otherwise they are not clearly applicable to this chapter. The surface-emitting laser device described in this chapter (laser devices emitting laser beams in a direction substantially perpendicular to the luminescent layer) may also be used as the light source of the device/beam generators and the like in the chapters described earlier. In other words, the surface-emitting laser devices described in this chapter can be applicable to the surface light-emitting devices, the beam generators, the device for monitoring reflected light, the plotting devices, the light scanning and reading device, image display devices, and the IC cards described earlier chapters.

The surface light-emitting device according to the present invention is characterized in that, the electrode is substantially formed in a shape corresponding to a pattern of interference fringes of a hologram.

In this way, the luminescent layer emits light corresponding to the patterns of hologram as a result of applying a voltage to the electrodes. As a consequence, the surface light-emitting device alone can play both roles as the light source and the optical elements by making the patterns of interference fringes of holograms with the hologram patterns of optical elements such as lens, for example. In other words, a lightweight and compact-profile optical input/output device with reasonable price can be realized by using the surface light-emitting device according to the present invention.

The shape corresponding to the patterns of interference fringes of holograms can be formed easily and accurately because both the electrodes are made of easy-to-form material.

The surface light-emitting device according to the present invention is characterized in that, a pair of electrode layers interposing the luminescent layer therebetween, and wherein one of the electrode layers is formed as a transparent electrode layer substantially having the shape corresponding to the pattern of interference fringes of the hologram, and wherein the light from the luminescent layer is emitted through said transparent electrode.

In this way, the light emitted correspondingly to the patterns of interference fringes from the luminescent layer comes out externally through the transparent electrode formed in a shape substantially corresponding to the patterns of interference fringes as a result of applying a voltage between the electrodes. Consequently, light reproduced with high fidelity to the patterns of interference fringes may be obtained.

The surface light-emitting device according to the present invention is characterized in that, a supporting member is provided to a position outside of the other one of the electrode layers, and wherein the light from the luminescent layer is emitted through said one electrode layer.

In this way, the light from the luminescent layer can be emitted externally without passing through the supporting member. As a consequence, the light comes out without much degradation of the light amount.

The surface light-emitting device according to the present invention is characterized in that, a supporting member having transparency is provided to a position outside of said one electrode layer, and wherein the light from the luminescent layer is emitted through said one electrode layer and the supporting member.

Consequently, the transparent electrode formed in the patterns of interference fringes can be provided on the supporting member after disposing the supporting member prior to providing the transparent electrode thereon. As a result, it is possible to obtain a shape corresponding to the pattern of interference fringes of the hologram easily and more precisely.

The surface light-emitting device according to the present invention is characterized in that, the electrode is composed of a pair of electrode layers interposing the luminescent layer therebetween, and wherein one of the electrode layers is formed in a shape substantially corresponding to a pattern of interference fringes of a hologram while forming the other one of the electrode layers as a transparent electrode layer, and wherein light from the luminescent layer is emitted through the other electrode layer.

In this way, the electrode layers formed in a shape corresponding to the patterns of interference fringes not necessary to be transparent electrodes. As a consequence, an easy-to-form material for the electrodes can be selected. In other words, it is possible to obtain a shape corresponding to the pattern of interference fringes of the hologram easily and more precisely.

The surface light-emitting device according to the present invention is characterized in that, a supporting member having transparency is provided to a position outside of the other electrode layer, and wherein the light from the luminescent layer is emitted through the other electrode layer and the supporting member.

Consequently, the surface light-emitting device can easily be fabricated by using an element including transparent electrodes formed on the supporting member having transparency and readily available.

The surface light-emitting device according to the present invention is characterized in that, a shielding layer formed in a shape substantially corresponding to a pattern of interference fringes of a hologram is provided at a position outside of the luminescent layer, and wherein the light from the luminescent layer is emitted through the shielding layer.

In this way, light corresponding to the patterns of interference fringes can easily be emitted by using the shielding layer as a mask for the light emitted from the luminescent layer. As a consequence, the surface light-emitting device alone can play both roles as the light source and the optical elements by making the patterns of interference fringes of holograms with the hologram patterns of optical elements such as lens, for example. In other words, a lightweight, compact-profile optical-input/output device with reasonable price capable of emitting light can be realized easily by using the surface light-emitting device.

Further, the shielding layer may be formed with an easy-to-form material because not many restrictions exist on the material therefor. Consequently, the shape corresponding to the patterns of interference fringes of holograms can be formed easily and accurately.

The surface light-emitting device according to the present invention is characterized in that, the electrode is composed of a pair of electrode layers interposing the luminescent layer therebetween, and wherein one of the electrode layers is formed as a transparent electrode layer while providing the shielding layer at a position outside of said one electrode layer.

In this manner, the entire portion of the luminescent layer illuminates by applying a voltage between a pair of the electrode, so that a part of the resulting light can be emitted through the shielding layer 20 formed corresponding to the patterns of interference fringes as a mask. Consequently, light reproduced with high fidelity to the patterns of interference fringes may be obtained.

The surface light-emitting device according to the present invention is characterized in that, a supporting member having transparency is provided to a position outside of the shielding layer, and wherein the light from the luminescent layer is emitted through said one electrode layer, the shielding layer and the supporting member.

In this way, the shielding layer formed in the patterns of interference fringes can be provided on the supporting member after disposing the supporting member prior to providing the shielding layer thereon. As a result, it is possible to obtain a shape corresponding to the pattern of interference fringes of the hologram easily and more precisely.

The surface light-emitting device according to the present invention is characterized in that, an uneven transparent layer formed unevenly in thickness corresponding to a pattern of interference fringes, is disposed at a position outside of the luminescent layer, and wherein the light from the luminescent layer is emitted through the uneven transparent layer.

In this way, light corresponding to the patterns of interference fringes can easily be emitted by using the uneven transparent layer as a mask for the light emitted from the luminescent layer. As a consequence, the surface light-emitting device alone can play both roles as the light source and the optical elements by making the patterns of interference fringes of holograms with the hologram patterns of optical elements such as lens, for example. In other words, a lightweight, compact-profile optical-input/output device with reasonable price capable of emitting light can be realized easily by using the surface light-emitting device.

Further, the uneven transparent layer may be formed with an easy-to-form material because not many restrictions exist on the material therefor. Consequently, the shape corresponding to the patterns of interference fringes of holograms can be formed easily and accurately.

The surface light-emitting device according to the present invention is characterized in that, the electrode is composed of a pair of electrode layers interposing the luminescent layer therebetween, and wherein one of the electrode layers is formed as a transparent electrode layer while providing the uneven transparent layer at a position outside of said one electrode layer.

In this manner, the entire portion of the luminescent layer illuminates by applying a voltage between a pair of the electrode, so that the resulting light can be emitted through the uneven transparent layer formed unevenly in thickness substantially corresponding to the pattern of the interference fringes. Consequently, light reproduced with high fidelity to the patterns of interference fringes may be obtained.

The surface light-emitting device according to the present invention is characterized in that, the uneven transparent layer is a supporting member having transparency, and wherein the light from the luminescent layer is emitted through said one electrode layer and the supporting member.

As a consequence, a shape corresponding to the patterns of interference fringes can easily and accurately be obtained by just forming convex/concave patterns corresponding to the patterns of interference fringes on the surface of the supporting member having transparency.

The surface light-emitting device according to the present invention is characterized in that, the uneven transparent layer is a passivation layer having transparency, and wherein the light from the luminescent layer is emitted through said one electrode layer and the passivation layer.

As a consequence, a shape corresponding to the patterns of interference fringes can easily and accurately be obtained by just forming convex/concave patterns corresponding to the patterns of interference fringes on the surface of the passivation layer having transparency.

The surface light-emitting device according to the present invention is characterized in that, the luminescent layer is made of an organic material.

The use of organic materials to the luminescent layer permits the formation thereof with a very thin in thickness in comparison with wavelength of the emitted light therefrom. In this way, the active thickness of the portions emitting light in the luminescent layer can be formed in a thickness, which is negligible in comparison with the wavelength of the emitted light. In addition, the minimum planar dimension of the luminescent layer can dramatically be smaller in comparison with the wavelength of the emitted light. It is, therefor, possible to provide a luminescent layer suitable for reproduction of holograms by using organic materials therefor.

A lightweight, compact-profile optical-input/output device with reasonable price capable of emitting light can further be realized easily because the device can be operated at a low DC voltage.

The surface light-emitting device according to the present invention is characterized in that, molecular alignment of organic material is in parallel to the electrodes. This permits stronger light-emitting intensity even when a low voltage is applied.

The beam generator according to the present invention is characterized in that, a predetermined beam is generated by utilizing the surface light-emitting device. In this way, the beam generator can be made as a lightweight, compact-profiled, yet reasonable priced device.

The surface light-emitting device according to the present invention is characterized in that, a hologram layer formed substantially corresponding to the patterns of interference fringes of a hologram is formed as a layer one of related to light emission and provided on the predetermined optical path, and wherein the light from the luminescent layer directed to other than the predetermined optical path is emitted to a direction other than the predetermined optical path.

In this way, the surface light-emitting device alone can play both roles as the light source and the optical elements by making the patterns of interference fringes of holograms with the hologram patterns of optical elements such as lens, for example. In other words, a lightweight and compact-profile optical input/output device with reasonable price can be realized by using the surface light-emitting device according to the present invention.

As a consequence, localization of an imaginary light source created by reflection of the lights directed to the backside to a position other than that of the luminescent part may be avoided by permitting the travel of most of the lights go to the backside from the luminescent layer in the backward-direction. Consequently, the light source can keep its substantial optical depth narrow. It is, therefor, possible to obtain the lights suitable for reproduction of holograms.

The surface light-emitting device according to the present invention is characterized in that, the electrode is composed of a pair of electrode layers interposing the luminescent layer therebetween, and wherein both the electrode layers are formed as transparent electrode layers.

In this way, the light from the luminescent layer directed to other than the predetermined optical path may be emitted in that direction by forming both the electrode layers as transparent electrode layers.

The surface light-emitting device according to the present invention is characterized in that, a hologram layer formed substantially corresponding to a pattern of interference fringes of a hologram is formed as a layer one of related to light emission and provided on the predetermined optical path, and wherein the light from the luminescent layer directed to other than the predetermined optical path is reflected and incorporated with another light from the luminescent layer directed to the predetermined optical path so as to intensify a resulting light.

In this way, the surface light-emitting device alone can play both roles as the light source and the optical elements by making the patterns of interference fringes of holograms with the hologram patterns of optical elements such as lens, for example. In other words, a lightweight and compact-profile optical input/output device with reasonable price can be realized by using the surface light-emitting device according to the present invention.

The resulting light having a higher intensity can be obtained by reflecting the light from the luminescent layer directed to other than the predetermined optical path and incorporating the reflected light with another light from the luminescent layer directed to the predetermined optical path so as to intensify a resulting light. In other words, the light source much suitable for the reproduction of holograms can be obtained.

The surface light-emitting device according to the present invention is characterized in that, the electrode is composed of a pair of electrode layers interposing the luminescent layer therebetween, and wherein one of the electrode layers is formed as a transparent electrode layer while forming the other one of electrode layers as an electrode capable of reflecting light on its surface, and wherein the light from the luminescent layer that is directed to said one electric layer and the light reflected on the surface of the other electrode layer is incorporated and emitted.

In this way, both the light from the luminescent layer directed to other than the predetermined optical path as a result of reflection on the surface and another light from the luminescent layer directed to the predetermined optical path can easily be incorporated and emitted by forming one of the electrode layers as the transparent electrode layer while forming the other one of electrode layers as the electrode capable of reflecting light on its surface.

The surface light-emitting device according to the present invention is characterized in that, an optical distance u1 from a luminescent part of the luminescent layer to the surface of the other electrode layer is defined as the following equation;

$$u1 \approx (2n-1)\lambda/4$$

wherein "n" is a positive integer, and "λ" represents to a wavelength of a desired light emitted from the device.

In this way, phase of reflected light of the light from the luminescent layer directed to other than the predetermined optical path and that of the light emitted therefrom being directed to the predetermined optical path are nearly matched. It is, therefore, possible to emit light suitable for the reproduction of holograms.

The surface light-emitting device according to the present invention is characterized in that, a hologram layer formed substantially corresponding to a pattern of interference fringes of a hologram is formed as a layer one of related to light emission and provided on the predetermined optical path, and wherein the light from the luminescent layer is resonated and emitted.

In this way, the surface light-emitting device alone can play both roles as the light source and the optical elements by making the patterns of interference fringes of holograms with the hologram patterns of optical elements such as lens, for example. In other words, a lightweight and compact-profile optical input/output device with reasonable price can be realized by using the surface light-emitting device according to the present invention.

The device fabricated under the structure described above can obtain monochromatic radiation having a high intensity effectively with a simple structure. Also, light having a high directivity can be obtained with the device as well. Lights having similar phase can further be obtained. In addition, it is possible to provide a surface light-emitting device realizing the light source suitable for reproduction of holograms.

The surface light-emitting device according to the present invention is characterized in that, the electrode is composed of a pair of electrode layers interposing the luminescent layer therebetween, and wherein one of the electrode layers is formed as a transparent electrode layer while forming the other one of electrode layers as an electrode capable of reflecting light on its surface, and wherein dielectric reflective layer not less than one is provided to a position outside of said one electrode layer, and wherein the light is resonated between the surface of the other electrode layer and a reflective plane of the dielectric reflective layer, and is then emitted therefrom.

In this way, the light from the luminescent layer can easily be emitted after resonation thereof by providing both the electrodes capable of reflecting light on its surface and the dielectric reflective layer not less than one.

The surface light-emitting device according to the present invention is characterized in that, wherein an optical distance u2 from the reflective plane of the dielectric reflective layer to the surface of the other electrode layer is defined as the following equation;

$$U2 \approx n\lambda/2$$

wherein "λ" represents a wavelength of a desired light emitted from the device.

In this way, the light emitted from the luminescent layer can further be emitted effectively as a result of performing effective resonation.

The surface light-emitting device according to the present invention is characterized in that, the luminescent layer is made of an organic material.

The use of organic materials to the luminescent layer permits the formation thereof with a very thin in thickness in comparison with wavelength of the emitted light therefrom. In this way, the active thickness of the portions emitting light in the luminescent layer can be formed in a thickness, which is negligible in comparison with the wavelength of the emitted light. In addition, the minimum planar dimension of the luminescent layer can dramatically be smaller in comparison with the wavelength of the emitted light. It is, therefor, possible to provide a luminescent layer suitable for reproduction of holograms by using organic materials therefor.

A lightweight, compact-profile optical-input/output device with reasonable price capable of emitting light can further be realized easily because the device can be operated at a low DC voltage.

The surface light-emitting device according to the present invention is characterized in that, a hologram layer formed substantially corresponding to the patterns of interference fringes of a hologram is formed as a layer one of related to light emission and provided on the predetermined optical path, and wherein the hologram layer is formed alone with a part located periphery of interference fringes of the hologram.

In this way, the surface light-emitting device alone can play both roles as the light source and the optical elements by making the patterns of interference fringes of holograms with the hologram patterns of optical elements such as lens, for example. In other words, a lightweight and compact-profile optical input/output device with reasonable price can be realized by using the surface light-emitting device according to the present invention.

The hologram layer can be formed with only the part where is narrow in distance between the fringes by using the peripheral part of the interference fringes of the holograms.

The directivity of lights after passing through holograms HG receives much influence of both the conditions of the lights before passing therethrough and the distance between the fringes. However, more influence of the distance than that of the condition of the lights before passing through the hologram layer may be expected at the part where is narrow in distance.

In this way, it is assumed that the light directivity can be controlled in accordance with the distance of the fringes regardless of the conditions of the lights before passing through the hologram layer if the hologram layer is formed with the part where is narrow in distance between the fringes alone.

In other words, a hologram layer much suitable for reproduction of holograms may be realized.

The surface light-emitting device according to the present invention is characterized in that, hologram layer formed substantially corresponding to a pattern of interference fringes of a hologram is formed as a layer one of related to light emission and provided on the predetermined optical path, and wherein the hologram layer includes a light-pattern and a dark-pattern, and wherein a width of the light-pattern is substantially formed in a range of a wavelength of the light or less than said range.

In this way, the surface light-emitting device alone can play both roles as the light source and the optical elements by making the patterns of interference fringes of holograms with the hologram patterns of optical elements such as lens, for example. In other words, a lightweight and compact-profile optical input/output device with reasonable price can be realized by using the surface light-emitting device according to the present invention.

The light-pattern very narrow in width can be realized by forming the width of the light-pattern substantially equal to or less than the wavelength of the light.

The light directivity of lights after passing through holograms receives much influence of both the conditions of the lights before passing therethrough and the width of the light-patters. However, not much influence is expected on the conditions of the lights before passing therethrough if the width of the light-patterns is in narrow.

As a consequence, it is considered that the light directivity can be controlled regardless of the conditions of the lights before passing through the hologram layer if the hologram layer is formed so as to narrow the width of the light-pattern. In other words, a hologram layer much suitable for reproduction of holograms may be realized.

The surface light-emitting device according to the present invention is characterized in that, the hologram layer is formed alone with a part located periphery of interference fringes of the hologram. In this way, it is possible to realize a hologram layer much suitable for the reproduction of holograms.

The surface light-emitting device according to the present invention is characterized in that, the hologram layer is composed by forming the electrode in a shape substantially correspond to the pattern of the interference fringes.

In this way, a shape corresponding to the patterns of interference fringes of holograms can be formed easily and accurately by forming the hologram layer with easy-to-form electrodes.

The surface light-emitting device according to the present invention is characterized in that, the hologram layer is composed by forming the luminescent layer in a shape substantially correspond to the pattern of the interference fringes.

Light reproduced with high fidelity to the patterns of interference fringes may be obtained by utilizing the luminescent layer itself as the hologram layer.

The surface light-emitting device according to the present invention is characterized in that, the hologram layer is composed by forming a shielding layer in a shape substantially correspond to the pattern of the interference fringes at a position outside of the luminescent layer, and wherein the light from the luminescent layer is emitted through the shielding layer.

In this way, a hologram layer made of an easy-to-form material can be formed by using the shielding layer with not many restrictions exist on its material as the hologram layer. As a consequence, a shape corresponding to the patterns of interference fringes of holograms can be formed easily and accurately.

The surface light-emitting device according to the present invention is characterized in that, the hologram layer is composed by forming an uneven transparent layer formed unevenly in thickness substantially corresponding to the pattern of the interference fringes at a position outside of the luminescent layer, and wherein the light from the luminescent layer is emitted through the uneven transparent layer.

In this way, a hologram layer made of an easy-to-form material can be formed by using the uneven transparent layer with not many restrictions exist on its material as the hologram layer. As a consequence, a shape corresponding to the patterns of interference fringes of holograms can be formed easily and accurately.

The surface light-emitting device according to the present invention is characterized in that, the luminescent layer is made of an organic material.

The use of organic materials to the luminescent layer permits the formation thereof with a very thin in thickness in comparison with wavelength of the emitted light therefrom. In this way, the active thickness of the portions emitting light in the luminescent layer can be formed in a thickness, which is negligible in comparison with the wavelength of the emitted light. In addition, the minimum planar dimension of the luminescent layer can dramatically be smaller in comparison with the wavelength of the emitted light. It is, therefor, possible to provide a luminescent layer much suitable for reproduction of holograms by using organic materials therefor.

A lightweight, compact-profile optical-input/output device with reasonable price capable of emitting light can further be realized easily because the device can be operated at a low DC voltage.

The beam generator according to the present invention is characterized in that, generating a predetermined beam with said surface light-emitting device. In this way, a lightweight, compact-profile beam generator with reasonable price can further be realized.

The surface light-emitting device according to the present invention is characterized in that, a hologram layer formed substantially corresponding to the pattern of the interference is formed as a layer one of related to light emission and provided on the predetermined optical path, and wherein the hologram layer includes a light-pattern and a dark-pattern, and wherein the light-pattern is formed in a fixed width, and wherein information containing light intensity of the holograms is reproduced in accordance with brightness of a portion generating light where corresponding to the light-pattern.

In this way, the surface light-emitting device alone can play both roles as the light source and the optical elements by making the patterns of interference fringes of holograms with the hologram patterns of optical elements such as lens, for example. In other words, a lightweight and compact-profile optical input/output device with reasonable price can be realized by using the surface light-emitting device according to the present invention.

Further, information containing phase of the holograms may be reproduced by allocating pattern elements as a result of forming the device as the followings. 1) forming the light-pattern in a fixed width, and 2) reproducing information containing light intensity of the hologram by the brightness of the portions corresponding to the element regions.

In this way, the hologram layer can be formed by just allocating each of the element regions having a fixed width. In other words, formation of the hologram layer may easily be carried out.

The surface light-emitting device according to the present invention is characterized in that, the hologram layer is composed by forming the electrode in a shape substantially correspond to the pattern of the interference fringes.

In this way, a shape corresponding to the patterns of interference fringes of holograms can be formed easily and/accurately by forming the hologram layer with easy-to-form electrodes.

The surface light-emitting device according to the present invention is characterized in that, wherein the hologram layer is composed by forming the luminescent layer in a shape substantially correspond to the pattern of the interference fringes.

Light reproduced with high fidelity to the patterns of interference fringes may be obtained by utilizing the luminescent layer itself as the hologram layer.

The surface light-emitting device according to the present invention is characterized in that, brightness of the portion where corresponding to the light-pattern is controlled by adjusting a current value flowing through the luminescent layer.

In this way, light intensity of the holograms can easily be reproduced by adjusting the current value. As a consequence, reproduction of the holograms may easily be carried out.

The surface light-emitting device according to the present invention is characterized in that, the hologram layer is composed by providing a shielding layer formed in a shape substantially corresponding to a pattern of interference fringes of a hologram at a position outside of the luminescent layer, and wherein the light from the luminescent layer is emitted through the shielding layer.

In this way, a hologram layer made of an easy-to-form material can be formed by using the shielding layer with not many restrictions exist on its material as the hologram layer. As a consequence, a shape corresponding to the patterns of interference fringes of holograms can be formed easily and accurately.

The surface light-emitting device according to the present invention is characterized in that, the light-pattern is substantially formed in a width, a range of which is one of wavelength of the light or less than said range.

In this way, the light-pattern very narrow in width can be realized. The light directivity of lights after passing through holograms receives much influence of both the conditions of the lights before passing therethrough and the width of the light-patterns. However, not much influence is expected on the conditions of the lights before passing therethrough if the width of the light-patterns is in narrow.

As a consequence, it is considered that the light directivity can be controlled regardless of the conditions of the lights before passing through the hologram layer if the hologram layer is formed so as to narrow the width of the light-pattern. In other words, a hologram layer much suitable for reproduction of holograms may be realized.

The surface light-emitting device according to the present invention is characterized in that, the luminescent layer is made of an organic material.

The use of organic materials to the luminescent layer permits the formation thereof with a very thin in thickness in comparison with wavelength of the emitted light therefrom. In this way, the active thickness of the portions emitting light in the luminescent layer can be formed in a thickness, which is negligible in comparison with the wavelength of the emitted light. In addition, the minimum planar dimension of the luminescent layer can dramatically be smaller in comparison with the wavelength of the emitted light. It is, therefor, possible to provide a luminescent layer suitable for reproduction of holograms by using organic materials therefor.

A lightweight, compact-profile optical-input/output device with reasonable price capable of emitting light can further be realized easily because the device can be operated at a low DC voltage.

The beam generator according to the present invention is characterized in that, generating a predetermined beam with said surface light-emitting device. In this way, a lightweight, compact-profile beam generator with reasonable price can further be realized.

The surface light-emitting device according to the present invention is characterized in that, a hologram layer formed substantially corresponding to a pattern of interference fringes of a hologram is formed as a layer one of related to light emission and provided on the predetermined optical path, and wherein the device is fabricated so that the light once emitted through the optical path returns through the hologram layer as a reflected light.

In this way, the surface light-emitting device alone can play roles as the light source, lens and the half-mirror by making the patterns of interference fringes of holograms with the hologram patterns of optical elements such as lens, for example. In other words, a lightweight and compact-profile optical input/output device outputting light while using the reflected light as incident light with reasonable price can be realized by using the surface light-emitting device according to the present invention.

The surface light-emitting device according to the present invention is characterized in that, the hologram layer includes a light-pattern and a dark-pattern, and wherein a portion generating light where corresponding to the light-pattern is formed so that light travels in a forward-direction to the optical path but not proceeds in a backward-direction thereto, and wherein a portion not generating light where corresponding to the dark-pattern is formed so that light proceeds in a backward-direction to the optical path.

The light emitted from the light-pattern only travels in the forward-direction and reflected by an object. The reflected light passes through the dark-pattern and travels to the backward-direction of the optical path. As a consequence, the optical input/output device outputting light while using the reflected light as incident light with compact-profile and in reasonable cost can easily be realized by composing the hologram layer with both the light-pattern and the dark-pattern.

The surface light-emitting device according to the present invention is characterized in that, the electrode is the hologram layer. In this way, a shape corresponding to the patterns of interference fringes of holograms can be formed easily and accurately by forming the hologram layer with easy-to-form electrodes.

The surface light-emitting device according to the present invention is characterized in that, the electrode is composed of a pair of electrode layers interposing the luminescent layer therebetween, and wherein one of the electrode layers disposed at a position behind the optical path is formed as the hologram layer, and wherein the other one of electrode layers disposed at a position in front of the optical path is formed as a transparent electrode.

In this way, the electrode layers formed in a shape corresponding to the patterns of interference fringes not necessary to be transparent electrodes. As a consequence, an easy-to-form material for the electrodes can be selected. In other words, it is possible to obtain a shape corresponding to the pattern of interference fringes of the hologram easily and more precisely.

The surface light-emitting device according to the present invention is characterized in that, the luminescent layer is the hologram layer.

In this way, light reproduced with high fidelity to the patterns of interference fringes may be emitted to the forward-direction by utilizing the luminescent layer itself as the hologram layer. The light reflected may also be transmitted correspondingly to the dark-pattern with fidelity in the backward-direction.

The surface light-emitting device according to the present invention is characterized in that, a non-light transmission layer formed in a shape corresponding to the light-pattern, is disposed at a position back-side of said one electrode layer situated behind the optical path.

In this way, leakage of the light from the light-pattern in the backward-direction may certainly be avoided. Under the circumstances, any electrode material(s) for the electrode having superior capabilities of electric charge-injection and formability may be selected without concerning the capability of light shielding thereof.

The surface light-emitting device according to the present invention is characterized in that, the luminescent layer is made of an organic material.

The use of organic materials to the luminescent layer permits the formation thereof with a very thin in thickness in comparison with wavelength of the emitted light therefrom. In this way, the active thickness of the portions emitting light in the luminescent layer can be formed in a thickness, which is negligible in comparison with the wavelength of the emitted light. In addition, the minimum planar dimension of the luminescent layer can dramatically be smaller in comparison with the wavelength of the emitted light. It is, therefor, possible to provide a luminescent layer suitable for reproduction of holograms by using organic materials therefor.

A lightweight, compact-profile optical-input/output device with reasonable price capable of emitting light can further be realized easily because the device can be operated at a low DC voltage.

The device for monitoring reflected light according to the present invention is characterized in that, device for monitoring reflected light using an optical sensor is disposed at a position behind the hologram layer.

In this way, a lightweight, compact-profile, low-cost monitoring device can be realized.

The surface light-emitting device according to the present invention is characterized in that, a hologram layer formed substantially corresponding to a patterns of interference fringes of a hologram is formed as a layer one of related to light emission and provided on the predetermined optical path, and wherein a plurality of element regions are included in the hologram layer, and wherein brightness of portions corresponding to the element regions is determined in accordance with the patterns of the interference fringes, and wherein the corresponding portions are controlled so as to turn into an illumination-state corresponding to the determined brightness substantially at the same time.

In this way, the surface light-emitting device alone can play both roles as the light source and the optical elements by making the patterns of interference fringes of holograms with the hologram patterns of optical elements such as lens, for example. In other words, a lightweight and compact-profile optical input/output device with reasonable price can be realized by using the surface light-emitting device according to the present invention.

Further, reproduction of the holograms can be performed with certainty because the portions corresponding to the element regions are controlled so as to turn into an illumination-state corresponding to the determined brightness substantially at the same time.

In addition, the element regions may be formed in a simple shape, and information containing light intensity of the holograms can be reproduced in accordance with the brightness of the element regions because the hologram layer includes a plurality of element regions and the brightness of portions corresponding to the element regions is determined in accordance with the patterns of the interference fringes. By forming the device in this way, information containing phase of the holograms may be reproduced in accordance with positions of the element regions. Consequently, formation of the hologram layer may easily be carried out.

The surface light-emitting device according to the present invention is characterized in that, the portions corresponding to the element regions are capable of maintaining the illumination-state, and wherein the corresponding portions are controlled so as to sequentially turn into the illumination-state corresponding to the determined brightness and to maintain the illumination-state.

In this way, the corresponding portions are simultaneously turned into an illumination-state corresponding to the determined brightness at the end of scanning for all the lines by sequentially scanning the corresponding portions. Consequently, reproduction of the holograms can easily be performed with certainty.

The surface light-emitting device according to the present invention is characterized in that, the hologram layer is composed by forming the electrode with element electrodes substantially forming said pluralities of element regions.

The shape of the element regions may easily be reproduced correctly by forming the element regions with easy-to-form electrodes.

The surface light-emitting device according to the present invention is characterized in that, the hologram layer is composed by forming the luminescent layer with element luminescent layers substantially forming said pluralities of element regions.

Light reproduced with high fidelity to the patterns of the element regions may be obtained by utilizing the luminescent layer itself as the element regions.

The surface light-emitting device according to the present invention is characterized in that, brightness of portions corresponding to the element regions is respectively controlled by adjusting current values flowing through the luminescent layer corresponding to each of the element regions.

In this way, information containing light intensity of the holograms can be reproduced by adjusting the current values. Consequently, reproduction of the holograms can easily be performed.

The surface light-emitting device according to the present invention is characterized in that, a storing part for storing current values flowing through the luminescent layer which correspond to each of the element regions respectively, is provided.

In this way, illumination-state of each portion corresponding to each element region can be maintained by just storing the current values. Consequently, simultaneous illumination corresponding to the determined brightness of the portions corresponding to the element region can further be carried out easily.

The surface light-emitting device according to the present invention is characterized in that, the hologram layer is formed by substantially providing a plurality of element shielding layers outside of the luminescent layer.

and wherein the light from the luminescent layer is emitted through the element shielding layers.

In this way, element shielding layers made of an easy-to-form material can be formed by using the shielding layers with not many restrictions exist on its material as the element region. As a consequence, the shape of the element region can be formed easily and accurately.

The surface light-emitting device according to the present invention is characterized in that, the element regions are formed so that a maximum width thereof is one of a range of 10 through 100 nano-meters and another range of equal to or less said range.

In this way, element regions very narrow in width can be realized. The light directivity of lights after passing through holograms receives much influence of both the conditions of the lights before passing therethrough and the width of each of the element regions composing the hologram layer. However, not much influence is expected on the conditions of the lights before passing therethrough if the width of each of the element regions is in narrow.

As a consequence, it is considered that the light directivity can be controlled regardless of the conditions of the lights before passing through the hologram layer if the hologram layer is formed with the element regions very narrow in width. In other words, a hologram layer much suitable for reproduction of holograms may be realized.

The surface light-emitting device according to the present invention is characterized in that, the luminescent layer is made of an organic material.

The use of organic materials to the luminescent layer permits the formation thereof with a very thin in thickness in comparison with wavelength of the emitted light therefrom. In this way, the active thickness of the portions emitting light in the luminescent layer can be formed in a thickness, which is negligible in comparison with the wavelength of the emitted light. In addition, the minimum planar dimension of the luminescent layer can dramatically be smaller in comparison with the wavelength of the emitted light. It is, therefor, possible to provide a luminescent layer suitable for reproduction of holograms by using organic materials therefor.

A lightweight, compact-profile optical-input/output device with reasonable price capable of emitting light can further be realized easily because the device can be operated at a low DC voltage.

The surface light-emitting device according to the present invention is characterized in that, a hologram layer formed substantially corresponding to a pattern of interference fringes of a hologram is formed as a layer one of related to light emission and provided on the predetermined optical path, and wherein more than one pattern of interference fringes are prepared and light corresponding to one of patterns selected is emitted through the predetermined optical path.

In this way, the surface light-emitting device alone can play both roles as the light source and the optical elements by making the patterns of interference fringes of holograms with the hologram patterns of optical elements such as lens, for example.

Further, the surface light-emitting device can a play role for varying positions between the light source and the optical element as well as playing another role for modifications of the light source and/or the optical element in the embodiment described above, the surface light-emitting device being designed capable of selecting a pattern of fringe out of more than one patterns.

As a consequence, those adjustments can be performed without carrying out mechanical movement.

In other words, a lightweight, compact-profile, and reasonable price optical-input/output device, yet enables high-speed operation with high-durability can be realized with the surface light-emitting device.

The surface light-emitting device according to the present invention is characterized in that, the hologram layer is composed of a plurality of element regions, and wherein brightness of portions corresponding to the element regions is determined in accordance with the pattern of the interference fringes, and wherein the corresponding portions are controlled so as to turn into an ilumination-state corresponding to the determined brightness.

In this way, a surface light-emitting device capable of using a variety of hologram patterns by itself can be manufactured as a result of carrying out the following steps: 1) forming the element regions in a simple shape used for various purposes, and 2) correspondingly determining brightness of the portions corresponding to each of the element regions to the hologram pattern thus selected. As a consequence, the both roles for varying positions between the light source and the optical element and for modifications of the light source and/or the optical element can further be performed with flexibility in the above example.

The surface light-emitting device according to the present invention is characterized in that, at least one of the element regions has a part substantially formed in circular arc shape.

In this way, a surface light-emitting device capable of realizing beams having various modes such as different focal points and/or radiating direction by itself can be manufactured by correspondingly determining brightness of the portions corresponding to the element regions having a part substantially formed in circular arc shape to the pattern of the interference fringes thus selected.

The surface light-emitting device according to the present invention is characterized in that, the element regions are substantially disposed in a concentric manner.

In this way, a surface light-emitting device capable of realizing beams having various modes such as different focal points by itself can be manufactured by correspondingly determining brightness of the portions corresponding to the element regions substantially disposed in a concentric manner to the pattern of the interference fringes thus selected.

The surface light-emitting device according to the present invention is characterized in that, a width of the element region is one of ranges of 10 through 100 nano-meters and another range of equal to or less than said range.

In this way, element regions very narrow in width can be realized. The light directivity of lights after passing through holograms receives much influence of both the conditions of the lights before passing therethrough and the width of each of the element regions composing the hologram layer. However, not much influence is expected on the conditions of the lights before passing therethrough if the width of each of the element regions is in narrow.

As a consequence, it is considered that the light directivity can be controlled regardless of the conditions of the lights before passing through the hologram layer if the hologram layer is formed with the element regions very narrow in width. In other words, a hologram layer much suitable for reproduction of holograms may be realized.

The surface light-emitting device according to the present invention is characterized in that, the element regions are formed in a uniform width, and wherein information containing light intensity of the hologram is reproduced by the brightness of the portions corresponding to the element regions.

In this way, a hologram layer capable of using various purposes can be formed by making each of the element regions in a fixed width.

In this case, information containing phase of the holograms may be reproduced in accordance with positions of the element regions corresponding to the portions under an illumination-state. As a consequence, the holograms can be reproduced by varying the brightness of the portions corresponding to the element regions.

The surface light-emitting device according to the present invention is characterized in that, a plurality of the element regions are substantially disposed in a matrix manner.

In this way, a surface light-emitting device capable of using more variety of hologram patterns by itself can be manufactured as a result of using a plurality of the element regions substantially disposed in a matrix manner and have more variety of purposes. As a consequence, the both roles for varying positions between the light source and the optical element and for modifications of the light source and/or the optical element can further be performed with higher flexibility in the above example.

The surface light-emitting device according to the present invention is characterized in that, the element regions are formed so that a maximum width thereof is one of a range of 10 through 100 nano-meters and another range of equal to or less than said range.

In this way, element regions very narrow in width can be realized. The light directivity of lights after passing through holograms receives much influence of both the conditions of the lights before passing therethrough and the width of each of the element regions composing the hologram layer. However, not much influence is expected on the conditions of the lights before passing therethrough if the width of each of the element regions is in narrow.

As a consequence, it is considered that the light directivity can be controlled regardless of the conditions of the lights before passing through the hologram layer if the hologram layer is formed with the element regions very narrow in width. In other words, a hologram layer much suitable for reproduction of holograms may be realized.

The surface light-emitting device according to the present invention is characterized in that, information containing light intensity of the hologram is reproduced by the brightness of the portions corresponding to the element regions.

In this case, information containing phase of the holograms may be reproduced in accordance with positions of the element regions corresponding to the portions under an illumination-state. As a consequence, the holograms can be reproduced by varying the brightness of the portions corresponding to the element regions.

The surface light-emitting device according to the present invention is characterized in that, brightness of portions corresponding to the element regions is respectively controlled by adjusting current values flowing through the luminescent layer corresponding to each of the element regions.

In this way, information containing light intensity of the holograms can be reproduced by adjusting the current values. Consequently, reproduction of the holograms can easily be performed.

The surface light-emitting device according to the present invention is characterized in that, the corresponding portions are controlled so as to turn into the illumination-state corresponding to the determined brightness substantially at the same time. Consequently, reproduction of the holograms can be performed with certainty.

The surface light-emitting device according to the present invention is characterized in that, the corresponding portions are capable of maintaining the illumination-state, and wherein the corresponding portions are controlled so as to sequentially turn into the illumination-state corresponding to the determined brightness and to maintain the illumination-state.

In this way, the portions corresponding to the element regions are simultaneously turned into an illumination-state corresponding to the determined brightness at the end of scanning for all the lines by sequentially scanning the portions in the luminescent layer corresponding to the element regions. Consequently, reproduction of the holograms can easily be performed with certainty.

The surface light-emitting device according to the present invention is characterized in that, the luminescent layer is made of an organic material.

The use of organic materials to the luminescent layer permits the formation thereof with a very thin in thickness in comparison with wavelength of the emitted light therefrom. In this way, the active thickness of the portions emitting light in the luminescent layer can be formed in a thickness, which is negligible in comparison with the wavelength of the emitted light. In addition, the minimum planar dimension of the luminescent layer can dramatically be smaller in comparison with the wavelength of the emitted light. It is, therefor, possible to provide a luminescent layer suitable for reproduction of holograms by using organic materials therefor.

A lightweight, compact-profile optical-input/output device with reasonable price capable of emitting light can further be realized easily because the device can be operated at a low DC voltage.

The beam generator according to the present invention is characterized in that, a beam in a desired form is generated by selecting one of the hologram pattern of the optical element with the surface light-emitting device.

In this way, a lightweight, compact-profile, and reasonable price beam generator, yet enables high-speed operation with high-durability can be realized.

The beam generator according to the present invention is characterized in that, beams corresponding to a scanning path are generated sequentially so as to draw a track thereof along with the scanning path.

In this way, a lightweight, compact-profile, and reasonable price beam scanning device, yet enables high-speed operation with high-durability can be realized.

The plotting device according to the present invention is characterized in that, the plotting device carries out plotting with the beam generator described above, wherein a pattern is plotted with beams corresponding to the pattern to be plotted which are generated in sequential manner.

In this way, a lightweight, compact-profile, and reasonable price plotting device, yet enables high-speed operation with high-durability can be realized.

The light scanning and reading device is characterized in that, the device uses the beam generator. In this way, a lightweight, compact-profile, and reasonable price light scanning and reading device, yet enables high-speed operation with high-durability can be realized.

The image display device according to the present invention is characterized in that, an image display device having a surface light-emitting device including a luminescent layer emitting light as a result of applying a voltage to the electrode and the light being emitted through a predetermined optical path, wherein a hologram layer formed substantially corresponding to a pattern of interference fringes of a hologram is formed as a layer one of related to light emission and provided on the predetermined optical path, and wherein a predetermined holographic image is displayed with the light from the luminescent layer.

In this way, visual information can be reproduced in three-dimensional manner only with the surface light-emitting device if the interference fringes of the holograms are formed as hologram patterns corresponding to visual information such as cubic object(s) and/or character(s). In other words, a lightweight, compact-profile, and reasonable price image display device capable of reproducing visual information in three-dimensional manner can be realized.

The image display device according to the present invention, is characterized in that, the hologram layer is composed by forming the electrode in a shape substantially corresponding to the pattern of the interference fringes.

In this way, a shape corresponding to the patterns of interference fringes of holograms can be formed easily and accurately by forming the hologram layer with easy-to-form electrodes.

The image display device according to the present invention is characterized in that, the hologram layer is composed by forming the luminescent layer in a shape substantially corresponding to the pattern of the interference fringes.

Light reproduced with high fidelity to the patterns of interference fringes may be obtained by utilizing the luminescent layer itself as the hologram layer.

The image display device according to the present invention is characterized in that, the hologram layer is composed by forming a shielding layer in a shape substantially corresponding to the pattern of the interference fringes of at a position outside of the luminescent layer, and wherein the light from the luminescent layer is emitted through the shielding layer.

In this way, a hologram layer made of an easy-to-form material can be formed by using the shielding layer with not many restrictions exist on its material as the hologram layer. As a consequence, a shape corresponding to the patterns of interference fringes of holograms can be formed easily and accurately.

The image display device according to the present invention is characterized in that, the hologram layer is composed by forming an uneven transparent layer formed unevenly in thickness substantially corresponding to the patterns of the interference fringes at a position outside of the luminescent layer, and wherein the light from the luminescent layer is emitted through the uneven transparent layer.

In this way, a hologram layer made of an easy-to-form material can be formed by using the uneven transparent layer with not many restrictions exist on its material as the hologram layer. As a consequence, a shape corresponding to the patterns of interference fringes of holograms can be formed easily and accurately.

The image display device according to the present invention is characterized in that, the light from the luminescent layer directed to other than the predetermined optical path is emitted to a direction other than the predetermined optical path.

As a consequence, localization of an imaginary light source created by reflection of the lights directed to other than the predetermined optical path can be avoided. Consequently, the light source can keep its substantial optical depth narrow. It is, therefor, possible to obtain the lights suitable for reproduction of holograms.

The image display device according to the present invention is characterized in that, the light from the luminescent layer directed to other than the predetermined optical path is reflected and incorporated with another light from the luminescent layer directed to the predetermined optical path so as to intensify the resulting light.

In this way, the light incorporated can be obtained. It is, therefor, possible to obtain the lights suitable for reproduction of holograms.

The image display device according to the present invention is characterized in that, the light generated by the luminescent layer is emitted after carrying out resonation of the light.

In this way, light much like monochromatic radiation having a high intensity effectively can be obtained. Also, light having a high directivity can be obtained with the device as well. Lights having similar phase can further be obtained. Consequently, it is possible to obtain the lights suitable for reproduction of holograms.

The image display device according to the present invention is characterized in that, the hologram layer is formed alone with a pattern located periphery of the interference fringes.

In this way, the hologram layer can be formed with only the part where is narrow in distance between the fringes. The directivity of lights after passing through the holograms receives much influence of both the conditions of the lights before passing therethrough and the distance between the fringes. However, more influence of the distance than that of the condition of the lights before passing through the hologram layer may be expected at the part where is narrow in distance.

As a consequence, it is assumed that the light directivity can be controlled in accordance with the distance of the fringes regardless of the conditions of the lights before passing through the hologram layer if the hologram layer is formed with the part where is narrow in distance between the fringes alone. In other words, a hologram layer much suitable for reproduction of holograms may be realized.

The image display device according to the present invention is characterized in that, the hologram layer includes a light-pattern and a dark-pattern, and wherein a width of the light-pattern is substantially formed in one of a range of wavelength of the light and less than said range.

In this way, the light-pattern very narrow in width can be realized. The light directivity of lights after passing through holograms receives much influence of both the conditions of the lights before passing therethrough and the width of each of the light-pattern. However, not much influence is expected on the conditions of the lights before passing therethrough if the width of each of the light-pattern is in narrow.

As a consequence, it is considered that the light directivity can be controlled regardless of the conditions of the lights before passing through the hologram layer if the hologram layer is formed so as to narrow the width of the light-pattern. In other words, a hologram layer much suitable for reproduction of holograms may be realized.

The image display device according to the present invention is characterized in that, the hologram layer includes a light-pattern and a dark-pattern, and wherein the light-pattern is formed in a fixed width, and wherein information containing light intensity of the hologram is reproduced by the brightness of portions generating light where corresponding to the light-pattern.

In this case, information containing phase of the holograms may be reproduced by allocating pattern elements having the fixed width. As a consequence, the hologram layer can be formed by just allocating each of the element regions having the fixed width. In other words, formation of the hologram layer may easily be carried out.

The image display device according to the present invention is characterized in that, a plurality of element regions are included in the hologram layer, and wherein brightness of portions corresponding to the element regions is determined in accordance with the pattern of interference fringes, and wherein the corresponding portions are controlled so as to turn into an illumination-state corresponding to the determined brightness substantially at the same time.

In this way, reproduction of the holograms can be performed with certainty because the portions corresponding to the element regions are controlled so as to turn into an illumination-state corresponding to the determined brightness substantially at the same time.

In addition, the element regions may be formed in a simple shape, and information containing light intensity of the holograms can be reproduced in accordance with the brightness of the element regions because the hologram layer includes a plurality of element regions and the brightness of portions corresponding to the element regions is determined in accordance with the patterns of the interference fringes. By forming the display device in this way, information containing phase of the holograms may be reproduced by allocating pattern elements. Consequently, formation of the hologram may easily be carried out.

The image display device according to the present invention is characterized in that, more than one pattern of interference fringes are prepared and light corresponding to one of patterns selected is emitted through the predetermined optical path.

In this way, a variety of visual informations can be reproduced in three-dimensional manner if the interference fringes of the holograms are formed as hologram patterns corresponding to visual information such as several kinds of objects and/or characters. As a consequence an image display device capable of utilizing in various purposes can be realized. In addition, images can be reproduced dynamic manner by using the several kinds of hologram patterns.

The image display device according to the present invention is characterized in that, the luminescent layer is made of an organic material.

The use of organic materials to the luminescent layer permits the formation thereof with a very thin in thickness in comparison with wavelength of the emitted light therefrom. In this way, the active thickness of the portions emitting light in the luminescent layer can be formed in a thickness, which is negligible in comparison with the wavelength of the emitted light. In addition, the minimum planar dimension of the luminescent layer can dramatically be smaller in comparison with the wavelength of the emitted light. It is, therefor, possible to provide a luminescent layer suitable for reproduction of holograms by using organic materials therefor.

A lightweight, compact-profile optical-input/output device with reasonable price capable of emitting light can further be realized easily because the device can be operated at a low DC voltage.

The IC card according to the present invention is characterized in that, the IC card uses the image display device. In this way, a lightweight, compact-profile with reasonable price IC card capable of reproducing visual information in three-dimensional manner can be realized. With the IC card, a higher advertising-effect and difficulties in forgery can be expected because visual information is reproduced in three-dimensional manner.

The surface light-emitting device, the beam generator, the device for monitoring reflected light, the plotting device, the light scanning and reading device, the image display device and the IC card according to the present invention are characterized in that, the light generated by the luminescent layer is emitted in a direction substantially perpendicular to the luminescent layer as a laser beam after carrying out resonation of the light.

In this way, it is possible to realize a surface light-emitting device much suitable for reproduction of holograms by using the emitted laser beams. Moreover, a desired illumination pattern may easily be obtained by emitting the laser beam in the direction perpendicular to the luminescent layer. Consequently, a desired hologram pattern can easily be obtained.

The surface light-emitting device, the beam generator, the device for monitoring reflected light, the plotting device, the light scanning and reading device, the image display device and the IC card according to the present invention are characterized in that, a luminescent layer formed as a multiple semiconductor layer in which a first semiconductor layer of first conductive type and a second semiconductor layer of second conductive type are substantially connected with each other, and wherein the light generated adjacent of the connection is emitted in a direction substantially perpendicular to the luminescent layer as a laser beam after carrying out resonation of the light.

In this way, it is possible to realize a surface light-emitting device much suitable for reproduction of holograms by using the emitted laser beams. Moreover, a desired illumination pattern may easily be obtained by emitting the laser beam in the direction perpendicular to the luminescent layer. Consequently, a desired hologram pattern can easily be obtained. Further, laser oscillation can easily be performed by employing a semi-conducting substance having a high heat resistance for the luminescent layer.

The surface light-emitting device, the beam generator, the device for monitoring reflected light, the plotting device, the light scanning and reading device, the image display device and the IC card according to the present invention are characterized in that, a plurality of reflecting mirrors, each having a reflective plane substantially parallel to the luminescent layer, is provided at positions so as to interpose the luminescent layer, and wherein the mirrors resonate the light generated by the luminescent layer in a direction substantially perpendicular to the luminescent layer.

In this way, the volume of areas interposed between the mirrors can be reduced. As a consequence, the threshold value for initiating the laser oscillation can be lowered. In other words, a surface light-emitting device and the like with low-power consumption can be realized. Further, the hologram layer can further be patterned in detail. In other words, hologram pattern with finer patterning may easily be obtained.

While the embodiments of the present invention, as disclosed herein, constitute preferred forms, it is to be understood that each term was used as illustrative and not restrictive, and can be changed within the scope of the claims without departing from the scope and spirit of the invention.

What is claimed is:

1. A surface light-emitting device including a luminescent layer and an electrode, the luminescent layer emitting light as a result of applying a voltage to the electrode, wherein the electrode is substantially formed in a shape corresponding to a pattern of interference fringes of a hologram.

2. The surface light-emitting device according to claim 1, wherein the electrode is composed of a pair of electrode layers interposing the luminescent layer therebetween, and wherein one of the electrode layers is formed as a transparent electrode layer substantially having the shape corresponding to the pattern of interference fringes of the hologram, and wherein the light from the luminescent layer is emitted through said transparent electrode.

3. The surface light-emitting device according to claim 2, wherein a supporting member is provided to a position outside of the other one of the electrode layers, and wherein the light from the luminescent layer is emitted through said one electrode layer.

4. The surface light-emitting device according to claim 2, wherein a supporting member having transparency is provided to a position outside of said one electrode layer, and wherein the light from the luminescent layer is emitted through said one electrode layer and the supporting member.

5. The surface light-emitting device according to claim 1, wherein the electrode is composed of a pair of electrode layers interposing the luminescent layer therebetween, and wherein one of the electrode layers is formed in a shape substantially corresponding to a pattern of interference fringes of a hologram while forming the other one of the electrode layers as a transparent electrode layer, and wherein light from the luminescent layer is emitted through the other electrode layer.

6. The surface light-emitting device according to claim 5, wherein a supporting member having transparency is provided to a position outside of the other electrode layer, and wherein the light from the luminescent layer is emitted through the other electrode layer and the supporting member.

* * * * *

UNITED STATES PATENT AND TRADEMARK OFFICE
CERTIFICATE OF CORRECTION

| | | |
|---|---|---|
| PATENT NO. | : 6,713,787 B2 | Page 1 of 1 |
| APPLICATION NO. | : 10/175172 | |
| DATED | : March 30, 2004 | |
| INVENTOR(S) | : Tanaka et al. | |

It is certified that error appears in the above-identified patent and that said Letters Patent is hereby corrected as shown below:

Front page, (54) Title: "SURFACE LIGHT EMITTING DEVICES" should read --LIGHT EMITTING DEVICES--

Signed and Sealed this

Second Day of January, 2007

JON W. DUDAS
*Director of the United States Patent and Trademark Office*